US012805042B2

(12) United States Patent
Habbal et al.

(10) Patent No.: US 12,805,042 B2
(45) Date of Patent: Nov. 17, 2026

(54) NANOWIRE ARRAY BASED MULTISPECTRAL SENSORS

(71) Applicants: Fawwaz Habbal, Cambridge, MA (US); Amit Solanki, Cambridge, MA (US)

(72) Inventors: Fawwaz Habbal, Cambridge, MA (US); Amit Solanki, Cambridge, MA (US)

( * ) Notice: Subject to any disclaimer, the term of this patent is extended or adjusted under 35 U.S.C. 154(b) by 0 days.

(21) Appl. No.: 19/241,632

(22) Filed: Jun. 18, 2025

(65) Prior Publication Data

US 2025/0393321 A1 Dec. 25, 2025

Related U.S. Application Data

(60) Provisional application No. 63/800,808, filed on May 6, 2025, provisional application No. 63/661,748, filed on Jun. 19, 2024.

(51) Int. Cl.
*H10F 39/00* (2025.01)
*G01J 3/51* (2006.01)
(Continued)

(52) U.S. Cl.
CPC ............ *H10F 39/8053* (2025.01); *G01J 3/51* (2013.01); *H10F 39/014* (2025.01); (Continued)

(58) Field of Classification Search
CPC ...... H10F 39/8053; H10F 39/182; G01J 3/51; B82Y 20/00
See application file for complete search history.

(56) References Cited

U.S. PATENT DOCUMENTS

| | | | |
|---|---|---|---|
| 9,000,353 | B2 | 4/2015 | Seo et al. |
| 9,490,283 | B2 | 11/2016 | Yu et al. |

(Continued)

FOREIGN PATENT DOCUMENTS

| | | | |
|---|---|---|---|
| CN | 104969000 | A | 10/2015 |
| JP | 2015532725 | A | 11/2015 |

(Continued)

OTHER PUBLICATIONS

Li, Z. et al. "Broadband GaAsSb Nanowire Array Photodetectors for Filter-Free Multispectral Imaging," Nano Letters, vol. 21, No. 17, Aug. 23, 2021; pp. 7388-7395.

(Continued)

*Primary Examiner* — Mounir S Amer
*Assistant Examiner* — Alexander Belousov
(74) *Attorney, Agent, or Firm* — COOLEY LLP

(57) ABSTRACT

An apparatus includes a multi-spectral sensor and an image sensor. The multi-spectral sensor includes a spectrometer having at least a first optical filter and a second optical filter. The first optical filter includes a first lattice of nanowires having a first geometric property and configured to detect light within a first spectral band. The second optical filter includes a second lattice of nanowires having a second geometric property and configured to detect light within a second spectral band. The first spectral band and the second spectral band can at least partially define a spectral resolution of the spectrometer. The image sensor includes a first pixel configured to generate a first signal in response to receiving the light within the first spectral band, and a second pixel configured to generate a second signal in response to receiving the light within the second spectral band.

21 Claims, 46 Drawing Sheets

(51) Int. Cl.

| | |
|---|---|
| ***H10F 39/18*** | (2025.01) |
| ***H10F 39/95*** | (2025.01) |
| ***H10F 71/00*** | (2025.01) |
| *B82Y 20/00* | (2011.01) |

(52) U.S. Cl.

CPC ........... *H10F 39/182* (2025.01); *H10F 39/95* (2025.01); *H10F 71/134* (2025.01); *B82Y 20/00* (2013.01)

(56) References Cited

U.S. PATENT DOCUMENTS

| | | | | |
|---|---|---|---|---|
| 9,601,529 | B2 | 3/2017 | Seo et al. | |
| 11,946,802 | B2 | 4/2024 | Ku et al. | |
| 2015/0214261 | A1 * | 7/2015 | Park | H10F 39/182 977/932 |
| 2016/0225811 | A1 | 8/2016 | Yu et al. | |
| 2024/0053195 | A1 * | 2/2024 | Ku | G01J 1/4204 |
| 2025/0237829 | A1 * | 7/2025 | Hetzl | G02B 6/43 |

FOREIGN PATENT DOCUMENTS

| | | | |
|---|---|---|---|
| KR | 20150067141 | A | 6/2015 |
| WO | WO-2014028380 | A2 | 2/2014 |

OTHER PUBLICATIONS

Park, H. et al. “Multispectral imaging with vertical silicon nanowires,” Scientific Reports, vol. 3, No. 1, Aug. 1, 2013; Article 2460, 6 pages.

PCT Application No. PCT/US2025/034263, Invitation to Pay Additional Fees mailed Oct. 22, 2025, Applicant Habbal, Fawwaz; 10 pages.

Robson, M. et al. “Multispectral absorptance from large-diameter InAsSb nanowire arrays in a single epitaxial growth on silicon,” Nano Futures, Oct. 27, 2014; 1(3):035001, 8 pages.

Van Dam, D. et al. “High-Efficiency Nanowire Solar Cells with Omnidirectionally Enhanced Absorption Due to Self-Aligned Indium-Tin-Oxide Mie Scatterers,” ACS Nano, vol. 10, No. 12, Dec. 5, 2016; pp. 11414-11419.

“Multispectral Image Sensor” Sony webpage; retrieved May 20, 2025, 6 pages. [Internet] https://www.sony-semicon.com/en/products/is/industry/multispectral.html.

“Sony A7R Multispectral Sextuple Agrowing Camera” Integral Drones: The Drone Specialists; retrieved May 20, 2025, 6 pages. [Internet] https://www.integraldrones.corn.au/product/sony-a7r-multispectral-sextuple/.

Sturmberg et al. “Modal analysis of enhanced absorption in silicon nanowire arrays” Optics Express (2011); 19(S5):A1067-A1081.

PCT Application No. PCT/US2025/034263, International Search Report and Written Opinion mailed Dec. 16, 2025; Applicant Metaphos Technology, Inc. et al.; 16 pages.

* cited by examiner

SEM image of a nano-structured material of height of 2 micrometer.

Top view: Reflection image (100x magnification)

Electronic stacks of an image sensor with photodiodes

12 Spectrometers on one sensor

4 Spectrometers on one sensor

NANOWIRE ARRAY BASED MULTISPECTRAL SENSORS

CROSS-REFERENCE TO RELATED APPLICATIONS

This application claims priority to and the benefit of U.S. Provisional Patent Application No. 63/661,748, filed Jun. 19, 2024 and titled "Passive Optical Filters Based on Nanowire Arrays, Multispectral Sensors, Methods of Making and Using the Same," and this application also claims priority to and the benefit of U.S. Provisional Patent Application No. 63/800,808, filed May 6, 2025 and titled "Multispectral Sensors and Methods of Forming and Using the Same," the entire contents of each of which are incorporated herein by reference in their entireties.

FIELD

The present disclosure relates generally to multispectral imaging, and more specifically to a complementary metal-oxide semiconductor (CMOS)-integrated multispectral imaging sensor that uses nano-structured semiconductor optical filters on each pixel to capture specific wavelengths of interest.

BACKGROUND

A multispectral sensor is an advanced imaging device that captures image data within specific filter wavelengths across the electromagnetic spectrum. Multispectral imaging involves capturing and analyzing images at multiple discrete spectral bands within the electromagnetic spectrum. Multispectral sensors find applications in various fields, including agriculture, remote sensing, health care, and more, due to their ability to provide detailed analysis and characterization of materials based on their spectral signatures. A need exists for an accurate, affordable, and reusable multispectral sensor.

SUMMARY

In some embodiments, an apparatus includes a multispectral sensor and an image sensor. The multi-spectral sensor includes a spectrometer having at least a first optical filter and a second optical filter. The first optical filter includes a first lattice of nanowires having a first geometric property and configured to detect light within a first spectral band. The second optical filter includes a second lattice of nanowires having a second geometric property and configured to detect light within a second spectral band. The first spectral band and the second spectral band can at least partially define a spectral resolution of the spectrometer. The image sensor includes a first pixel configured to generate a first signal in response to receiving the light within the first spectral band, and a second pixel configured to generate a second signal in response to receiving the light within the second spectral band. In some implementations the first spectral band at least partially overlaps with the second spectral band. In other implementations, there is no overlap between the first spectral band and the second spectral band.

In some embodiments, a method for manufacturing a multispectral sensor includes providing a carrier wafer including a sensor layer and an insulating layer deposited over the sensor layer. The method also includes depositing a semiconductor layer over the insulating layer to produce a first intermediate structure, the semiconductor layer having a thickness. The method also includes photolithographically defining a photoresist pattern on the semiconductor layer to produce a second intermediate structure, and anisotropically dry etching the second intermediate structure to produce a nanowire lattice. Each nanowire from the nanowire lattice can have a length that is substantially the same as the thickness of the semiconductor layer. The method also includes removing the photoresist pattern.

In some embodiments, a method for manufacturing a multispectral sensor includes depositing a semiconductor layer onto a surface of an optically transparent substrate, and photolithographically patterning an etch mask on the semiconductor layer. The method also includes anisotropically dry etching a portion of the semiconductor layer in a presence of the etch mask to produce a nanowire lattice. The method also includes joining the surface of the optically transparent substrate to a carrier wafer including a sensor layer, to substantially align the nanowire lattice to at least one sensor from a plurality of sensors of the sensor layer.

DETAILED DESCRIPTION

Figure 1:
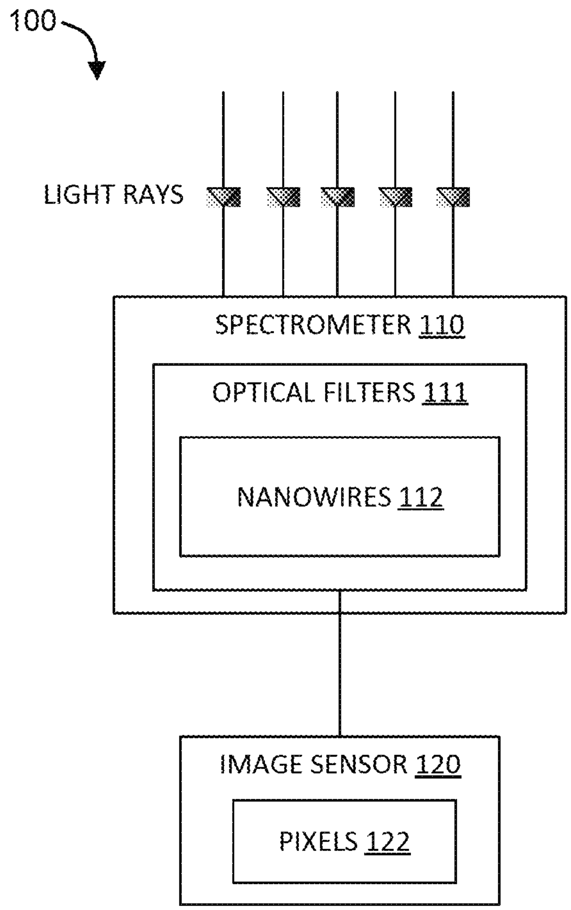
FIG. 1 is a diagram of a multispectral imaging system, in accordance with some embodiments.

Known imaging systems often use known methods to capture and interpret visual data. For example, known machine vision can be used to identify patterns and textures in RGB images. Distinguishing materials and predicting identities of materials in RGB images can be difficult when the materials are visually similar. In contrast, one or more embodiments of the imaging system described herein can directly detect a chemical composition of materials in multispectral images and predict identities of materials based on a color associated with the chemical composition. Known multispectral sensors are often bulky, expensive, and consume lots of power. In contrast, one or more embodiments of the multispectral sensor described herein are compact, portable, low-cost, and consume little power.

In one or more embodiments of the present disclosure, an imaging system/apparatus includes a multi-spectral sensor and an image sensor. The multi-spectral sensor includes a spectrometer having at least a first optical filter and a second optical filter. The first optical filter includes a first lattice of nanowires having a first geometric property and configured to detect light within a first spectral band. The second optical filter includes a second lattice of nanowires having a second geometric property and configured to detect light within a second spectral band. The first spectral band and the second spectral band can at least partially define a spectral resolution of the spectrometer. The image sensor includes a first pixel configured to generate a first signal in response to receiving the light within the first spectral band, and a second pixel configured to generate a second signal in response to receiving the light within the second spectral band. In some implementations the first spectral band at least partially overlaps with the second spectral band. In other implementations, there is no overlap between the first spectral band and the second spectral band.

As used herein, the term "color" can refer to an electromagnetic wave (light) having a wavelength in the region of between about 250 nanometers (nm) and about 10 micrometers (μm). Visible color is in the range of 400 nm and 700 nm.

Color filters described herein are configured to capture a particular electromagnetic wavelength or wavelength range of interest.

As used herein, the term "nanowire" (NW) refers to a vertically oriented nano-structure in the 20 nm to 300 nm diameter range, optionally with a length (also referred to herein as a height) in the range of about 500 nm to about 7000 nm. The shape of a nanowire can be, for example, substantially cylindrical. In some implementations, one or more nanowires in a collection/set of nanowires can have a substantially uniform cross-sectional shape. In other implementations, one or more nanowires in a collection/set of nanowires can have a substantially non-uniform/asymmetric cross-sectional shape. Nanowires set forth herein can function, individually or collectively in a plurality, as an optical antenna.

As used herein, the phrase "optical antenna" refers to a grouping of nano-structured filter elements (also referred to herein as "nano-scale resonators," "nano-antenna filters," or "nano-filters") that act as color filters, in accordance with one or more embodiments.

As used herein, the term "spectrometer" refers to a grouping of filtered pixels that produce a spectrum.

As used herein, the phrase "spectral channel" refers to the combination of a color filter and a photodiode. For example, the combination of a single color filter and a single photodiode can be referred to as one (i.e., a single) spectral channel. An array of such spectral channels forms a spectrum, yielding both the ability to perform spectral analysis and the ability to reconstruct color images.

As used herein, the term "pixel" refers to an electronic structure that has a photodiode and other circuitry that collectively facilitate the measurement of incident light and represent it as a digital signal having a certain number of bits, e.g., 8 bits, 10 bits, 12 bits, more than 12 bits, etc.

One or more embodiments of the present disclosure include a CMOS-integrated multispectral imaging sensor that uses nano-structured semiconductor optical filters (nano-antennas) positioned on and/or physically coupled to each pixel to capture specific wavelengths. Imaging sensor configurations set forth herein provide a compact 'spectrometer-on-chip' with higher spatial and spectral resolutions as contrasted with known approaches.

Embodiments set forth herein treat light as a wave and analyze color via nano-structured semiconductor filters ("antennas") instead of bulky optics. These nano-filters capture specific wavelengths of interest, which can range from ultraviolet (UV) to middle-wave infrared (MWIR) and can be integrated on a photodiode array. Example implementations can include system-level integration, compactness, and/or video-rate multispectral imaging.

In some known systems, still and video color images are reconstructed by using three filters-either Red, Green, and Blue (RGB), or Cyan, Magenta, and Yellow (CMY). Analyzing color is typically performed using a diffracting system such as a prism or a grating, filters (e.g., Fabry-Pérot filters), or color dyes. An antenna is another method for capturing an electromagnetic wave (e.g., light having a specific wavelength or color of interest). From analysis of the spectrum of the reflected or transmitted light, the chemical composition of the material can be obtained. The intensity of each color can be detected, for example, by a CMOS photodiode, a charge coupled device (CCD), and/or a photomultiplier.

One or more embodiments of the present disclosure treat light spectrally (as a wave carrying material signatures) and use nano-engineered semiconductor structures to filter that light. High-precision antennas, created by nano-structuring one or more semiconductor materials, such as polycrystalline silicon (Si), amorphous Silicon (aSi), Germanium (Ge), Si—Ge alloys, and Indium-Antimony (InSb), with specific engineered energy gaps, facilitates light filtering. These antennas, which capture different wavelengths of light, i.e., different colors, in the UV to MWIR range, can be combined with photodetectors (PDs) to create spectrometers on a chip. Each PD is (or is positioned as part of) a pixel on an image sensor. Depending on the implementation, multiple/many of these spectrometers can be combined on an imaging chip to create a compact multispectral sensor with high spatial and wavelength resolution, capable of measuring both physical properties and chemical properties of imaged/analyzed materials. Moreover, by selecting the appropriate RGB signals, the multispectral sensor can also reconstruct the color of the objects. By using the electronics available in current imaging technology, this multispectral sensor can provide dynamic images and can create videos. This innovation supports the development of solid-state portable, energy-efficient, and cost-effective multispectral sensors.

FIG. 1 is a diagram of a multispectral imaging system 100, in accordance with some embodiments. As shown in FIG. 1, the multispectral imaging system 100 includes a spectrometer 110 with one or more optical filters 111 that include nanowires 112. For example, each optical filter 111 can include multiple nanowires 112 that are arranged in an array and/or that have substantially uniform properties. The spectrometer 110 is described in further detail herein below. The spectrometer 110 is coupled (e.g., mechanically, physically and/or optically) to an image sensor 120 that includes a plurality of pixels 122.

The image sensor 120 can be a known type of versatile and small image sensor used in, for example, smartphone cameras. The image sensor 120 can have distinguishing properties. For example, such image sensors can have high special resolution (e.g., between about 10 MP to about 200 MP); such image sensors can have several inherent capabilities, such as managing light conditions and providing high quality videos; such image sensor can be inexpensive due to the very high volume of smartphones in circulation. Integrating filtering methods with such image sensors can create a multispectral sensor(s). Integrating the multispectral sensor(s) in a smartphone camera can provide users chemical information with a snapshot, or video. This capability can enable a data-enabled platform, new applications, and businesses.

Figure 2:
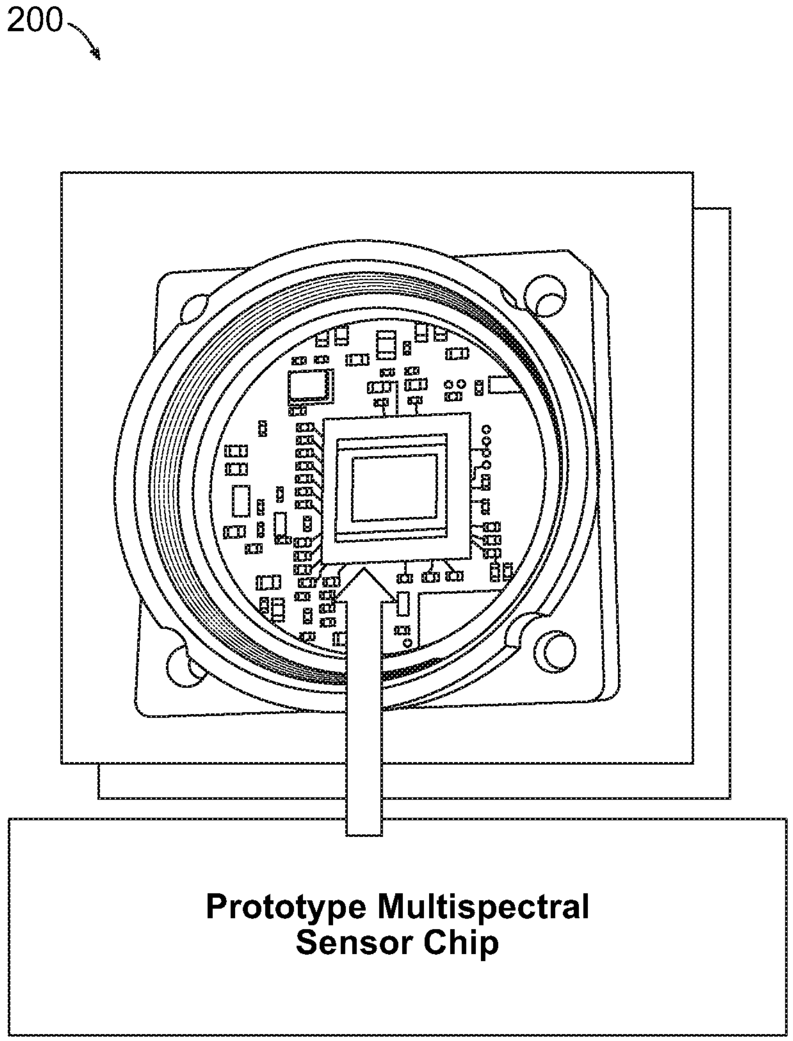
FIG. 2 is a photographic image of a multispectral sensor chip, in accordance with an embodiment.

FIG. 2 is a photographic image of a multispectral sensor chip, in accordance with an embodiment. The multispectral sensor chip can be an example implementation of the multispectral imaging system 100 of FIG. 1. As shown, the multispectral sensor chip can be included within a camera of, for example, a smartphone or other mobile compute device. Multispectral sensor chips can be constructed using known imaging sensors that leverage existing CMOS pixel arrays. Examples of known imaging sensors with photodiodes are described with respect to FIGS. 3-4.

Figure 3:
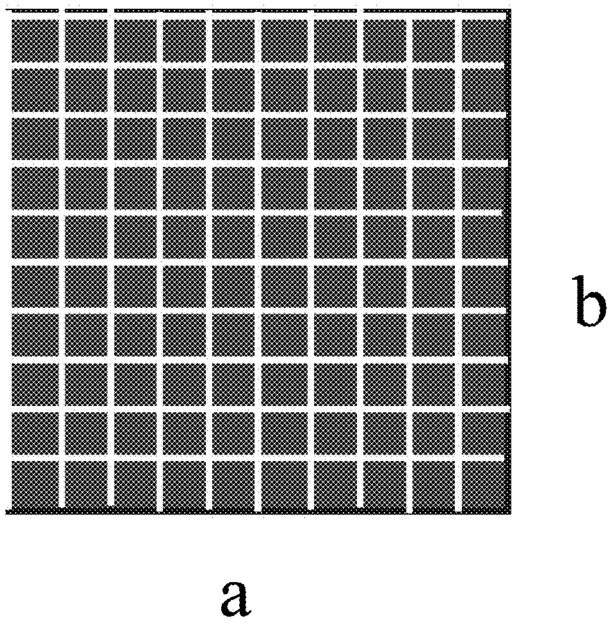
FIG. 3 is a top view illustration of a complementary metal-oxide semiconductor (CMOS) sensor including a plurality of pixels, each pixel from the plurality of pixels having a photodiode (PD), in accordance with some embodiments.

FIG. 3 is a top view illustration of a complementary metal-oxide semiconductor (CMOS) sensor including a plurality of pixels, each pixel from the plurality of pixels having a photodiode (PD), in accordance with some embodiments. As shown, the CMOS sensor has a by b pixels. Every pixel in the a by b pixel array can be a photodiode (PD). Known CMOS image sensors can have millions of pixels (e.g., an 8 MP sensor can have 3264×2448 pixels), wherein each pixel includes a photodiode and readout circuits. The multispectral sensor described herein can include known CMOS image sensors without altering its electronics.

Figure 4:
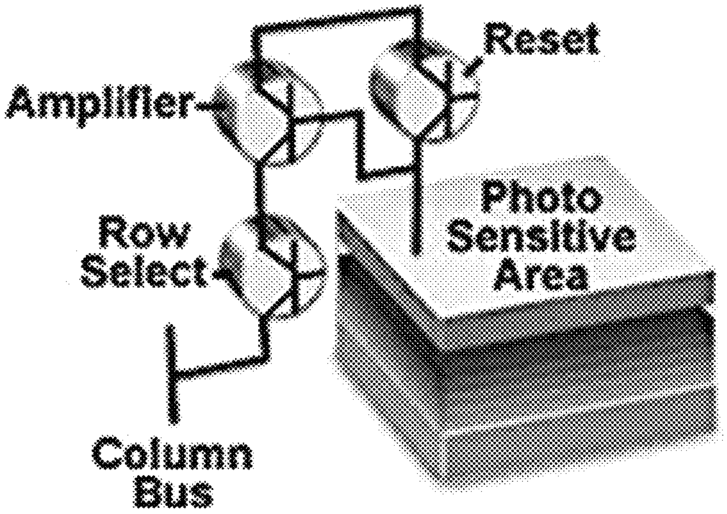
FIG. 4 is an illustration of an example circuit for a photodiode in an active pixel sensor, in accordance with some embodiments.

FIG. 4 is an illustration of an example circuit for a photodiode in an active pixel sensor, in accordance with some embodiments. The example circuit can include an amplifier transistor, a row select transistor, a reset transistor, and a column bus. The photo sensitive area is coupled to a gate of the amplifier transistor, which buffers the signal and allows readout through the column bus when the row select transistor is enabled. The reset transistor can be configured to reset the voltage potential of the photodiode.

Figure 5:
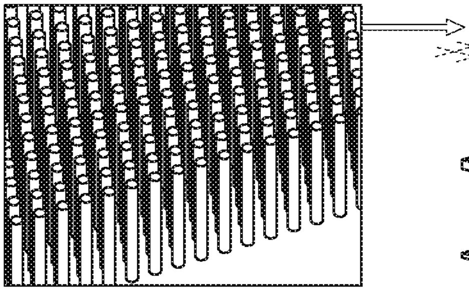
FIG. 5 shows a scanning electron microscope (SEM) image of a nanostructured material, having a nanowire length of about 2 micrometers, a top view reflection image of the nanostructured material (at 100× magnification), and a perspective view of electronic stacks of an image sensor with photodiodes, in accordance with some embodiments.
Figure 5:
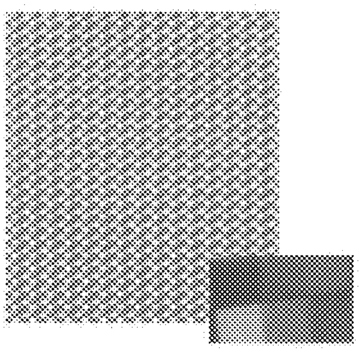
Figure 5:
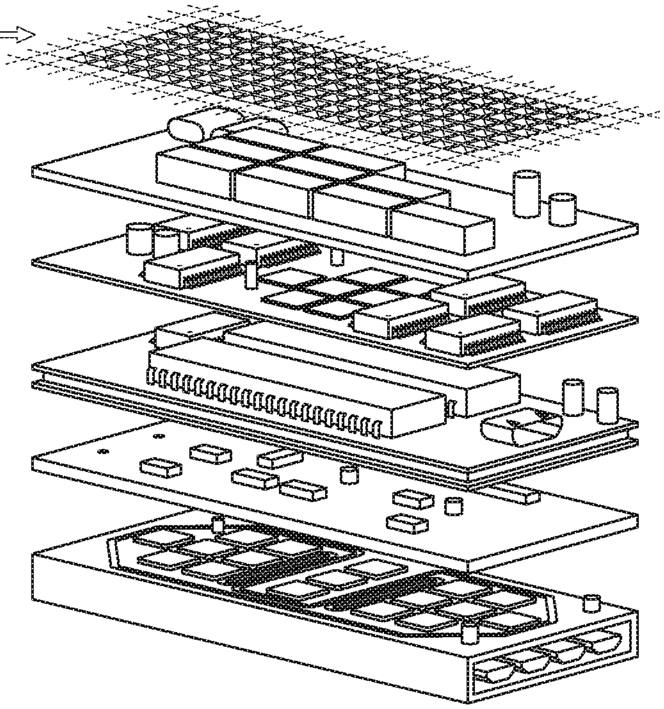

FIG. 5 shows a scanning electron microscope (SEM) image of a nanostructured material, having a nanowire length of about 2 micrometers, a top view reflection image of the nanostructured material (at 100× magnification), and a perspective view of electronic stacks of an image sensor with photodiodes, in accordance with some embodiments. The imaging sensors can be used as a platform for the multispectral sensors described herein. The CMOS sensor can be used to create a multispectral sensor by adding nano-patterned semiconductor layer(s) on top. By using known digital imaging infrastructure, the multispectral sensor can achieve manufacturing feasibility and scalability, in contrast to known multispectral sensors. The multispectral sensor can be added on top of the imaging sensor without changes in the different semiconductor layers that form the PD and the electronics, which facilitates manufacturability.

Nano-structured semiconductor materials (e.g., silicon, etc.) can be used to construct optical nano-antenna filters (arrays of semiconductor nanowires) that capture electromagnetic waves of specific wavelengths. Each pixel or group of pixels can be overlaid by one such nanowire array filter, defining that pixel's optical/color response. Several different color filters can be combined to form a spectrometer (e.g., an area spectrometer) that measures the optical spectrum. In a multispectral sensor there can be several area spectrometers. Different semiconductor materials can be used for the optical antennas to cover spectral bands in UV to NIR (using, for example, Si and/or SiGe), and additional materials like, for example, InSb can extend detection coverage to spectral bands in MWIR. Different semiconductor materials for the nano-filters can target various wavelength ranges, up to spectral bands in mid-wave or middle-wave infrared ("mid-IR").

A multispectral sensor can include multiple spectrometers, which can function as independent spectral sampling units. In some implementations, the number of spectrometers (denoted by "S") can equal 1, and consequently the whole multispectral sensor acts as one spectrometer. In some implementations, a multispectral sensor can include more than 1 spectrometer, and consequently each region of the multispectral sensor can be its own spectrometer. In some implementations, S can be large (e.g., on an order of millions of spectrometers) to preserve spatial information. A spectrometer can have multiple optical filters arranged in, for example, an N by M array, which can measure N by M different wavelength channels. As used herein, N and M are understood to be integers. In some implementations, N and M can be equal. In some implementations, N and M can be different. In some implementations, N and M can be each be greater than 2. Each optical/color filter can measure one specific wavelength (as used herein, color can mean a wavelength between ~250 nm to 10 μm). Each optical filter overlays one or more photodiodes. In some implementations, one optical filter can cover (e.g., is positioned on top of) one pixel (photodiode). In some implementations, one optical filter can cover multiple photodiodes for example if desirable for sensitivity or readout reasons. As used herein, a 'spectrometer' is understood to be a group of pixels and optical filters that can measure a set of wavelengths. Likewise, as used herein, a 'multispectral sensor' can have many such spectrometers spread across the image sensor. As described in FIGS. 6-7, area spectrometers can have different types and numbers of color filters.

Figures 6A, 6B, 6C:
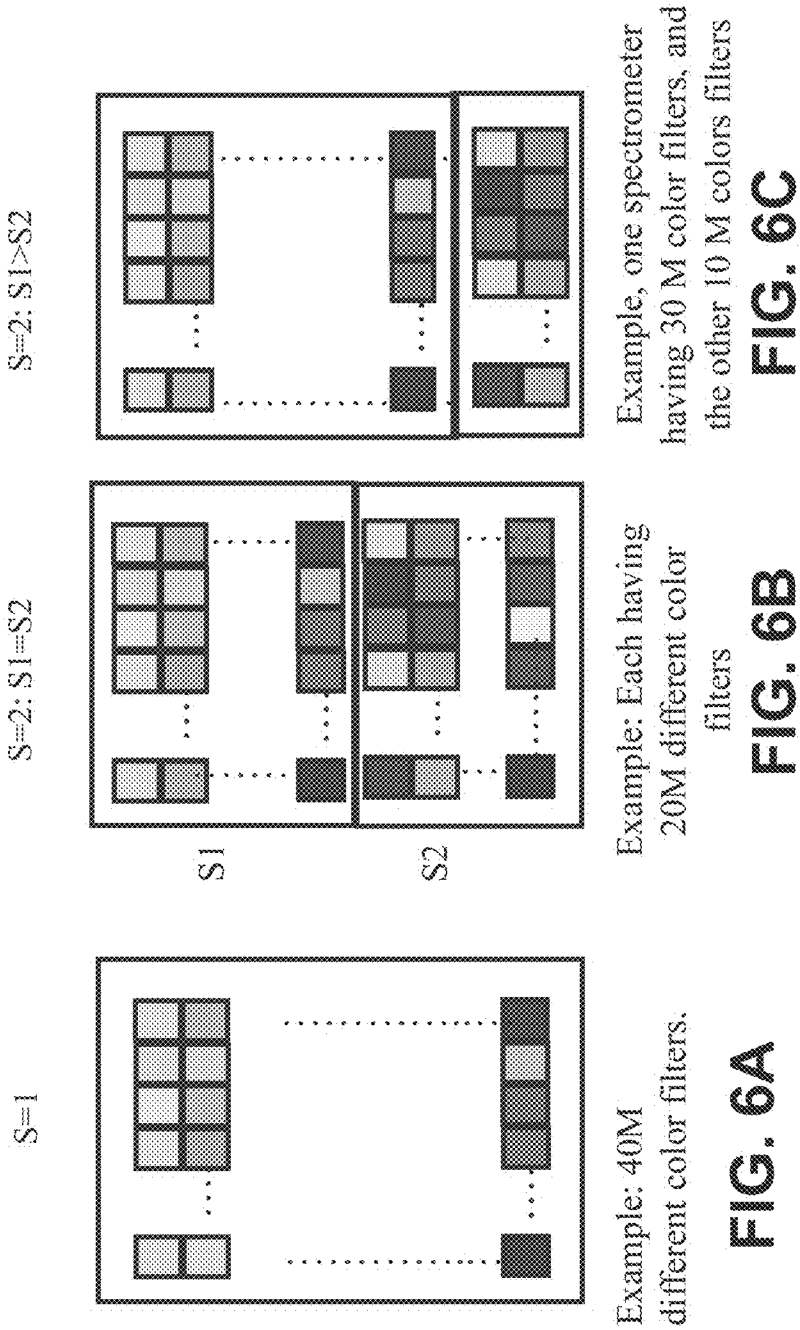
FIGS. 6A-C is an illustration of example configurations of one or more spectrometers (the number of spectrometers denoted by "S") having different numbers of color filters, in accordance with some embodiments.

FIGS. 6A-C is an illustration of example configurations of one or more spectrometers (the number of spectrometers denoted by "S") having different numbers of color filters, in accordance with some embodiments. As illustrated, the number of optical filters (channels) per spectrometer can vary. Common configurations can be N by M=2×2, 3×3, 4×4, etc., up to larger grids depending on a desired spectral resolution. A multispectral sensor can have one or many spectrometers. For example, a 9-megapixel sensor with spectrometers of size 3×3 (N=M=3, i.e., 9 colors per spectrometer) can contain about 1 million spectrometers that cover the whole array included within the multispectral sensor. Each spectrometer can yield a local spectrum of 9 wavelength bands, and because there are 1 million of them, there are thereby 1 million spatial points. A resulting output of the multispectral sensor can effectively be a spectral image covering 9 wavelengths. At the other extreme, as shown by FIG. 6A, the entire sensor can act as one large spectrometer (S=1) by using all pixels with different optical filters to measure a very high-resolution spectrum, thereby sacrificing spatial info. The multispectral sensor of FIG. 6A can have, for example, 40 million different optical filters. As shown by FIGS. 6B-C, intermediate schemes are possible. For example, FIGS. 6B-C illustrate a multispectral sensor with two spectrometers (S=2). Furthermore, half of the array can be used to capture one spectral range and the other half for another spectral range. The multispectral sensor of FIGS. 6B-C can have the same or different number of optical filters in each spectrometer. For example, each spectrometer in FIG. 6B can have 20 million different optical filters. In another example, one spectrometer in FIG. 6C can have 10 million different optical filters, and the other spectrometer can have 30 million different optical filters.

Figure 7B:
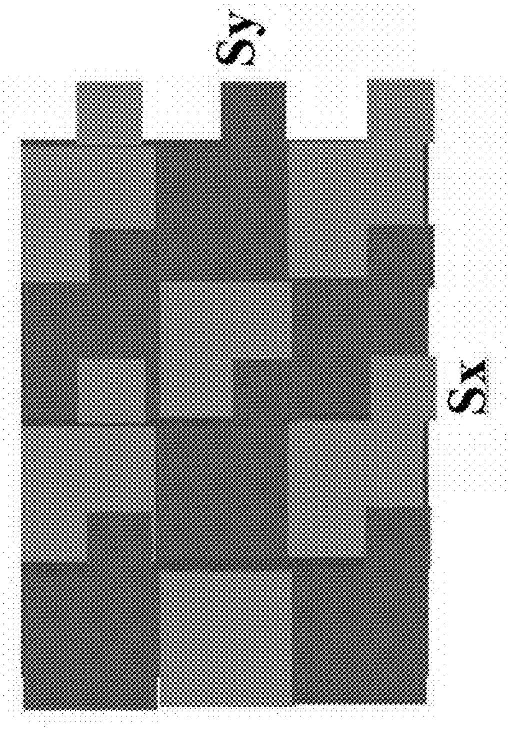
FIGS. 7A-B depict arrays of spectrometers, with FIG. 7B having a non-square/asymmetric geometry, in accordance with some embodiments.
Figure 7A:
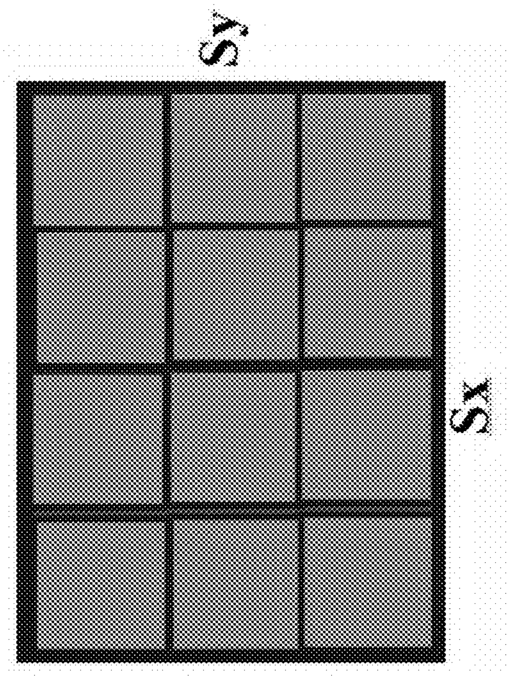

FIGS. 7A-B depict arrays of spectrometers, with FIG. 7B having a non-square/asymmetric geometry, in accordance with some embodiments. For both arrays depicted in FIGS. 7A and 7B, there can be Sx by Sy (Sx, Sy) spectrometers. Each spectrometer can have several optical filters. Each spectrometer can have the same optical filters (e.g., a same wavelength response, a same amount, etc.) or different color filters. As shown in FIG. 7B, in some implementations, the spectrometers can have non-square geometry. The material of each optical filter can be a semiconductor, with a chemical composition that can vary from pixel to another. Examples are given in FIGS. 8A-8B for a-Si and a Si—Ge alloy.

Figure 8B:
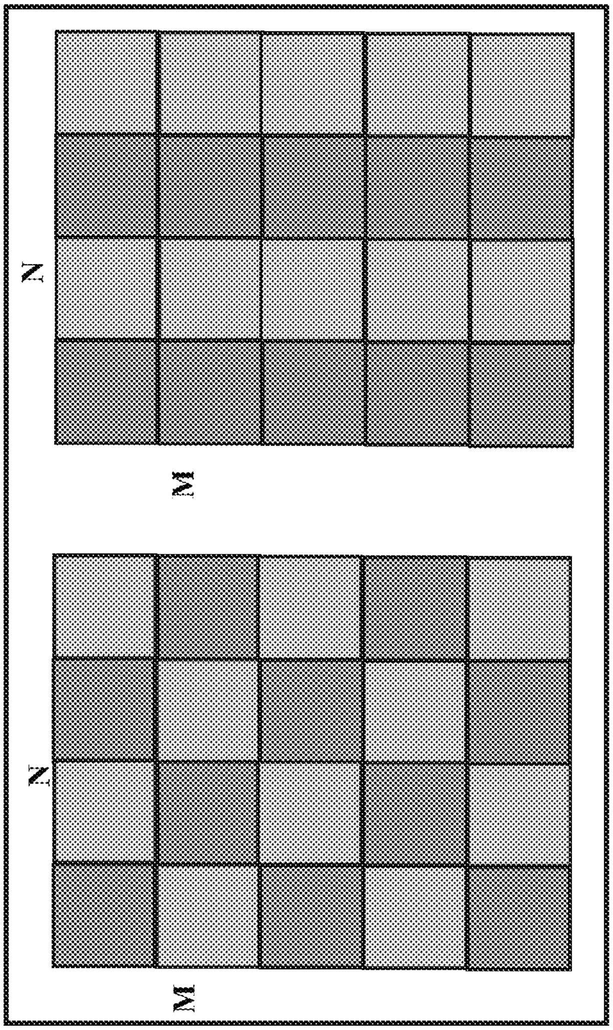
FIG. 8B is a top view of a multispectral sensor of N×M pixels made of two semiconductor materials (e.g., a-Si and/or amorphous silicon-germanium (Si—Ge) alloys), in accordance with an embodiment.
Figure 8A:
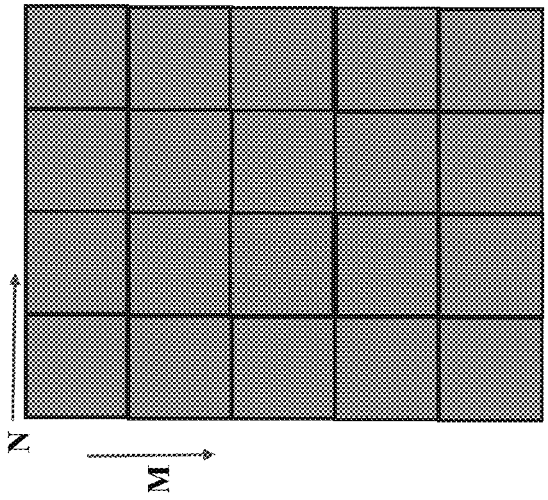
FIG. 8A is a top view of a multispectral sensor of N×M pixels made of a single semiconductor material (e.g., silicon (Si) or amorphous silicon (a-Si)), in accordance with an embodiment.

FIG. 8A is a top view of a multispectral sensor of N×M pixels made of a single semiconductor material (e.g., silicon (Si) or amorphous silicon (a-Si)), in accordance with an embodiment. FIG. 8B is a top view of a multispectral sensor of N×M pixels made of two semiconductor materials (e.g., a-Si and/or amorphous silicon-germanium (Si—Ge) alloys), in accordance with an embodiment. Different materials can be used in different optical filter arrangements. The semiconductor material used can define in part the wavelength response of the optical filters, as described in further detail herein.

Figure 9:
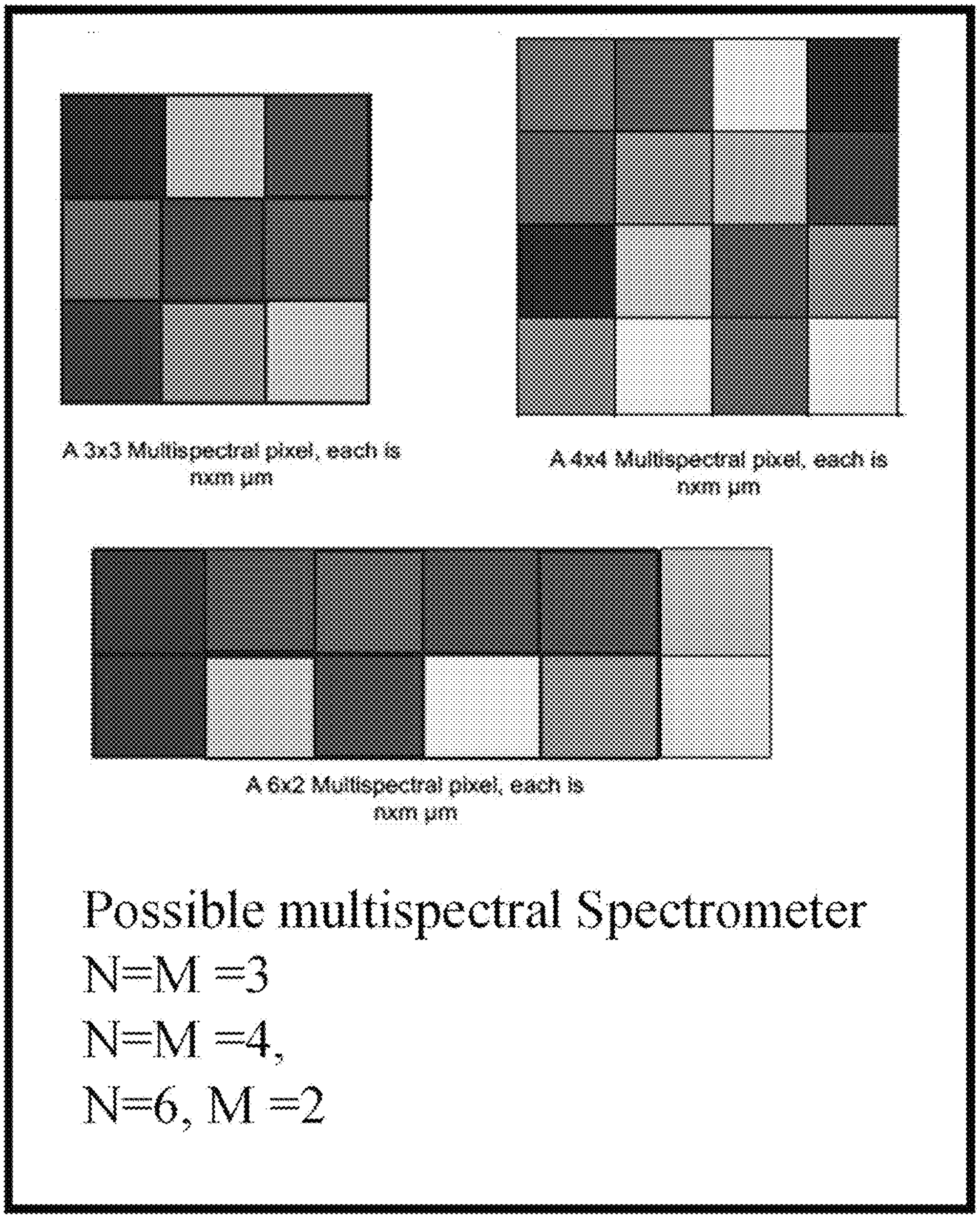
FIG. 9 depicts a 3×3 array, a 4×4 array, and a 6×2 array of multispectral pixels (each pixel being n×m micrometers (μm)), in accordance with some embodiments.

FIG. 9 depicts a 3×3 array, a 4×4 array, and a 6×2 array of multispectral pixels (each pixel being n×m micrometers (μm)), in accordance with some embodiments. As described above, area spectrometers can have different color filters. Furthermore, a spectrometer can have N×M number of color filters. For example, N=M=3 or 4. In a second example, N=2, M=3, 4, 5, or 6. In a third example, N=2, 3, 4, 5, or 6, M=2.

Figure 10B:
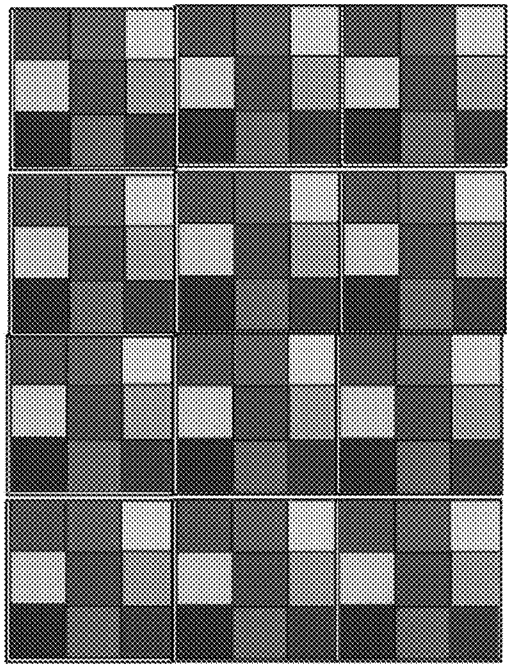
FIG. 10B depicts twelve spectrometers on a single (one) sensor, in accordance with some embodiments.
Figure 10A:
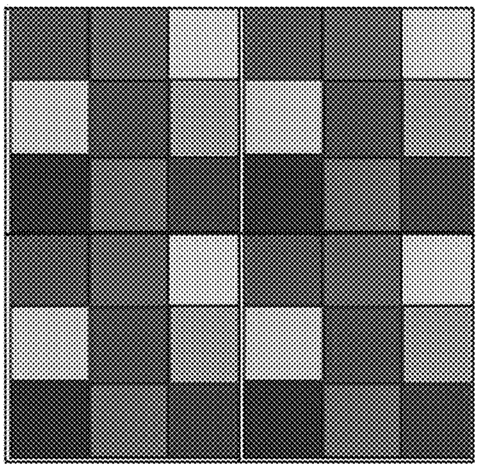
FIG. 10A depicts four spectrometers on a single (one) sensor.

FIG. 10A depicts four spectrometers on a single (one) sensor, and FIG. 10B depicts twelve spectrometers on a single (one) sensor, in accordance with some embodiments. There can be a tradeoff between spatial resolution and spectral resolution for the multispectral sensor, which can be adjusted by choosing N, M, and S appropriately. Each color filter in an array of (N,M) color filters can overlay an integer number of photodetectors, of at least one. In some examples, a color filter might cover one photodiode, 2×2, 3×3, etc., and any combinations, 2×3, 2×4, and so on.

Figure 11:
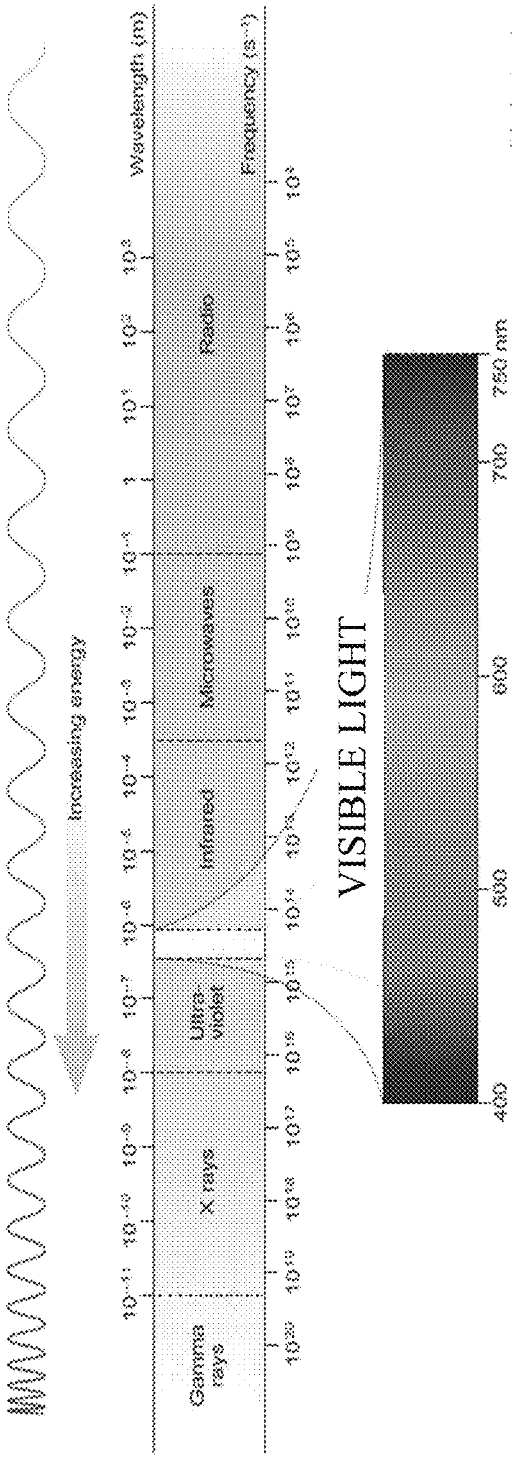
FIG. 11 is a graphical representation of the electromagnetic spectrum.

FIG. 11 is a graphical representation of the electromagnetic spectrum. As depicted in FIG. 11, light can behave as an electromagnetic wave, which can be captured by optical antennas. By constructing structures on the scale of light's wavelength, the multispectral sensor can resonate with and capture specific optical frequencies. This process can be similar to how an antenna works for radio waves, but at a nano-scale for visible/IR light. For light, the wavelength is very small (e.g., about 1/1000 of a strand of hair). Consequently, the multispectral sensor can use tiny optical antennas (e.g., on the order of about several nanometers). As is well known, antennas can be designed to receive EM waves at specific frequencies, were first used for communication in 1895 (Marconi), and can come in all kind of shapes and sizes.

When light of the right wavelength strikes a semiconductor nanowire of appropriate dimensions, it can excite resonant modes in the nanowire. This process can be analogous to a waveguide. This can lead to strong interaction (e.g., transmission and/or absorption) at that wavelength.

Figure 12B:
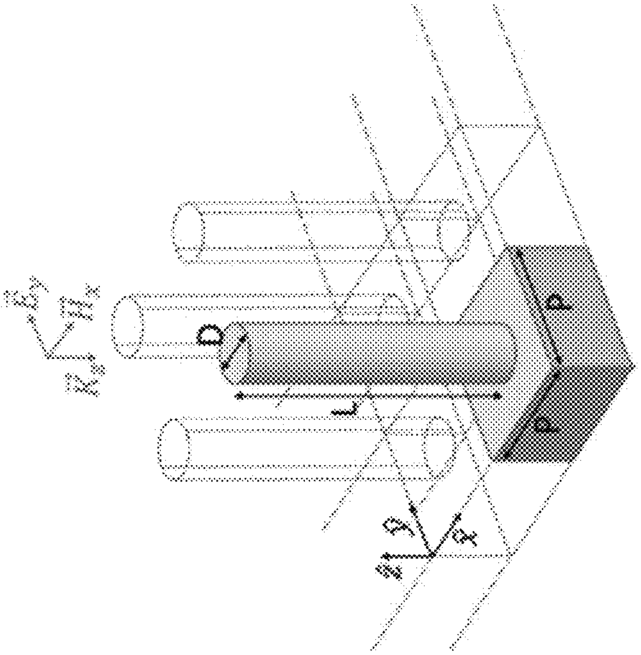
FIG. 12B is a graphical representation of a periodic nanowire (NW) array, in accordance with some embodiments.
Figure 12A:
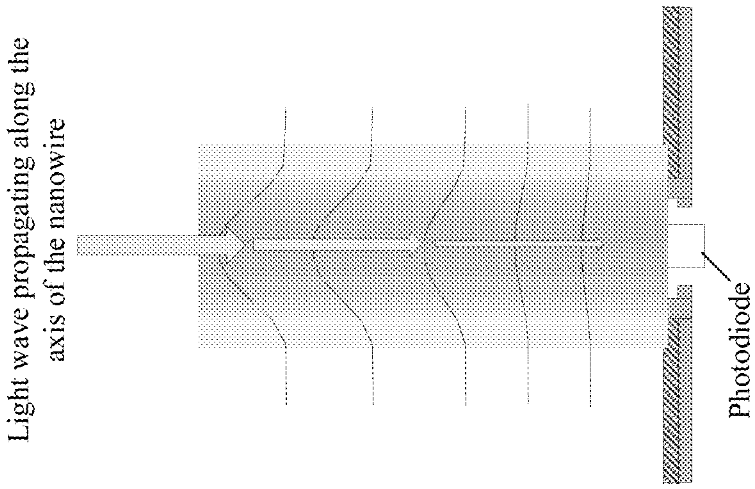
FIG. 12A depicts a light wave propagating along a longitudinal axis of a nanowire, toward a photodiode, in accordance with some embodiments.

FIG. 12A depicts a light wave propagating along a longitudinal axis of a nanowire, toward a photodiode, in accordance with some embodiments. The propagation of light in a single semiconductor nanowire (acting as an optical antenna) is known. Computer simulations can describe light wave propagation in nanowires as a wave of different modes. As light propagates, it gets absorbed by the single nanowire. A single semiconductor nanowire can support certain resonant modes that determine which wavelengths are transmitted or reflected. The optical filters of the multispectral sensor can operate on the principle of guided-mode resonances in periodic structures, as described in photonic crystal filters.

FIG. 12B is a graphical representation of a periodic nanowire (NW) array, in accordance with some embodiments. Light propagation can generally be solved using the Helmholtz equation for E fields (Equation 1) and H fields (Equation 2):

$$\vec{\nabla}\times\left(\mu_r^{-1}\left(\vec{\nabla}\times\vec{E}(\vec{r})\right)\right)=k_o^2\overline{n}^2\vec{E}(\vec{r}),$$

$$\vec{\nabla}\times\left((\overline{n})^{-2}\left(\vec{\nabla}\times\vec{H}(\vec{r})\right)\right)=k_o^2\mu_t\vec{H}(\vec{r}).$$

In periodic structures such as the periodic NW array, the propagation of light is more specifically described by Bloch modes. These modes are characterized by a specific wavelength and spatial periodicity, analogous to the allowed energy bands in solids. When incident light interacts with a periodic structure, it can couple to these Bloch modes, particularly the leaky Block modes. These leaky modes, also known as guided modes, are not confined within the periodic NW array but rather leak energy into the surrounding medium. Light is therefore not confined by the periodic NW array. At specific wavelengths, the coupling between the incident light and the leaky Bloch modes becomes strong, leading to high reflectance and a sharp dip in transmission. The resonance wavelength is defined at least in part by the NW array period and the effective refractive index of the structure (e.g., a NW array with a large period can have larger resonance wavelength(s)). This is described broadly as a guided mode resonance. In short, the leaky Bloch modes can be guided mode resonances which are characteristic of $HE_{ln}$ modes. This leads to the creation of coupled antennas among the nanowires in the periodic NW array.

Figure 12C:
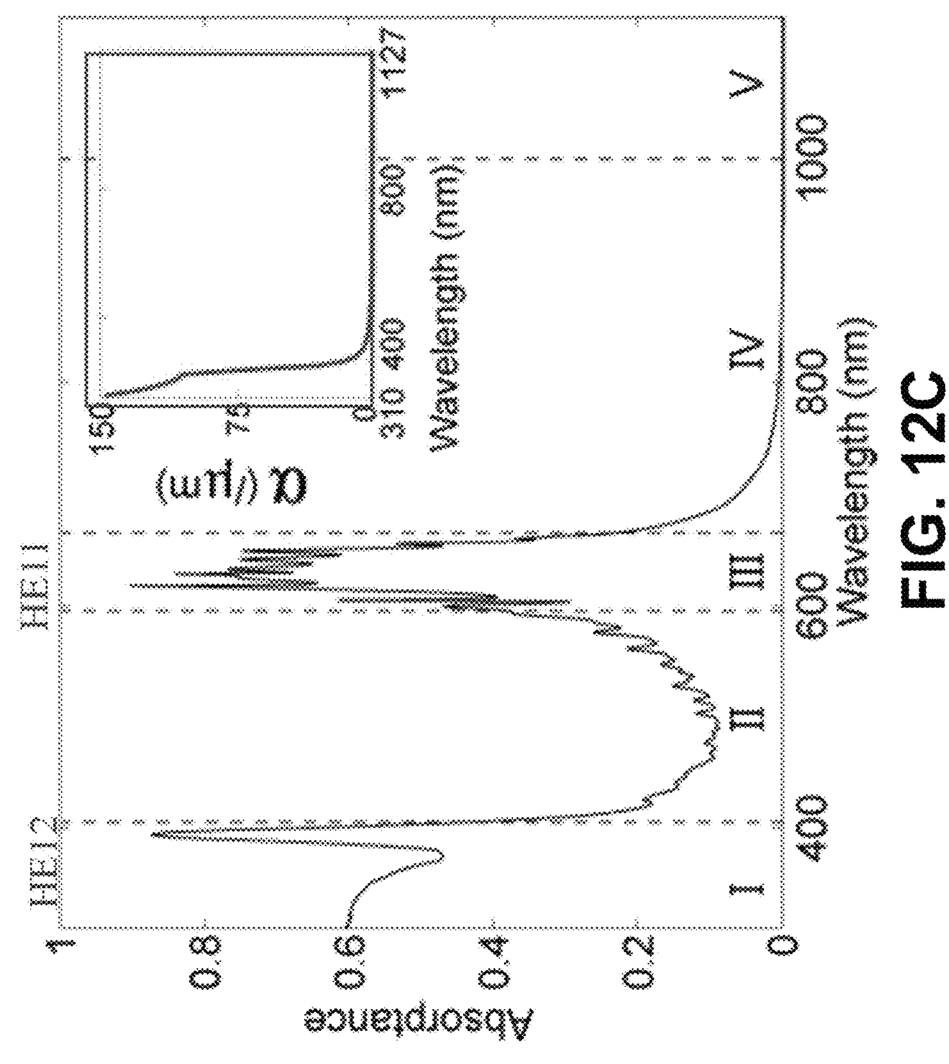
FIG. 12C includes a plot of absorptance versus wavelength, for wave propagation in nanowires.

FIG. 12C includes a plot of absorptance versus wavelength, for wave propagation in nanowires (Sturmberg, B. C., Dossou, K. B., Botten, L. C., Asatryan, A. A., Poulton, C. G., De Sterke, C. M. and McPhedran, R. C., 2011. Modal analysis of enhanced absorption in silicon nanowire arrays. Optics Express, 19 (S5), pp. A1067-A1081). The plot demonstrates the guided mode resonance phenomenon. In the example substrate (flat silicon), the $HE_{12}$ mode exhibits a strong absorption for wavelengths less than about 400 nm, while the $HE_{11}$ mode exhibits a strong absorption for wavelengths between about 600 nm and about 700 nm.

As discussed with respect to FIGS. 12A-B, in an array of nanowires, interaction between elements leads to selective transmission/reflection properties at certain wavelengths. The array as a whole thus can act as an optical/color filter. These optical filters can be understood as exhibiting guided-mode resonances, a form of leaky waveguide mode that causes high reflection at certain wavelengths and transmission at others (the $HE_{1n}$ modes).

There are various parameters that can determine the spectral filtering performance of the optical filters. The semiconductor material of the nanowires in the optical filter can determine the energy gap and the operating wavelengths range. As discussed in further detail herein, the nanostructure geometry of the optical filter, including diameter, nanowire length, spacing, and shape of the nanowires can also impact performance. Furthermore, the medium in the spacing between the nanowires can be of lower refractive index than the semiconductor nanowires themselves. For example, air and silicon dioxide (SiO2) can be used to fill the space between the nanowires.

Engineering Semiconductor Gaps and Using Different ones for Different Applications.

Semiconductors of different energy gaps can be used as materials for antennas (e.g., optical filters) that capture light of different wavelengths. The operating wavelength range can be defined by the material composition and its intrinsic semiconductor energy gap Eg (e.g., in eV). The wavelength (e.g., in nanometers) of the absorption edge (the maximum captured wavelength) is given by:

$$\lambda = \frac{1240}{E_g} \quad \text{(Equation 3)}$$

For example, silicon (Si and aSi) has an energy gap Eg (eV) of about 1.1 eV, and its absorption range is between the UV-visible (e.g., about 100 nm to about 800 nm) to about 1000 nm. Other semiconductor materials of different energy gap Eg can also be used to provide antennas in different ranges. For example, germanium (Ge) has an energy gap Eg (eV) of about 0.7 eV and its absorption range is between about 500 nm to about 1500 nm (e.g., into the near-IR). Indium antimony (InSb) can detect light in the range of about 2000 nm to about 6000 nm (e.g., into the mid-IR). Indium arsenic (InAs) can detect light in a range of about 1000 to about 3400 nm.

Figure 13B:
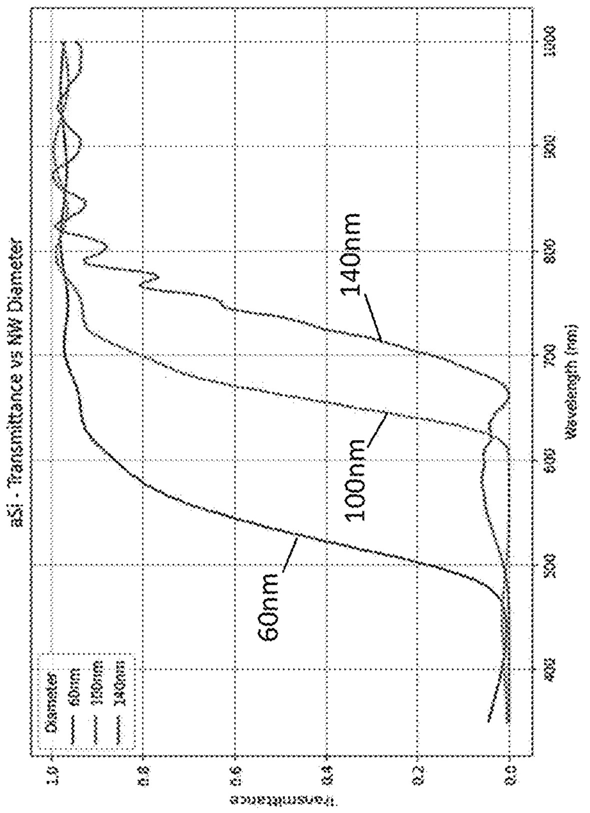
FIG. 13B is a plot of transmittance versus wavelength, for nanowires comprising amorphous silicon, for various nanowire diameters, in accordance with some embodiments.
Figure 13A:
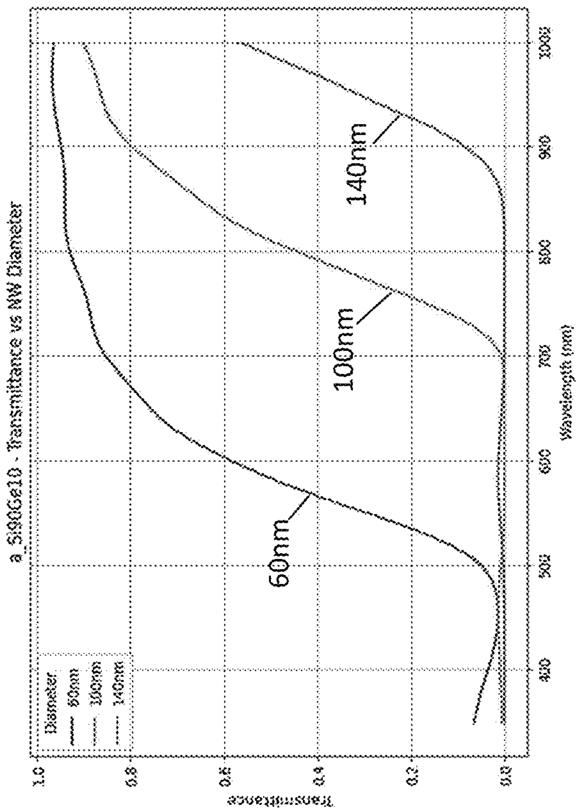
FIG. 13A is a plot of transmittance versus wavelength, for nanowires comprising amorphous silicon alloyed with amorphous germanium (aSi0.9aGe0.1), for various nanowire diameters, in accordance with some embodiments.

Alloying semiconductor materials together can extend the given ranges into longer wavelengths of the electromagnetic spectrum, such as the NIR and mid-IR. By incorporating alloys of specific semiconductor materials, a single multispectral sensor can detect light across the EM spectrum (e.g., light in the UV-NIR range). For example, alloying Si and Ge can extend detection coverage associated with the Si range given above into the NIR. Alloying small amounts of amorphous germanium (aGe) to Si or amorphous silicon (aSi) can increase the absorption range of Si/aSi into the NIR range. Alloying InSb with gallium provides antennas that can detect light in the range of about 1300 to about 6000 nm. Alloying InSb with aluminum provides antennas that can detect light in the range of about 700 to about 6000 nm. For multispectral sensors using CMOS photodiodes, it can be advantageous to use alloys of, for example, (Si—Ge) and (aSi-aGe). From the calculation of the energy gap, silicon should in theory be able to absorb light of wavelength up to 1000 nm, but experimentally its efficiency decreases significantly above 800 nm. By adding a small amount of Ge (which has a smaller energy gap than Si), to Si, the absorption performance can be extended to between 1200 nm and 1300 nm. Thus, an alloy of aSi-aGe and an alloy of Si—Ge can allow optical (color) filtering with good efficiency from 750 nm to 1100 nm. FIGS. 13A-13B demonstrate the effect of alloying a-Si with a-Ge.

Examples of materials and filtering is shown in table 1 below:

| Material | Filtering (Absorption) Window (μm) Filtering less than λ | Approximate Spectral Region | Bandgap (eV) |
|---|---|---|---|
| Si | λ ≤ 1.11 μm | UV-Visible- Near-IR | 1.12 |
| Ge | λ ≤ 1.88 μm | Visible- SWIR | 0.66 |
| InSb | λ ≤ 7.3 μm | Mid-Long-Wave IR | 0.17 |
| InAs | λ ≤ 3.5 μm | Mid-IR (MWIR) | 0.354 |
| InSbAs (low Eg) | λ ≤ 12.4 μm | Far-IR | 0.1 |
| InSbAs (high Eg) | λ ≤ 3.1 μm | Mid-IR | 0.4 |
| InGaAs (almost pure GaAs) | λ ≤ 0.87 μm | Visible Near-IR | 1.42 |
| InGaAs (x~0.53) | λ ≤ 1.65 μm | Shortwave IR (SWIR) | 0.75 |
| InAlAs (low Al) | λ ≤ 1.13 μm | Near-IR | 1.1 |
| InAlAs (high Al) | λ ≤ 0.85 μm | Near-IR | 1.46 |
| InAsP (low P) | λ ≤ 1.65 μm | SWIR/Near-IR | 0.75 |
| InAsP (high P) | λ ≤ 0.92 μm | Near-IR | 1.35 |

FIG. 13A is a plot of transmittance versus wavelength, for nanowires comprising amorphous silicon alloyed with amorphous germanium (aSi0.9aGe0.1), for various nanowire diameters, in accordance with some embodiments. FIG. 13B is a plot of transmittance versus wavelength, for nanowires comprising amorphous silicon, for various nanowire diameters, in accordance with some embodiments. FIGS. 13A-13B show spectral results of simulations of light transmission in nanowires of different semiconductors (amorphous Silicon and amorphous Silicon-Germanium). The effect of change in nanowire composition on the bypass properties of the nanowires is shown for nanowires of three different diameters: 60, 100 and 140 nm. As is shown in FIG. 13B, a-Si can have a range of filtering up to about 700 nm. In contrast, alloying a-Si with Ge (e.g., where Ge defines about 10% of the alloyed material) can extend the range of filtering up to about 850 nm.

Figure 14:
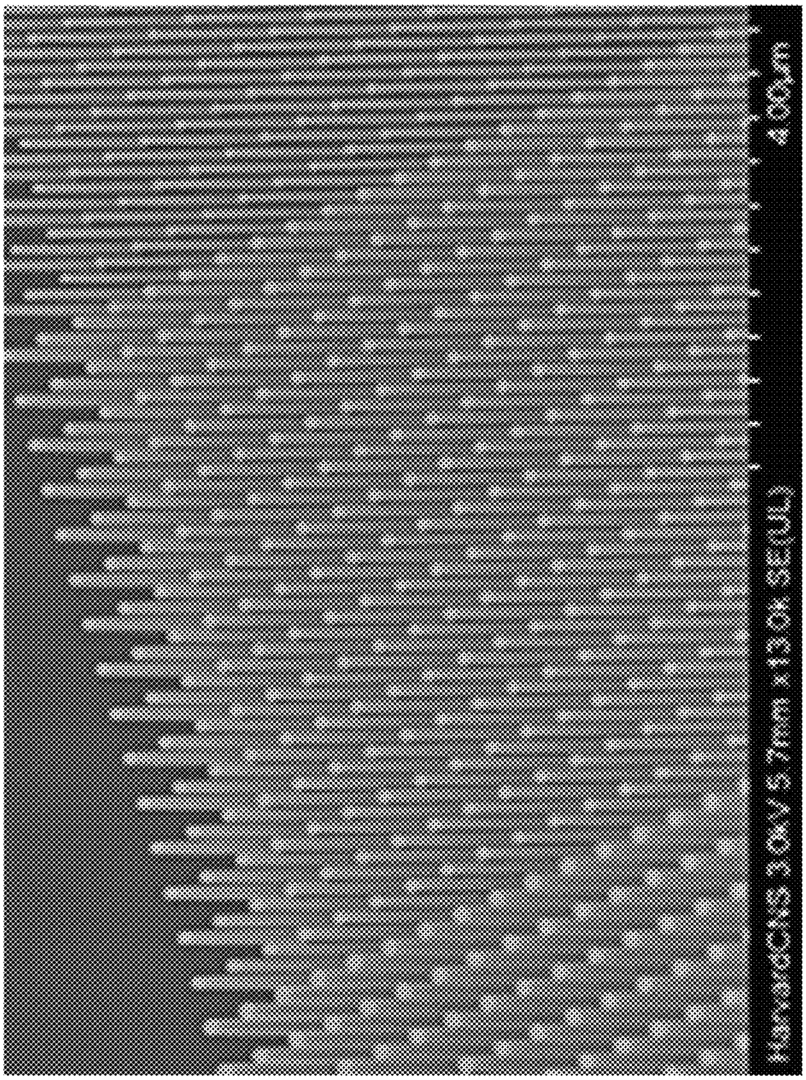
FIG. 14 is a scanning electrode microscope (SEM) image of an array of silicon nanowires, in accordance with some embodiments.

FIG. 14 is a scanning electron microscope (SEM) image of arrays of silicon nanowires, in accordance with some embodiments. The arrays depicted are distinguished by their uniform properties, such as nanowire diameter. As described above, the nanostructures shown can be, for example, silicon for visible light filtering. The spectra range can be from, for example, UV to NIR. More specifically, for example, the spectra range can be from wavelength 300 nm to 900 nm, with 20 nm resolution. The arrays depicted can be fabricated and joined with CMOS photodiodes using various methods described herein.

Figure 15:
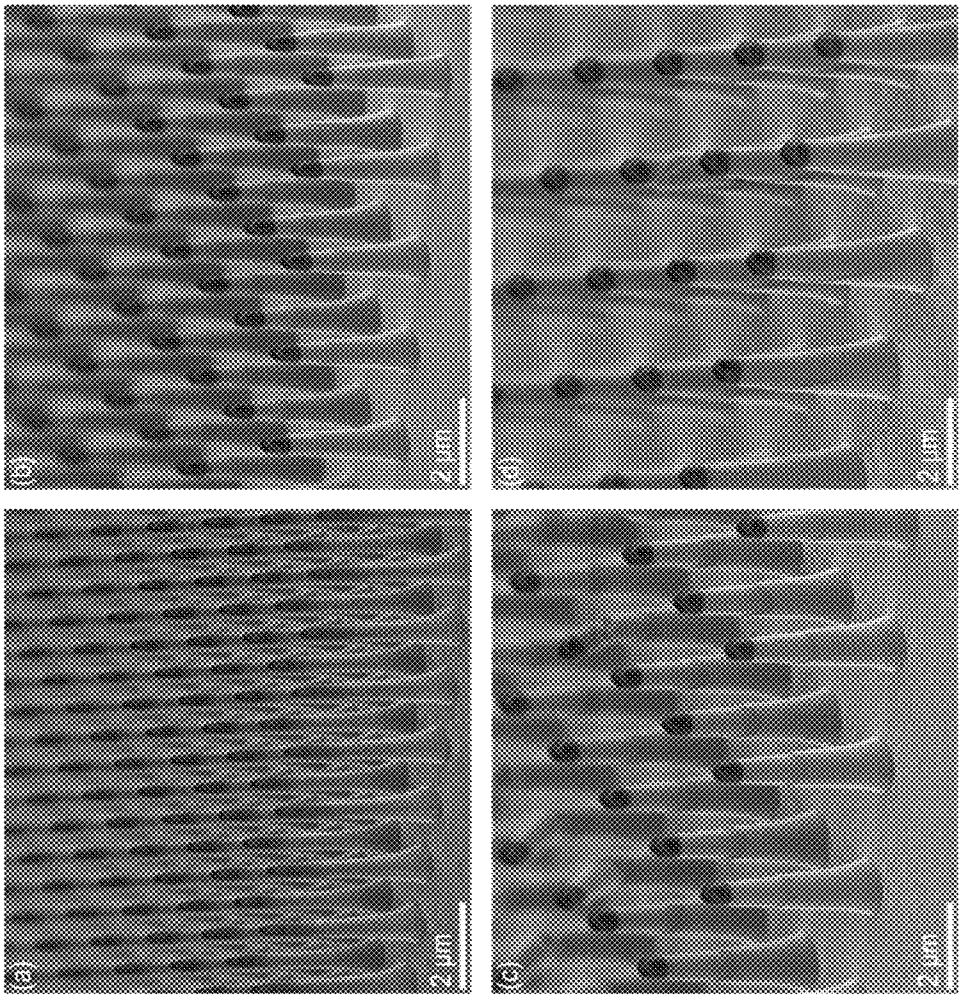
FIG. 15 includes SEM images of arrays of indium antimonide (In Sb) nanowires for mid-infrared (mid-IR) filtering, in accordance with some embodiments.

FIG. 15 includes SEM images of arrays of indium antimonide (In Sb) nanowires for mid-infrared (mid-IR) filtering, in accordance with some embodiments. The InSb nanowires shown can filter light in the mid-infrared (e.g., between about 1.2 μm to about 4.8 μm) with ~100 nm spectral resolution.

FIGS. 16-20B describe nanostructure geometry of the optical filter. The geometry of the nanowires that form the optical antennas can include cross section area, shape, length, and spacing. The area of the cross section of the nanowire can define the absorption of the wavelength of the incident light. These cross sections can be described by any geometry. For example, for a circular cross section, the radius/diameter is the primary parameter, i.e., A=x$\pi^2$. For an ellipsoid cross section, it is the semi-axes of a and b; i.e., A=$\pi$(a)×(b). This cross-section geometry can define light polarization through the nanowire, with the light in the (a) or (b) polarization. For every cross section, particular wave lengths are admitted. As the area of the cross section increases, longer wavelengths are admitted.

Figure 16:
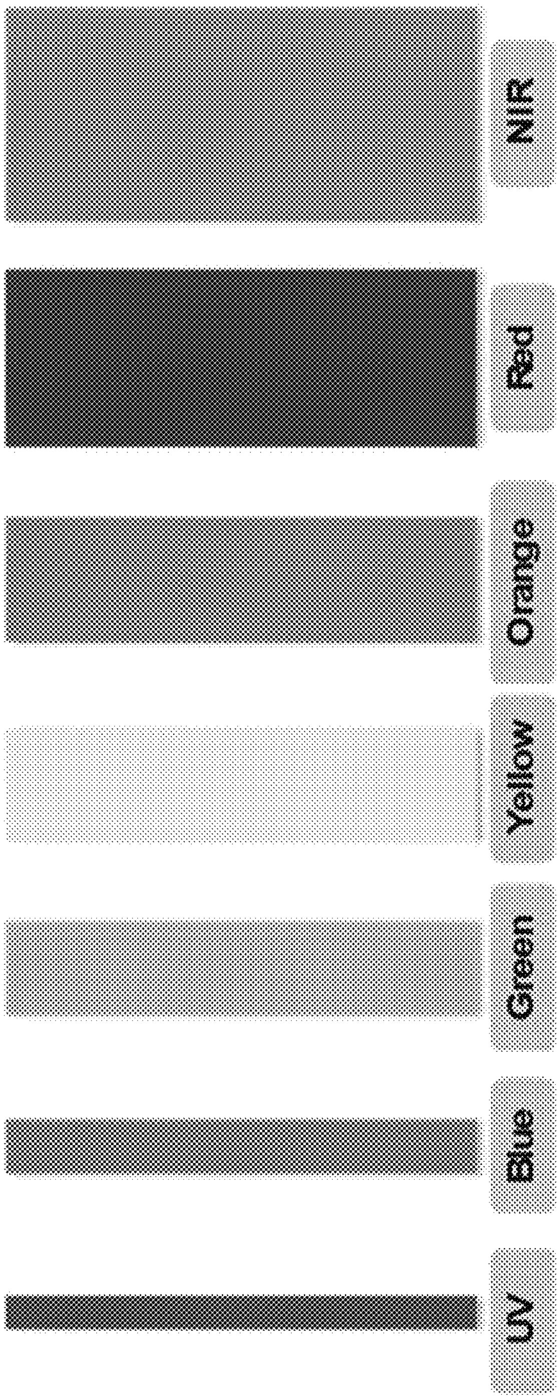
FIG. 16 shows an example of how different nanowire cross sections areas and/or shapes can impact the ability of the associated nanowire(s) to capture different wavelength ranges, in accordance with some embodiments.

FIG. 16 shows an example of how different nanowire cross sections areas and/or shapes can impact the ability of the associated nanowire(s) to capture different wavelength ranges, in accordance with some embodiments. As is shown for illustration, nanowires with different cross section areas can capture different wavelength ranges (e.g., narrow wavelength ranges that correspond to color in visible light, or otherwise).

Figure 17A:
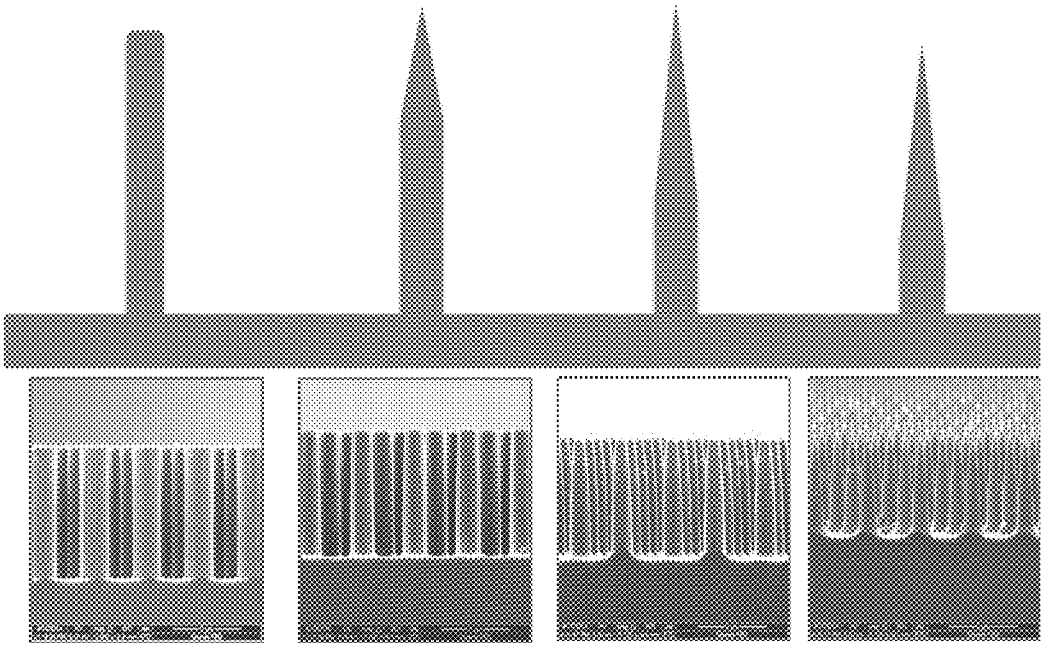
FIG. 17A shows a cross-section view of different nanowire shapes, in accordance with some embodiments.
Figure 17B:
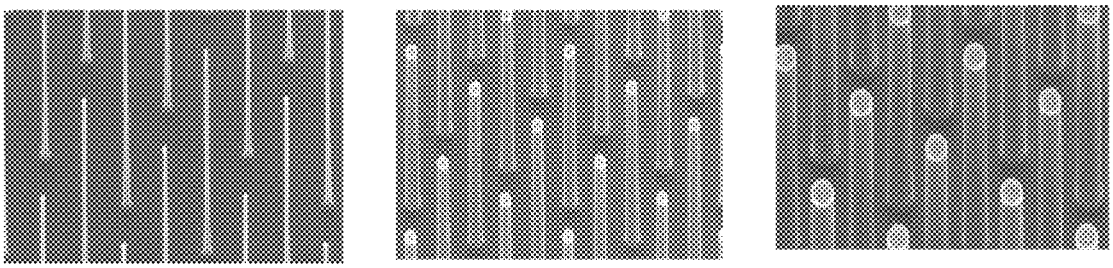
FIG. 17B shows top views thereof.

FIG. 17A shows a cross-section view of different nanowire shapes, in accordance with some embodiments, and FIG. 17B shows top views thereof. As discussed above, the cross section geometry can cause the nanowire to function at particular resonances and particular absorbing wavelengths. As shown in FIG. 17A, the area of the cross section can vary along the long axis of the nanowire. Shapes with substantially uniform cross sections (e.g., the degree to which the nanowire is vertically aligned or straight) are favored. Substantially uniform cross sections are understood herein to mean that the area of the cross sectional shapes within a volume of the nanowire can vary with respect to each other up for example less than 20%, less than 10%, less than 5%, less than 1%, etc.

While the length of the nanowire does not substantially change the spectral band, it can define at least in part the absorption efficiency of the nanowire at specific wavelengths, which can impact the signal (e.g., filtered light) received by the photodiode. The nanowire length can define the structural resonance (e.g., taller wires can support more modes or sharper resonances). In implementations with visible light, for example, nanowire length can be on the order of about 500 nm to about 2500 nm. The nanowire length can be substantially equal to (e.g., within 90%, 92%, 95%, etc.) the thickness of the semiconductor layer.

Figure 18B:
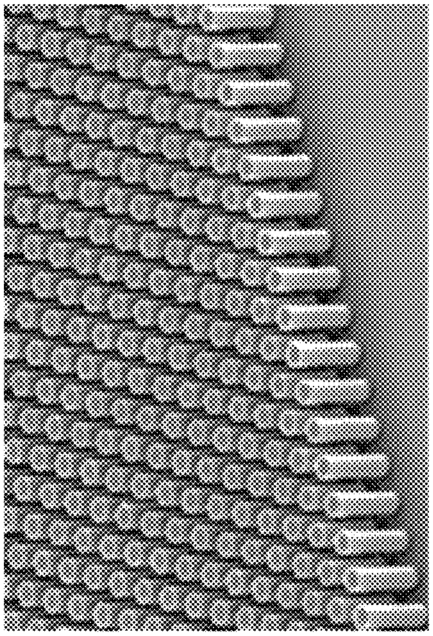
FIGS. 18A-B show SEM images of a square lattice of nanowires and a hexagonal lattice of nanowires, respectively, in accordance with some embodiments.
Figure 18A:
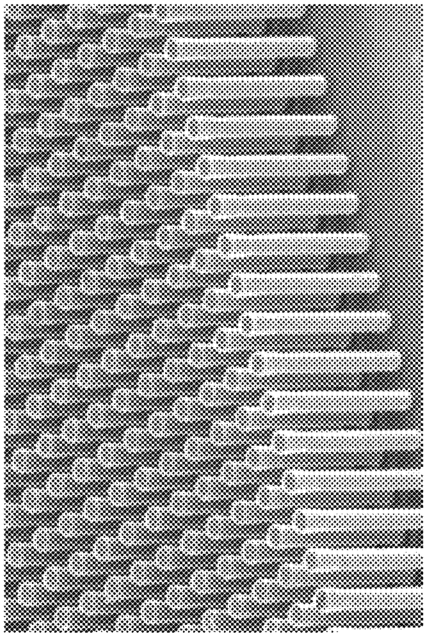

FIGS. 18A-B show SEM images of a square lattice of nanowires and a hexagonal lattice of nanowires, respectively, in accordance with some embodiments. The nanowires can be arranged in a lattice/array, which, as depicted, can be a square, a hexagonal, or random. The distance/pitch/spacing between the nanowires can define at least in part the coupling effect among the nanowires, and therefore the filtering effect (e.g., the filter transmission curve shape). When the distance is large (e.g., on the order of multiple wavelengths of the incident light), the nanowires can behave as independent antennas and can be considered uncoupled. On the other hand, when distance is small, optical coupling can take place and is related to the distance between the wires.

In some implementations, the optical filters described herein can have "tightly packed" nanowires (e.g., between about 100 nm and about 300 nm).

Figure 19:
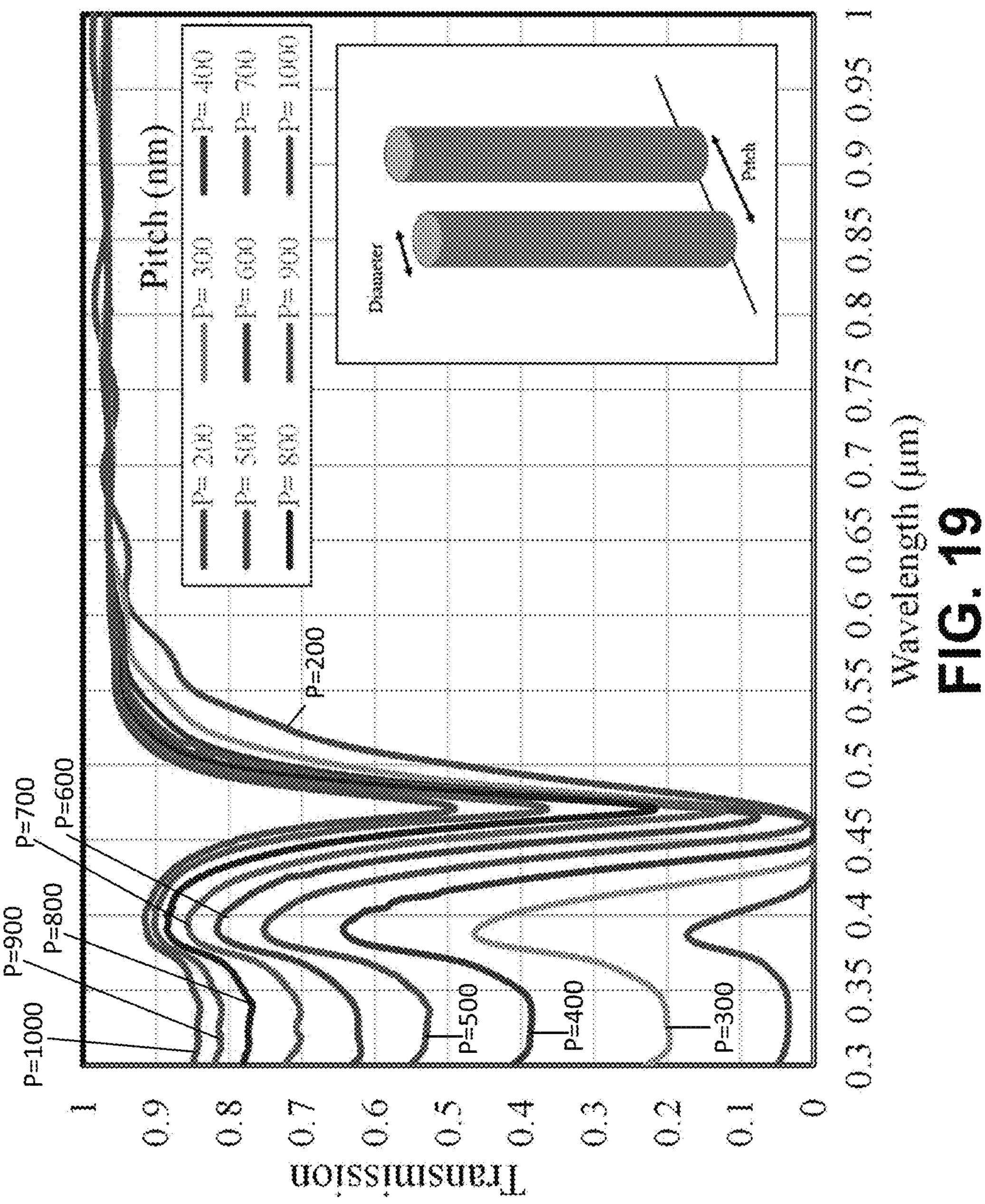
FIG. 19 shows plots of transmission versus wavelength, for a variety of different nanowire pitches, in accordance with some embodiments.

FIG. 19 shows plots of transmission versus wavelength, for a variety of different nanowire pitches, in accordance with some embodiments. FIG. 19 shows spectral transmission results for a nanowire array with cylindrical nanowires of 70 nm diameter, where light propagates along the longitudinal axis of nanowires therein. The coupling effect can distinguish the nanowire arrays from nanowires that do not exhibit coupling.

Figure 20B:
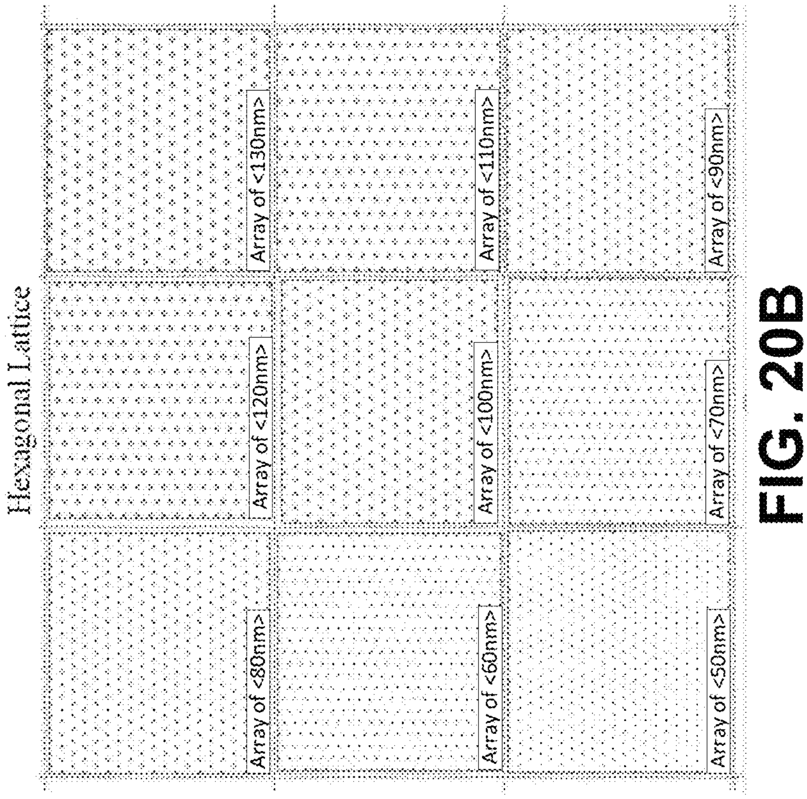
FIG. 20B shows an example of a hexagonal lattice multispectral spectrometer with nine optical filters, each optical filter configured to transmit a color(s) of light based on the diameter(s) and/or nanowire length(s) of the nanowires in that optical filter, in accordance with some embodiments.
Figure 20A:
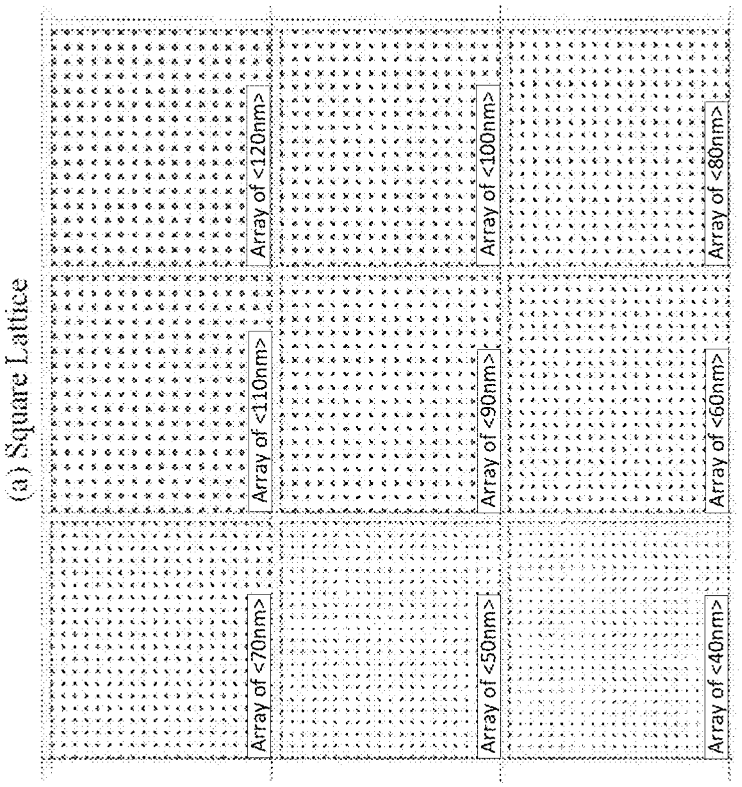
FIG. 20A shows an example of a square lattice multispectral spectrometer with nine optical filters, each optical filter configured to transmit a color(s) of light based on the diameter(s) and/or nanowire length(s) of the nanowires in that optical filter, in accordance with some embodiments.

FIG. 20A shows an example of a square lattice multispectral spectrometer with nine optical filters, each optical filter configured to transmit a color(s) of light based on the diameter(s) and/or nanowire length(s) of the nanowires in that optical filter, in accordance with some embodiments. FIG. 20B shows an example of a hexagonal lattice multispectral spectrometer with nine optical filters, each optical filter configured to transmit a color(s) of light based on the diameter(s) and/or nanowire length(s) of the nanowires in that optical filter, in accordance with some embodiments. In the examples of FIGS. 20A-20B, N=M=3, and each nanowire within each optical filter can have the same nanowire length.

When arranged appropriately, the nanostructured semiconductor elements (e.g., nanowires), can be configured to act as optical antennas and collectively form resonant optical filters. The optical antennas can transmit certain wavelengths and reject others, thereby serving as the light-selective (e.g., color) filters for the multispectral sensor. As discussed above, each optical filter can be implemented as an array of vertical semiconductor nanowires. Each optical filter can capture a narrow range of optical wavelengths.

Different nanowire arrays can be used to create different optical antennas, thereby forming a particular optical filter. The nanowires in each optical filter have geometrical parameters, such as diameter, length, and spacing. These nanowires can be arranged with various spacing patterns (e.g., square grid, rectangular grid, hexagonal lattice, or even random) to form the optical filter. Each optical filter can be made of a particular semiconductor material (or composition), and this material can vary from one optical filter to another on the same chip. All nanowires within one optical filter are the "same" (same geometry/material) to target one wavelength (e.g., a single wavelength or a narrow band of wavelengths), while different optical filters use different nanowire parameters for other wavelengths. Each optical filter can be fabricated on top of a CMOS photodiode of a CMOS image sensor. In some implementations, one optical filter can be fabricated on top of a single photodiode pixel. In some implementations, one optical filter can be fabricated on top of a cluster of photodiodes. Each optical filter can in effect be a monochromatic channel, transmitting a particular wavelength (or narrow band of wavelengths) to the photodiode it's coupled to. As used herein, a spectrometer can have a number of N×M optical filters, each having at least one photodetector. Thus, an area spectrometer on the chip can be formed by a set of N×M distinct optical filters and accompanying (e.g., photonically coupled) pixels covering N×M different wavelengths (or different narrow bands of wavelengths). One or multiple such spectrometers can be integrated on a single CMOS sensor chip, making up the multispectral sensor. As used herein, a multispectral sensor can be composed of one or several spectrometers.

Figure 21A:
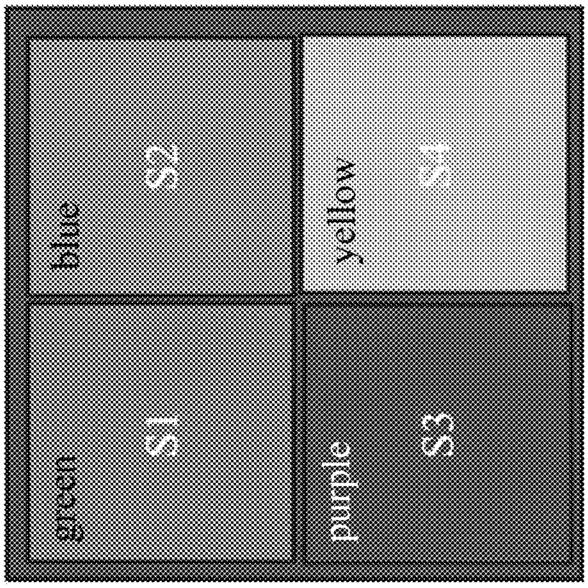
FIG. 21A shows a first example of a multispectral sensor having four spectrometers, in accordance with some embodiments.

FIG. 21A shows a first example of a multispectral sensor having four spectrometers, in accordance with some embodiments. As discussed above, multispectral sensor can have any number of spectrometers: for example, 1, 2, 3, . . . , up to millions. The spectrometers can have different capabilities as described by, for example, their spectral resolutions and spatial resolutions.

Figure 21B:
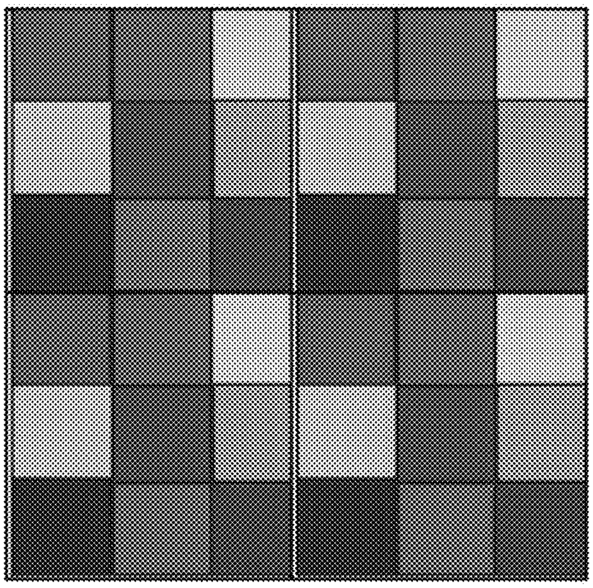
FIG. 21B shows a multispectral sensor having four spectrometers each including 3×3 filters, in accordance with some embodiments.

FIG. 21B shows a multispectral sensor having four spectrometers each including 3×3 filters, in accordance with some embodiments. Each shaded square is representative of an optical filter that has a spectral response different from the remaining optical filters in that spectrometer. In some implementations, as is shown, each spectrometer in a multispectral sensor can have a "same" number and/or type of optical filters (e.g., optical filters with a "same" spectral response). In some implementations, each spectrometer in a multispectral sensor can have a different number and/or type of optical filters. In FIGS. 21A-21B, there can be one or more CMOS photodiodes beneath the optical filter depicted. In other words, the optical filter can be positioned between incident light and the CMOS photodiode(s).

Figure 22:
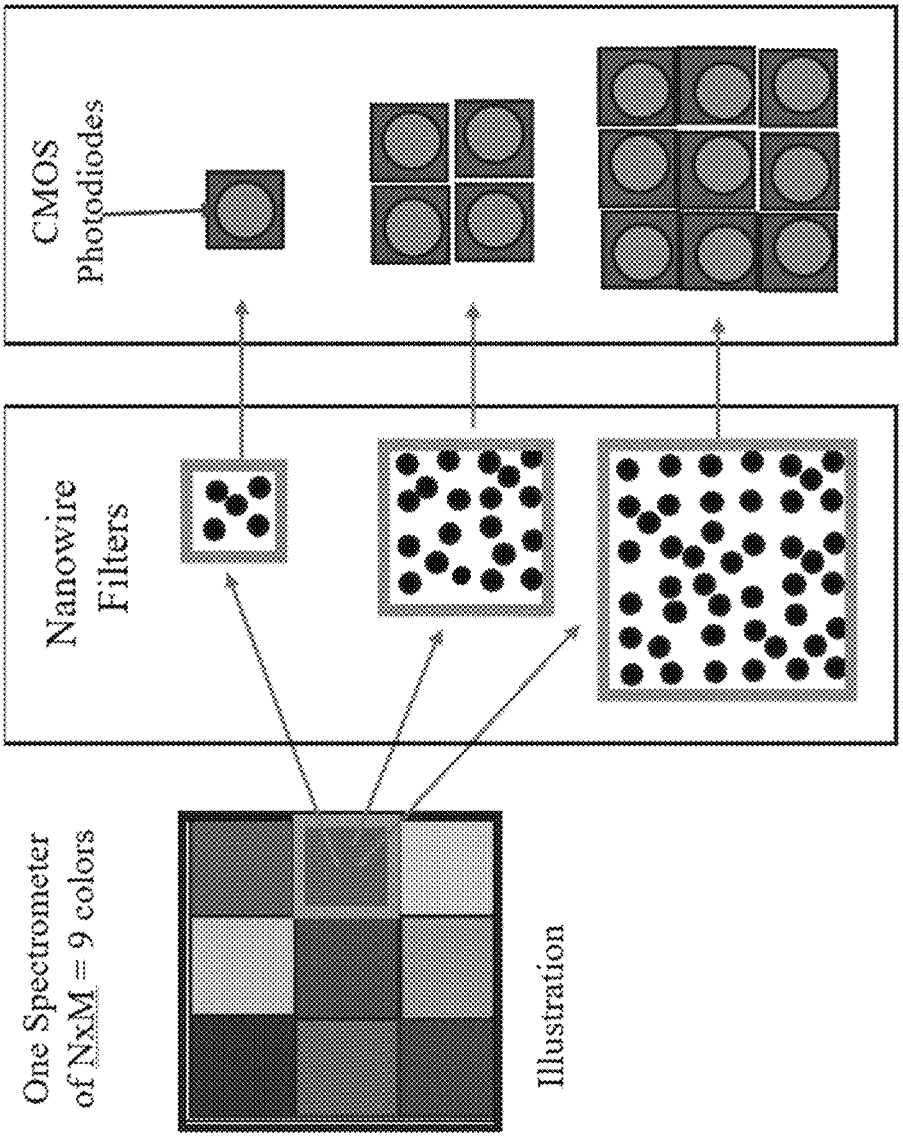
FIG. 22 is a diagram showing that each spectrometer can include N×M colors, each filter can include one or more sets of nanowires, and beneath each set of nanowires there can be at least one photodetector, in accordance with some embodiments.

FIG. 22 is a diagram showing that each spectrometer can include N×M colors, each filter can include one or more sets of nanowires, and beneath each set of nanowires there can be at least one photodetector (e.g., CMOS photodiode), in accordance with some embodiments. As the number of photodetectors per optical filter increases, each photodetector for that optical filter can detect the same color (e.g., have the same spectral response).

Figure 23:
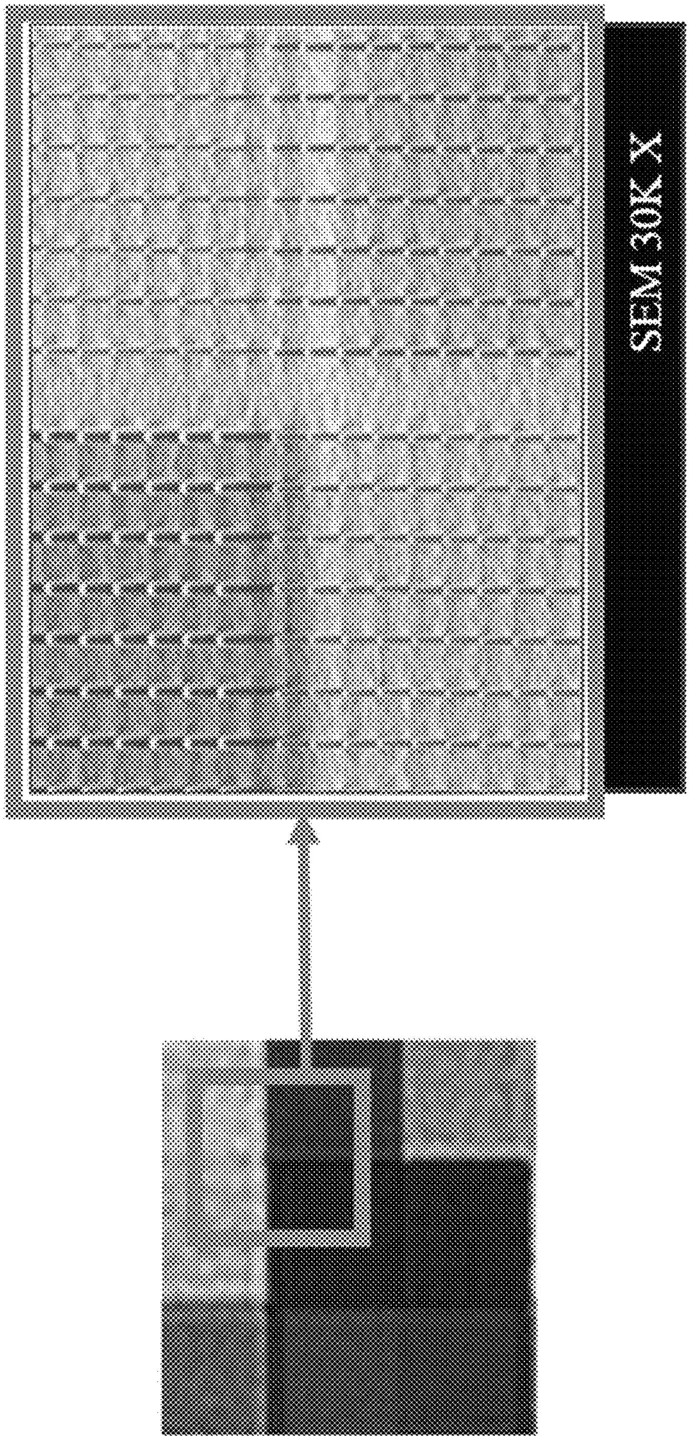
FIG. 23 includes a color reflection image of a plurality of nanowire filters, and an SEM image showing a partial view of four sets of nanowire filters, each set arranged in a square array or lattice, in accordance with some embodiments.

FIG. 23 includes a color reflection image of a plurality of nanowire filters, and an SEM image showing a partial view of four sets of nanowire filters, each set arranged in a square array or lattice, in accordance with some embodiments. As shown, the nanowires can have the same nanowire length and different diameters. In FIG. 23, under each set of nanowires there can be, for example, 9 CMOS photodiodes.

In an example application, the multispectral sensor of the present disclosure can, in accordance with some embodiments, be fabricated on top of photodetectors (e.g., CMOS photodiodes) in a smartphone camera (as shown and described in FIG. 2). The multispectral sensor can have, for example, at least one spectrometer composed of 9 optical filters and 9 pixels (where N=M=3), at least one pixel per optical filter. In some implementations, many such spectrometers can define the multispectral sensor. For example, a 12 MP multispectral sensor can contain about 1.3 million such spectrometers, enabling/accommodating both high-resolution spectral imaging and spectral analysis. By integrating with devices like smartphone cameras, the multispectral sensor can add chemical sensing capabilities to ordinary imaging.

Figure 24A:
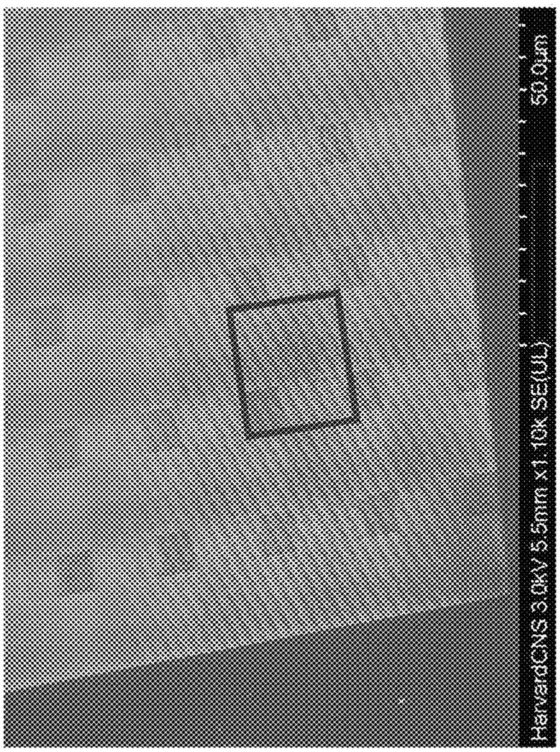
FIG. 24A shows an electron microscopy image of a plurality of antennas with N×M=3 pixels per spectrometer, in accordance with some embodiments.
Figure 24B:
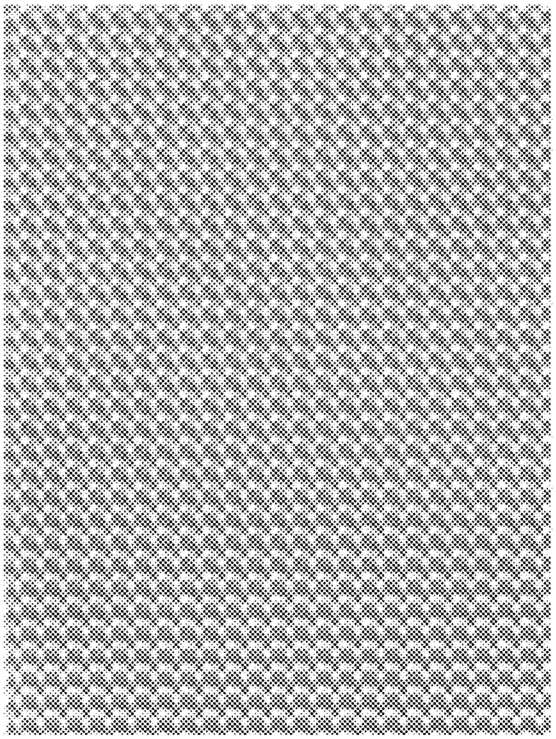
FIG. 24B shows a reflection image of the device of FIG. 24A, with nine different colors represented.

FIG. 24A shows an electron microscopy image of a plurality of antennas with N=M=3 pixels per spectrometer, in accordance with some embodiments. A single spectrometer is outlined by a square overlayed near the center of the electron microscopy image. The electron microscopy image shows many such spectrometers repeated across a grid, which can make up a multispectral sensor. The multispectral sensor can be fabricated or otherwise joined on top of a CMOS sensor. FIG. 24B shows a reflection image of the device of FIG. 24A, with nine different colors represented. As shown, the colors can be repeated across the extent of the multispectral sensor.

Figure 25A:
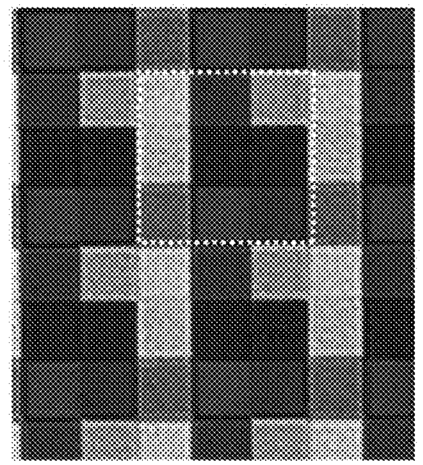
FIG. 25A is a reflection image including an annotated 3×3 spectrometer, in accordance with some embodiments.

FIG. 25A is a reflection image including an annotated 3×3 spectrometer, in accordance with some embodiments. The annotated 3×3 spectrometer is an example device that includes nanowires of different diameters (as indicated in the reflection image by the different shades/colors), of same pitch and of same nanowire length.

Figure 25B:
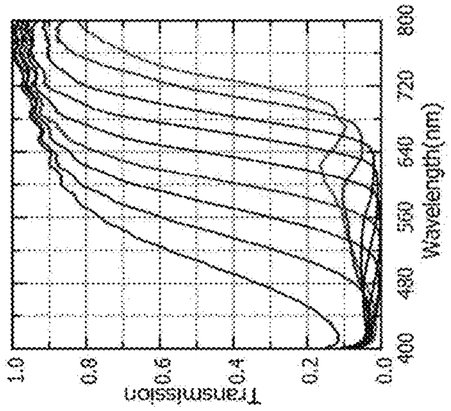
FIG. 25B is a plot of transmission versus wavelength, showing how each antenna or spectrometer functions as a long-pass optical filter, in accordance with some embodiments.

In transmission, the antennas can function as long-pass optical filters. FIG. 25B is a plot of transmission versus wavelength, showing how each antenna or spectrometer functions as a long-pass optical filter, in accordance with some embodiments. FIG. 25B can be an example of a typical measured spectra, showing transmission $T(\lambda)$ against wavelength $\lambda$. The photodiode beneath each antenna or spectrometer collects the transmission $T(\lambda)$ light. Each curve in the plot can represent a transmission curve of a particular optical filter in a spectrometer, which collectively define the spectral resolution of the spectrometer.

Figure 25C:
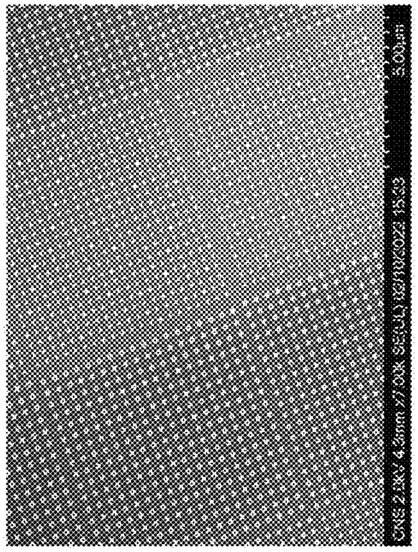
FIG. 25C is a partial view SEM image of the device associated with FIGS. 25A-25B.

FIG. 25C is a partial view SEM image of the device associated with FIGS. 25A-25B. The SEM image includes different antennas, each antenna for a different color/spectral response. The optical filters can be visually distinguished by the varying geometries of their component nanowires. The example optical filters are "closely packed".

As discussed above, the nanowires are elements that compose the optical filter. All nanowires in an optical filter can be positioned on top of at least one photodiode. Light can propagate along the long axis of the nanowire, which can be vertical with respect to the surface common to the nanowires in that optical filter (or other optical filters). In implementations that support detection for visible light, for example, the shape of each nanowire in an optical filter can be cylindrical, and the nanowires of different optical filters can be distinguished by different diameters that cover at least a portion of the visible spectrum. In some such implementations, the nanowire diameter can be between about 50 nm and about 130 nm. In some such implementations, the nanowire length can be between about 0.5 microns and about 7 microns. In some such implementations, the spacing/distances between nanowires of different optical filters (also referred to herein as the lattice pitch) can be constant ("the same"). In some such implementations, the spacing/distances between nanowires of different optical filters can vary, between about 200 nm and about 300 nm. For example, one optical filter of a multispectral sensor can have a nanowire spacing of about 200 nm, a second optical filter with a nanowire spacing of about 225 nm, a third optical filter with a nanowire spacing of about 250 nm, a fourth optical filter with a nanowire spacing of about 275 nm, and so on. As discussed above, the semiconductor material for a visible spectrum band can be and/or include Si, a-Si, Ge, a-Ge, or an alloy including Si or a-Si and Ge or a-Ge (e.g., aSi-aGe, Si—Ge, aSi-Ge, Si-aGe, etc.).

In implementations that support detection for light in the MWIR, the shape of each nanowire in an optical filter can be cylindrical or conical, and the nanowires of different optical filters can be distinguished by different diameters that cover at least a portion of the MWIR spectrum. In some such implementations, the nanowire diameter can be between about 300 nm and about 1500 nm. In some such implementations, the nanowire length can be between about 5 microns and 8 microns. In some such implementations, the lattice pitch of different optical filters can be constant ("the same"). In some such implementations, the spacing/distances between nanowires of different optical filters can vary, between about 1 micron and about 4 microns. As discussed above, the semiconductor material for a NIR spectral band or a MWIR spectral band can be and/or include InSb, InAs, an alloy including InSb (e.g., InSb—As, etc.), or an alloy including InAs. The nanowires of a lattice can be arranged randomly, in a square, in a hexagon, and/or the like. Hexagonal may be preferred in some instances. Hexagonal arrays can create close-packed structure(s) that can take up/occupy less space, and can increase the number of antennas, as well as ensure good coupling when desired.

As used herein, the aspect ratio of the nanowire lattice can be the ratio of the nanowire length to the nanowire diameter. Some example parameters are given in table 2 below.

| Diameter (nm) | Length (nm) | Aspect Ratio | Pitch (nm) |
|---|---|---|---|
| 50 | 2000 | 40 | 100 to 250 nm |
| 80 | 2000 | 25 | 150 to 250 nm |
| 100 | 2000 | 20 | 200 to 300 nm |
| 130 | 2000 | 15 | 200 to 300 nm |

Figure 26:
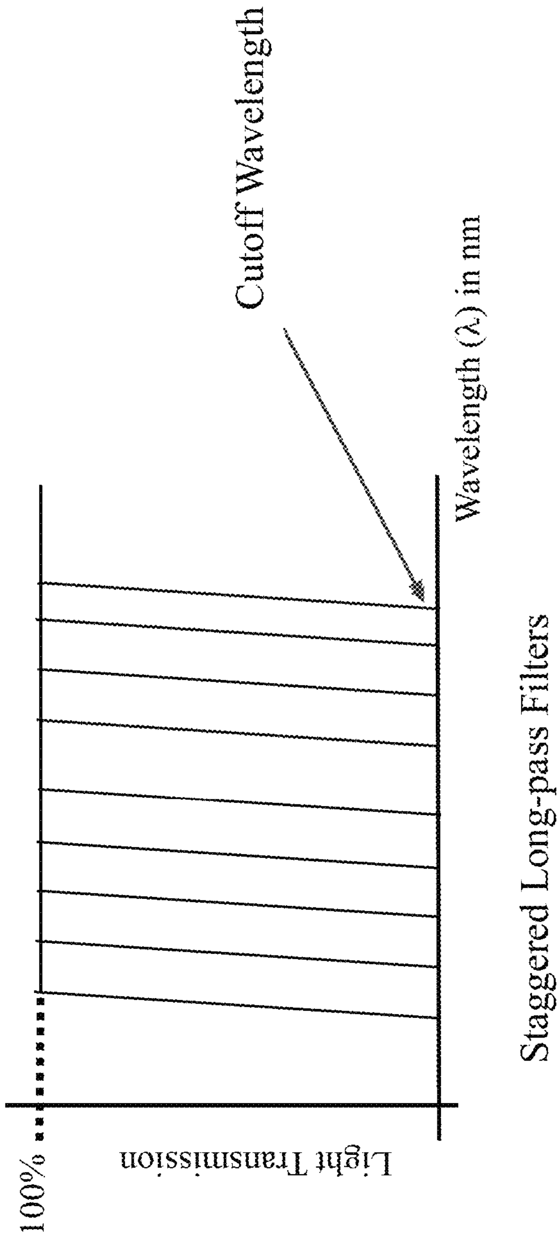
FIG. 26 is a plot showing how multiple long-pass filters with different cutoff wavelengths can be combined to partition a light spectrum of interest, in accordance with some embodiments.

As discussed above, in a filtering system with tightly coupled nanowires, the optical filter can act as a long-pass device, with a cutoff wavelength defined by the geometric properties of the nanowires in that optical filter. In implementations that include cylindrical nanowires, for example, the diameter can define the spectral response including the cutoff wavelength. For long-pass filtering, the light below (e.g., with wavelengths less than) the cutoff wavelength is reflected, and the light above (e.g., with wavelengths greater than) the cutoff wavelength is transmitted. The cutoff wavelength can scale with the diameter. For example, an optical filter with small nanowire diameters (e.g., about 50 nm) can have a low cutoff wavelength relative to the range of wavelengths in the larger spectral band associated with the semiconductor material for that optical filter. By combining multiple long-pass filters of different cutoff wavelengths, the multispectral sensor can effectively partition a target spectrum. FIG. 26 is a plot showing how multiple long-pass filters with different cutoff wavelengths can be combined to partition a light spectrum of interest, in accordance with some embodiments.

In sum of the above discussion, as used herein, an area spectrometer can have a number of N×M optical filters, wherein each optical filter can have at least one photodetector. As used herein, a multispectral sensor can have one or several spectrometers. One or multiple of such spectrometers can be integrated with a single image sensor such as the CMOS sensor chip, making up the multispectral sensor. As used herein, an optical filter can function as an antenna.

As used herein, each optical filter can be made of a particular semiconductor material (or composition). This material can vary from one filter to another on the same chip. An optical filter is implemented as an array of vertical semiconductor nanowires, creating an optical nano-antenna array/lattice. Different nanowires of different geometry can be used to create different antennas, and each group can define a particular optical filter. The nanowires of each antenna/optical filter have geometrical parameters, such as diameter, length, and spacing, which can define the performance of the optical filter. These nanowires can be arranged with various spacing patterns (e.g., square grid, rectangular grid, hexagonal lattice, or even random) to form the optical filter. All nanowires within one optical filter are the "same" (same geometry/material) to target one wavelength or narrow band of wavelengths. Different filters use different nanowire parameters for other wavelengths. Each optical filter can be fabricated on top of or otherwise joined to a photodetector (e.g., a CMOS photodiode). Each optical filter can be in effect a monochromatic channel, transmitting a particular wavelength (or narrow band of wavelengths) to its photodiode(s).

Table 2 below is a summary of example parameters and performance.

| Parameter | Examples/Values | Impact on Performance |
|---|---|---|
| Optical Filter Material | Si or a-Si (visible-NIR), Si—Ge alloy (extended NIR), Ge (NIR), InSb or InAs (MWIR) | Defines operational spectral range. Also affects refractive index contrast and thus filter effectiveness. Alloy composition tunes refractive index/bandgap for fine adjustments. |
| Nanowire diameter (d) | About 30 nm (UV), 50-130 nm (visible), larger than 130 e.g. about 300 nm (NIR/IR) | Defines resonant/cutoff wavelength of the optical filter. Smaller diameter, shorted wavelength. A change in diameter shifts the passband. |
| Nanowire length (l) | About 500 to about 2,500 nm (visible), about 3 to 7 microns (IR) | Increasing nanowire length improves light absorption up to a point, primarily due to better light trapping and extended interaction length. Must maintain aspect ratio feasible by fabrication. |
| Array/lattice pitch (p) | About 150 to about 900 nm for nanowires with diameter of 70 nm. Pitch can be different with different diameters (e.g., small pitch for small diameter). | Defines coupling between nanowires in an optical filter. Smaller pitch (close spacing) causes more collective filtering effect and long pass filtering. Larger pitch can cause nanowires to act more independently (behavior approaches single-wire resonance). |
| Array pattern | Square, hexagonal, or random arrangement. | A hexagonal lattice can provide more rotational symmetry. Random arrangements can broaden the bandwidth (less coherent coupling). |
| Nanowire shape | Cylindrical, cross, square rod, ellipsoidal (e.g., for polarization filtering), etc. | Different shapes can support different modes (e.g., cross-shaped can create multiple passbands). Shape choice can also ease fabrication (circular holes vs. square holes). All |

-continued

| Parameter | Examples/Values | Impact on Performance |
|---|---|---|
| | | shapes with subwavelength features can function as filters. |
| Filters per spectrometer (N × M) | 2 × 2, 3 × 3 (9 filters), 4 × 4, 5 × 5, and/or the like. | More optical filters can increase the spectral resolution by providing more wavelength channels, but uses more pixels per spectrometer, which can reduce the spatial resolution for a fixed area. |
| Spectral resolution | Dependent on the number of N × M optical filters. For example, about 20 nm with N × M = 3 × 3 filters, about 10 nm with N × M = 4 × 4 filters or 5 × 5 filters, etc. Spectral resolution can, in some instances, be improved at the expense of spatial resolution.. | The smallest distinguishable wavelength difference. Determined by the number of filters and their overlap. For example, 20 nm resolution in visible means that the device can differentiate colors 20 nm apart. |
| Spectral range | UV (about 250 nm) to NIR (about 1000 nm) with a Si based material; up to 6 microns with a InSb based material; and can be extended further with appropriate materials. | Range of wavelengths the multispectral sensor can cover by combining different optical filters. Using multiple materials on one multispectral sensor can broaden the spectral range (e.g., some filters of a-Si for visible, some of InSb for IR, etc.). |

In some implementations, a multispectral sensor can have a large number of spectrometers, each providing spectral information on a unique spot of a scene. Different lens systems can be used (e.g., wide-angle lens, telephoto lens, macro lens, and zoom lenses) to add clarity to the observed items in a scene. In some implementations, the multispectral sensor can be joined to (e.g., mounted on, affixed to, etc.) a microscope or a telescope, and using such optical elements can have specific applications suitable for examining very small objects or large objects such as planetary objects, for example. Such lens system can enable the multispectral sensor to obtain better/higher quality information about a scene. When considering all the spectrometers, a scene can be viewed at a single wavelength or a narrow band of wavelengths. By generating a representation (e.g., an electronic digital file) for every wavelength, the multispectral sensor can generate a set of several channels. Each channel can be stored and displayed as a separate representation (e.g., a grayscale image file). These channels can be used for analyzing the chemical content of the objects included within the scene.

Figure 27:
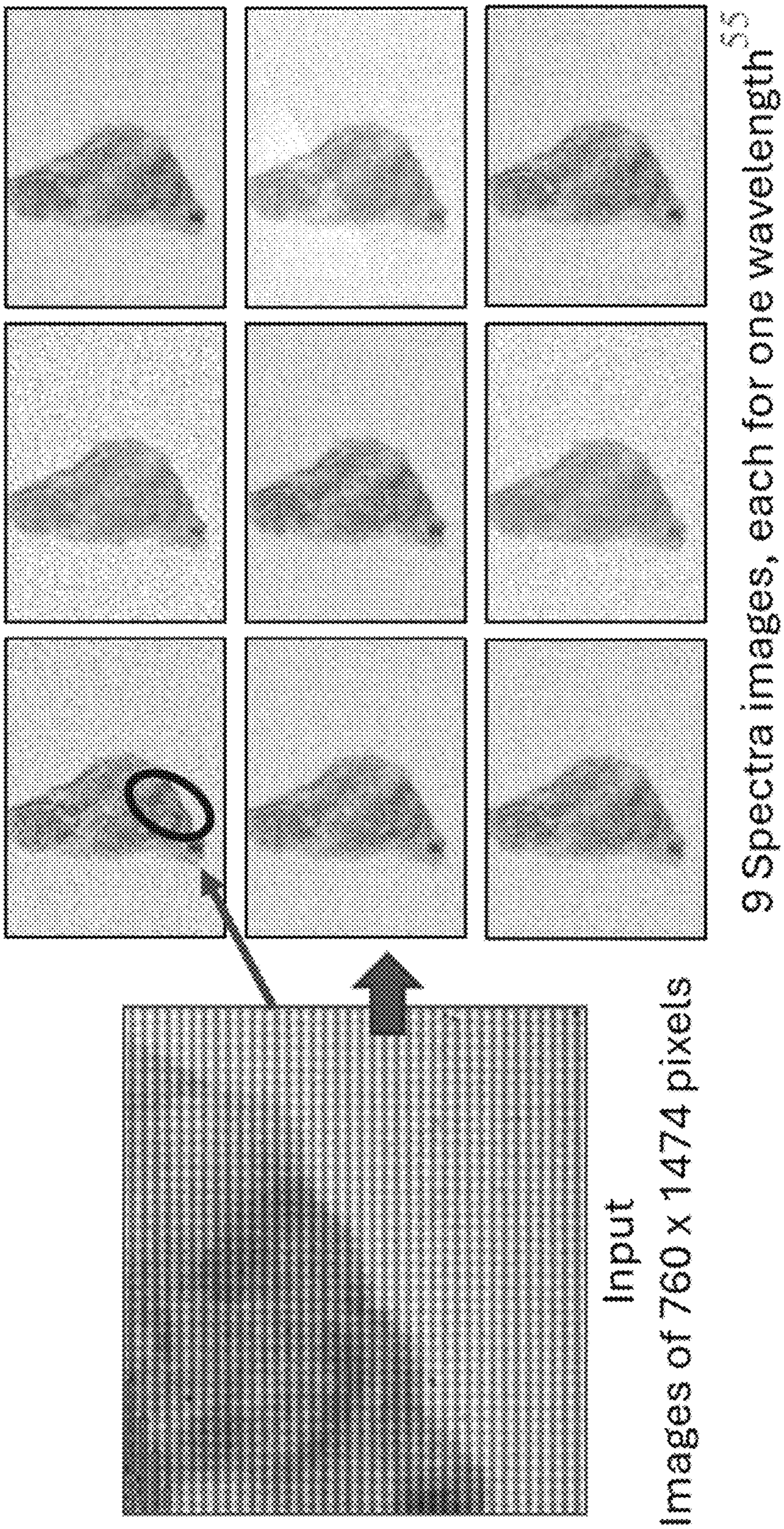
FIG. 27 includes images of a rock taken using nine different filters, each of the nine channels representing a different wavelength, in accordance with some embodiments.

FIG. 27 includes images of a rock taken using nine different filters, each of the nine channels representing a different wavelength, in accordance with some embodiments. The images can be a representation of a spectral signature of the rock (or other objects, not shown in FIG. 27), which the multispectral sensor can generate based on signals received at the photodetectors. The 9 channels, representing 9 different wavelengths, can be stored in memory of an example compute device (not shown) as data of any suitable structure (e.g., text, images, videos, etc.). The images shown in FIG. 27 are example grayscale image files.

Figure 28A:
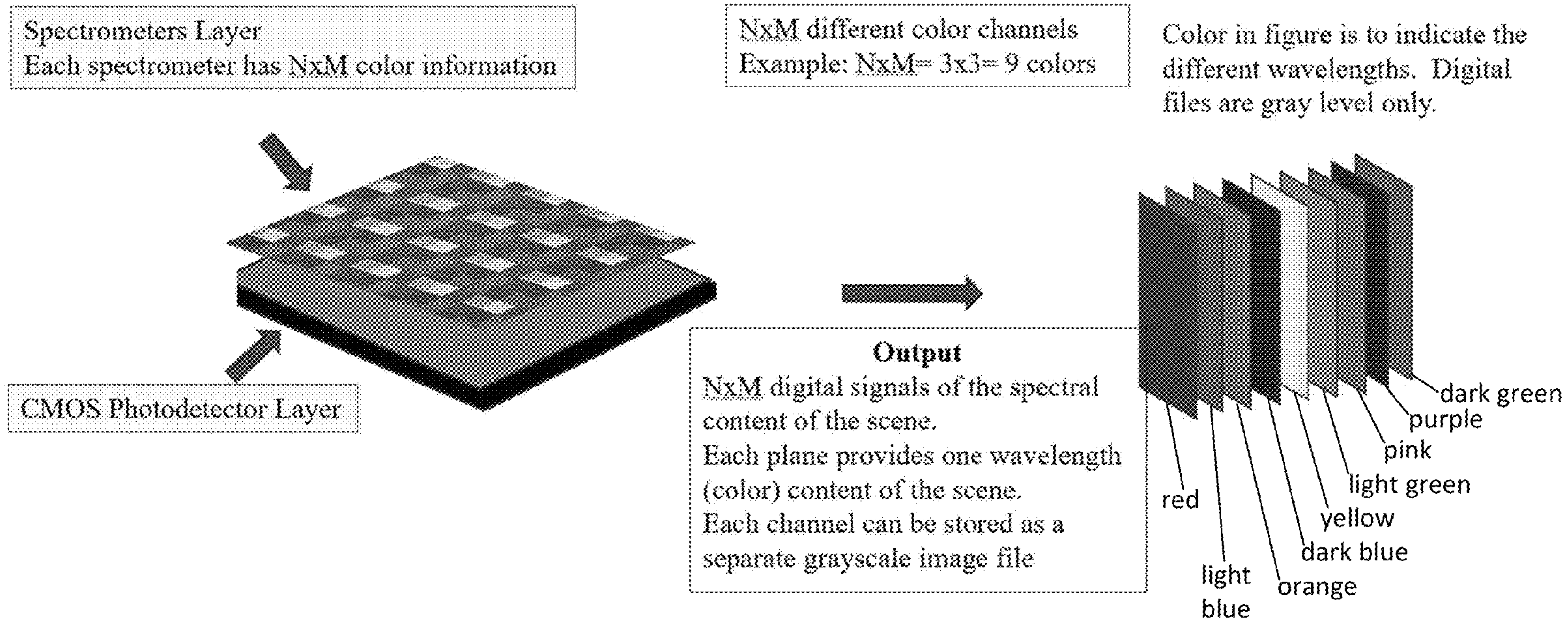
FIGS. 28A-28B are diagrams showing that data for each spectral/color channel can be stored in a separate grayscale image file, and that the spectral channel data can be combined via software to produce normal color images (red, green, blue—"RGB") or high dynamic range images and to analyze them for spectral information, in accordance with some embodiments.
Figure 28B:
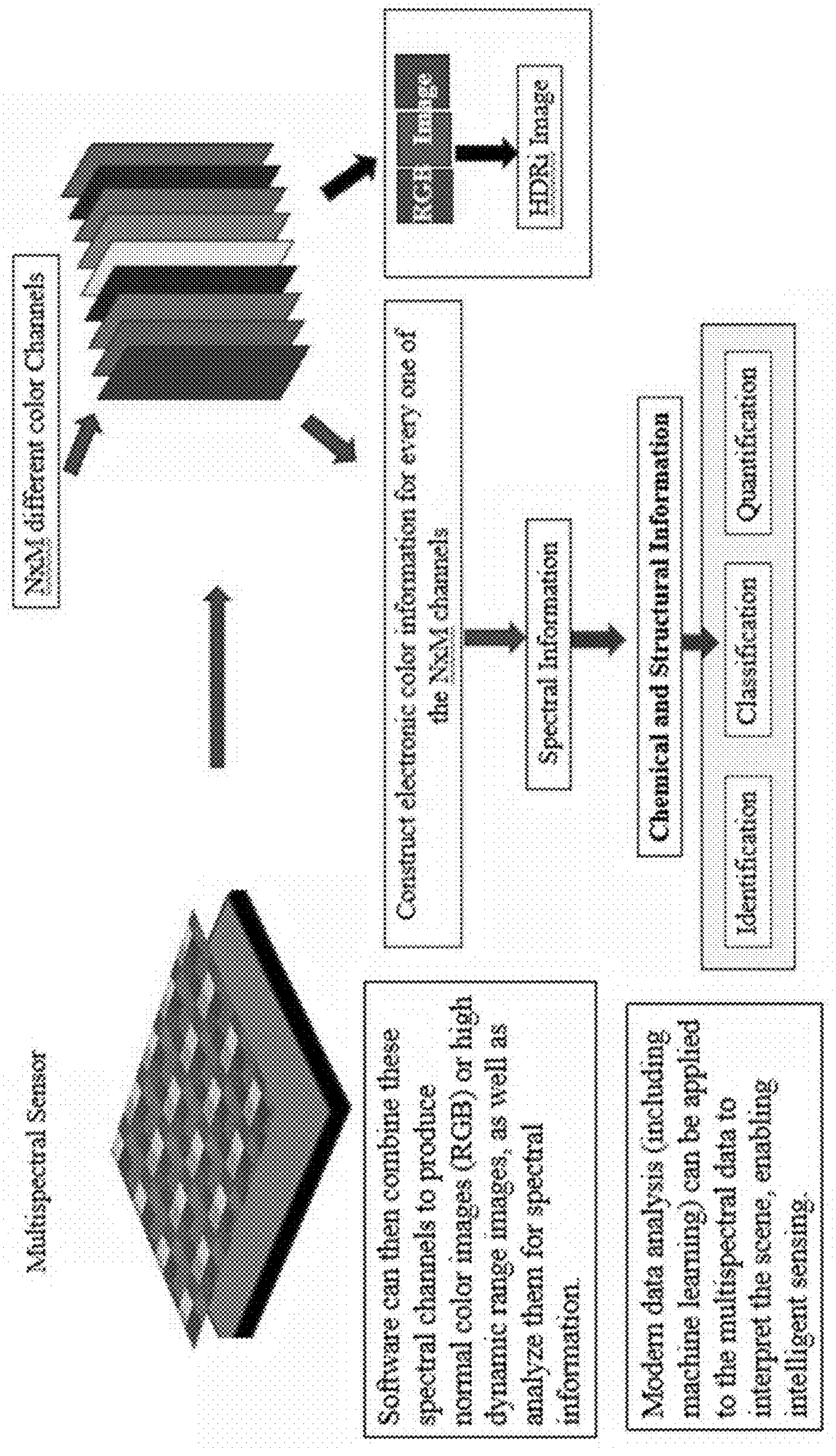

FIGS. 28A-28B are diagrams showing that data for each spectral/color channel can be stored in a separate grayscale image file, and that the spectral channel data can be combined via software to produce normal color images (red, green, blue—"RGB") or high dynamic range images ("HDRi") and to analyze them for spectral information, in accordance with some embodiments. FIGS. 28A-28B include a multispectral sensor with a spectrometer layer and an image sensor layer (e.g., CMOS photodetector layer). The multispectral sensor can generate as output N×M digital signals, one for each optical filter of the N×M optical filters, and each of which can represent a spectral channel. Collectively, the spectral channel data can encapsulate spectral information about a scene. Software (e.g., stored in memory as a set of instructions or code) can cause a processor of an example compute device (not shown) to analyze the spectral channel data to determine chemical and structural information about a scene. The spectral channel data (e.g., images, etc.) can be input to a machine learning model (e.g., a neural network, etc.) to train the machine learning model to obtain as output insights about a scene, such as, for example, identification, classification, quantification or an object in the scene.

Figure 29:
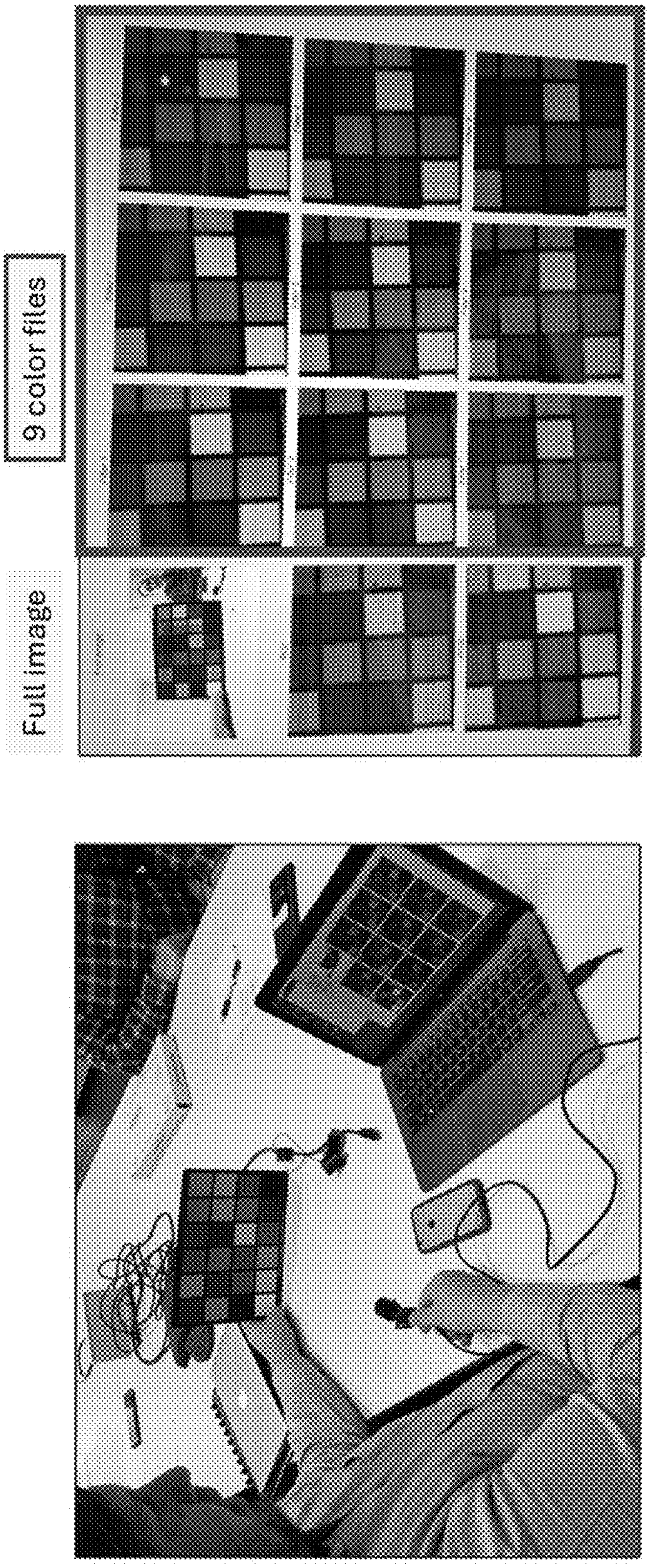
FIG. 29 shows an example of a computer screen showing different images for nine color filters, including a region of interest (ROI) and a reconstructed RGB color image, in accordance with some embodiments.

FIG. 29 shows an example of a computer screen showing different images for nine color filters, including a region of interest (ROI) and a reconstructed RGB color image, in accordance with some embodiments. Signals representing multispectral information from a multispectral sensor (e.g., a multispectral sensor with many spectrometers, each with 3×3 optical filters) can be input to software. The 9 different (spectral) images, one for each different optical filter, can be example outputs from software. The 9 different images can represent intensity at certain spectral bands. In some implementations, software can selectively combine spectral channels to generate HDRi images.

The multispectral sensor can generate signals representing spectral information, which software can analyze to produce spectral information about a scene. As used herein, the multispectral sensor and software can be understood as being components of a multispectral imaging system. The rich data from multispectral imaging can enable, for example, real-time (e.g., without a perceivable delay relative to capturing an image) descriptive analysis (e.g., via images) and predictive analysis (e.g., via predictive models) for various applications, which can inform prescriptive analysis (e.g., decision-making). In other words, prescriptive information can include, as a subset thereof, predictive information, and predictive information, in turn, can include, as a subset thereof, descriptive information.

There are various applications for a multispectral imaging system that can capture multispectral information from a scene, such as chemical analysis of solids and/or liquids. In mining, for example, different mineral compositions reflect light differently. One challenge that remains in the field of mining is determining gold content in rocks. A multispectral camera in the present disclosure can distinguish, for example, high-grade ore from waste rock by their spectral signatures. The multispectral camera can generate images of rocks with various compositions (e.g., appearing white, green, gray, purple to the eye), where each image can represent spectral information associated with composition of that rock. The multispectral camera can thereby be used to determine which among the rocks contain, for example, higher gold content, or other such materials. For example, software can produce prescriptive information about the rocks (e.g., the rocks of FIG. 27), such as a classification. The multispectral imaging system can perform classification among the rocks, such as a binary classification between two categories of rock. For example, the multispectral imaging system can distinguish two rocks into a high grade category or wall rock category (e.g., with 100% accuracy), a medium grade vs wall rock (e.g., with 90% accuracy), a low grade rock vs wall rock (e.g., with 80% accuracy), and/or the like. As used herein, a wall rock is understood to mean an ordinary rock found in a mine, which can function as a baseline.

Figure 30B:
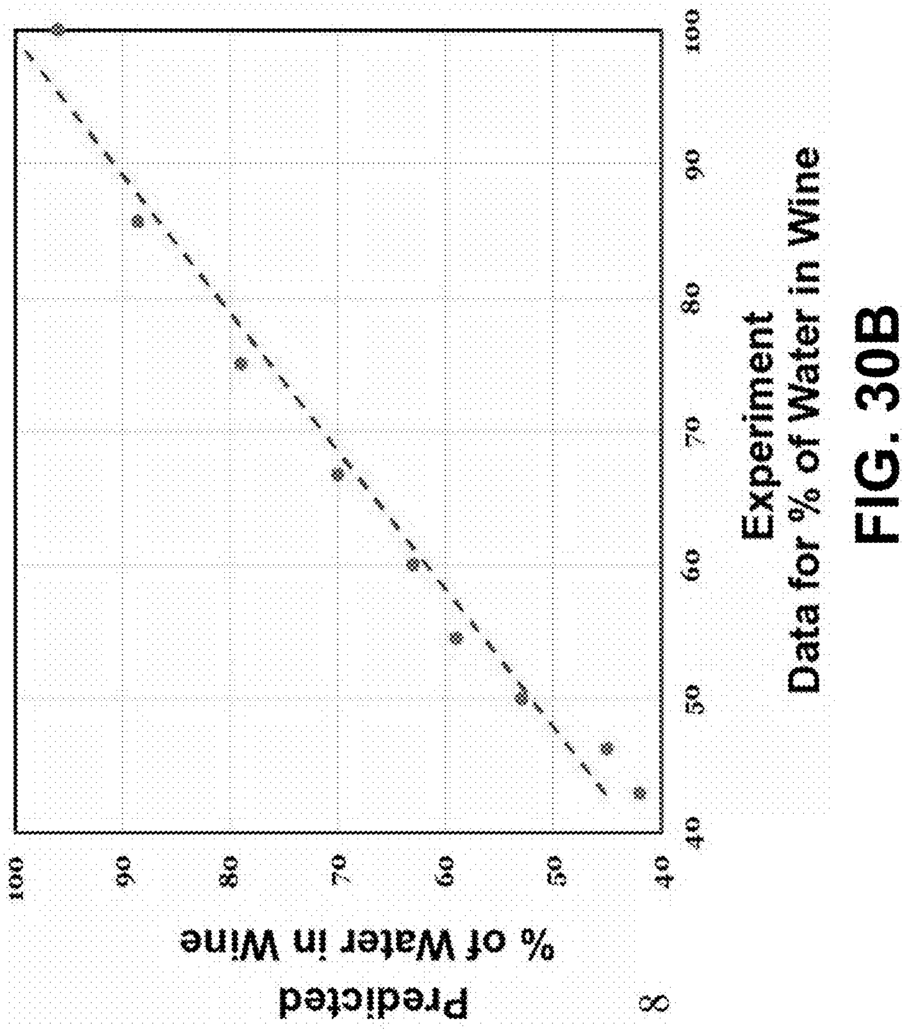
FIG. 30B is a plot of predicted percentage of water in wine versus experimental data for percentage of water in wine, in accordance with some embodiments.
Figure 30A:
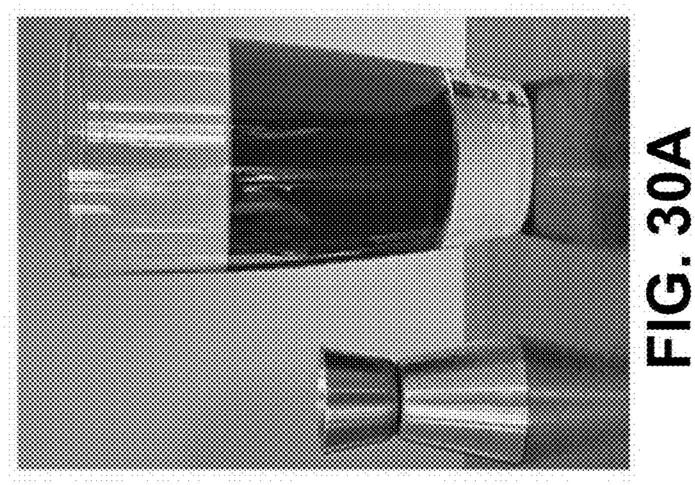
FIG. 30A is a photograph of an example sample of wine diluted with water.

The multispectral imaging system can produce prescriptive information for liquids captured by a multispectral camera. In enology, for example, challenges remain to quantify contaminants in wine such as trifluoroacetic acid (TFA), trichloroanisole (TCA), mycotoxins, and/or the like. FIG. 30A is a photograph of an example sample of wine diluted with water, and FIG. 30B is a plot of predicted percentage of water in wine versus experimental data for percentage of water in wine, in accordance with some embodiments. The multispectral imaging system can quantify the amount of water (or other liquids) in the example sample of wine.

Figure 31:
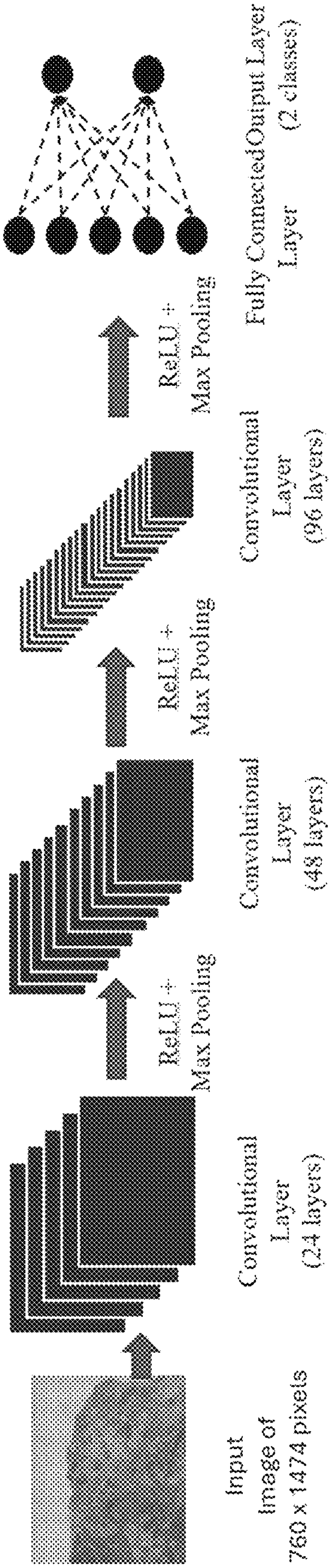
FIG. 31 is a flow diagram representing an example methodology for using a convolutional neural network to classify an input image, in accordance with some embodiments.

FIG. 31 is a flow diagram representing an example methodology for using a convolutional neural network (CNN) to classify an input image, in accordance with some embodiments. The CNN can be trained over a number of training periods ("epochs") using optimization algorithms such as, for example, stochastic gradient descent with momentum (SGDM) algorithm. In some implementations, the initial learn rate can be 0.01. In some implementations, the number of epochs can be 50. In some implementations, the training data can be randomly rearranged (shuffled) at the beginning of every epoch, which can reduce overfitting.

Figure 32A:
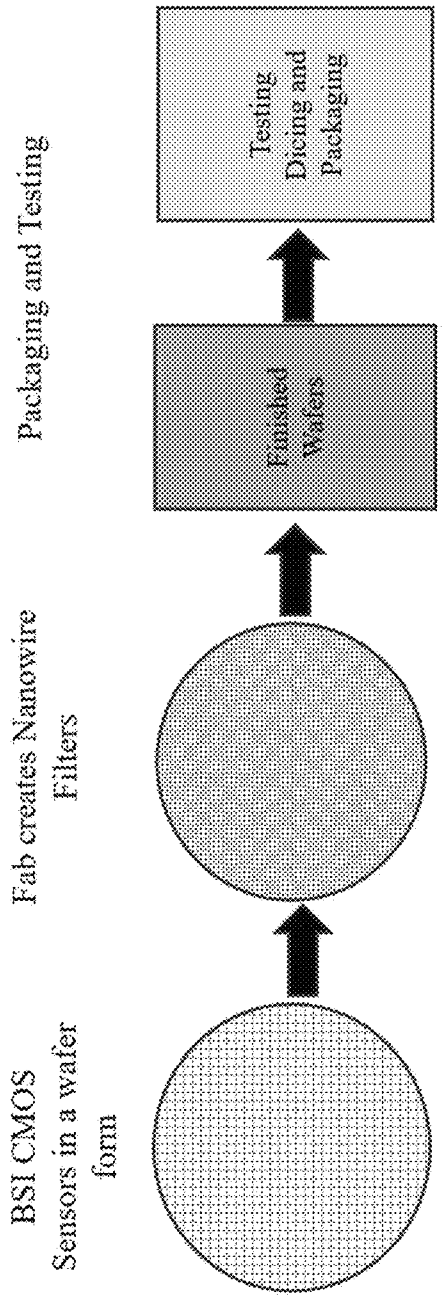
FIG. 32A is a diagram showing an overview of steps for manufacturing multispectral sensors described herein, in accordance with some embodiments.

The multispectral sensor can be fabricated and manufactured using various methods, which are described in further detail herein. FIG. 32A is a diagram showing an overview of steps for manufacturing multispectral sensors described herein, in accordance with some embodiments. A "carrier" semiconductor wafer (e.g., a 6", 8", or 12" silicon wafer) patterned with CMOS image sensors (and other electronic layers, not shown) can be pre-existing (e.g. pre-manufactured) relative to the fabrication of the nanowire optical filters disclosed herein. In some implementations, the CMOS image sensors can be and/or include backside-illumination (BSI) sensors, which can improve light sensitivity and increase readout speed. In a first example manufacturing method, the nanowire optical filters can be fabricated on top of the semiconductor wafer with CMOS image sensors. In a second example manufacturing method, the nanowire optical filters can be fabricated on a separate optically transparent substrate (e.g., transparent in the wavelength region of interest) and then aligned with and joined to the semiconductor wafer, for example as a post-processing step in the CMOS image sensor manufacturing flow. The optically transparent substrate can be, for example, glass when the wavelength region of interest is in the MWIR, or, for example, silicon when the wavelength region of interest is above 1100 nm. In both example methods, each optical filter can be positioned on top of one or more photodiode in the CMOS image sensor layer. In both example methods, the wafers can be diced and packaged into camera modules according to known techniques used for known image sensors.

The first example manufacturing method is an integrated approach, which may be of lower cost and fewer alignment issues. All steps included in the first example manufacturing method can be carefully executed to preserve the integrity of the pre-manufactured CMOS structure. A semiconductor material (e.g., a-Si, etc.) defining a semiconductor layer can be deposited onto the pre-fabricated CMOS sensor using, for example, low temperature PECVD (Plasma Enhanced Chemical Vapor Deposition). This chemical vapor deposition process transforms gases into solid thin films on a substrate. It is a low-temperature process that can be implemented to not impact/damage the photodiode or any other electronic layers within the CMOS wafer.

The fabrication process can begin with spin-coating photoresist and using UV lithography to pattern the semiconductor (e.g., a-Si, etc.) layer, which forms the nano-antenna array. The lithography can define the dimensions and pattern of the nanowire array at the desired location. The optical filter (nanowire array) can be positioned directly above at least one photodiode. Each optical filter can include a specific nanowire array with particular diameter and spacing. All nanowires can have the same nanowire length. The thickness of the semiconductor layer can determine this nanowire length and can correspond to the thickness of the optical filters. In the first example method (the integrated approach), alignment can be inherently achieved by lithography on the CMOS wafer such that optical filters are over each pixel.

The second example manufacturing method can include a two-step fabrication process. The second example manufacturing method can be useful for example when the optical filter fabrication includes steps that are incompatible with the sensor wafer or any other devices that have the camera structure. An extra bonding step can join the two wafers once they are aligned. This can be similar to placing a protective, passive transparent wafer on a standard CMOS imaging wafer. In the second example method, the nanowires can be transferred from a transparent substrate. For UV-visible light applications, the transparent substrate can be, for example, glass. In the range of 1.5 to 6 μm, silicon can be used as the substrate, since it is transparent within this wavelength range (with an energy gap equivalent to 1 μm). The nanowire filters can be fabricated on the transparent substrate of a material that does not interfere with light transmission of the light at the desired wavelength. The transparent wafer can be integrated into the sensor wafer, making this approach useful when direct fabrication on the sensor wafer is challenging. In both methods, known semiconductor fabrication processes and instruments can be used.

In some embodiments, the optically transparent carrier wafer with the nanowire lattice and the sensor wafer with the image sensors can be aligned according to the following example procedure. The goal is to match the CMOS photodetectors with the particular nanowire antennas/optical filters and later create permanent bonding between the two wafers. Alignment marks can provide reference points visible through both materials. There are several types of markers like crosses, verniers, box-in-box patterns, etc. These are typically fabricated using lithography and etching. Alignment can be achieved using optical alignment systems, which use components like infrared microscopes or cameras (e.g., as silicon is transparent to IR), precision stages (e.g., having multi-axes defined by X, Y, Z, and/or theta) for fine movement and software to detect and align marks automatically. The IR alignment process can include placing the optically transparent carrier wafer on top of the image sensor wafer. A light source can shine IR light from below the image sensor wafer. An operator (e.g., a user, software) can view through the top of the optically transparent carrier wafer using IR-sensitive optics or camera and can adjust wafer positions using motorized stages until the alignment marks align. A similar process is sometimes used when aligning RGB color filters and microlenses on top of the image sensor wafer.

Figure 32B:
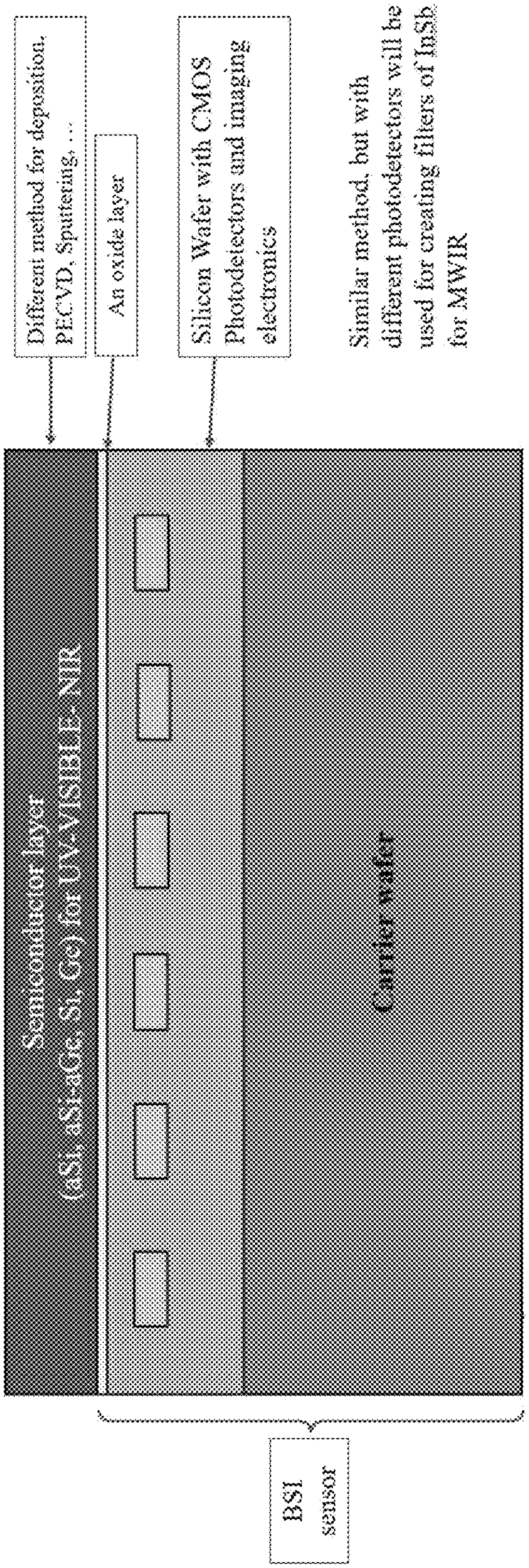
FIG. 32B is a diagram showing an example process for producing nanowire filters, in accordance with some embodiments.

FIG. 32B is a diagram showing an example process for producing nanowire filters, in accordance with some embodiments. The example process can include depositing (e.g., PECVD, sputtering, etc.) a semiconductor layer over an image sensor to produce a first intermediate structure. The image sensor can be, for example, a BSI sensor including a substrate (e.g., Si), CMOS photodetectors and imaging electronics, and an insulating layer such as $SiO_2$ or $Si_3N_4$. The semiconductor layer can be and/or include any of the semiconductor materials described herein, depending on the desired spectrum of the multispectral sensor (e.g., UV, visible, NIR, MWIR, or any combination thereof). The thickness of the semiconductor layer can determine the length of the nanowires, which collectively define the thickness of the optical filter. In this way, each nanowire from each optical filter can have a substantially same nanowire length as the thickness of the semiconductor layer (e.g., within 90%, 95%, 98%, etc.).

Figure 32C:
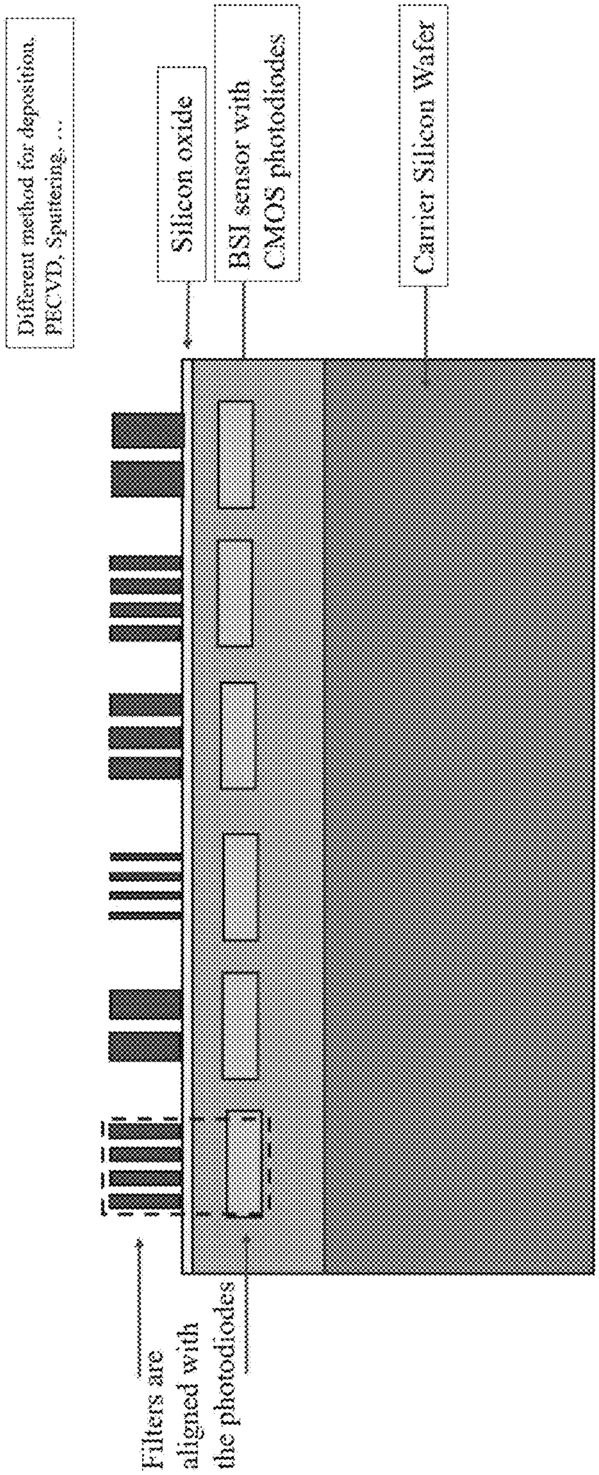
FIG. 32C is a diagram showing an example process for aligning nanowire filters, in accordance with some embodiments.

FIG. 32C is a diagram showing an example process for aligning nanowire filters, in accordance with some embodiments. The position of each pixel in the image sensor is known. As described in further detail herein, the example process can produce nanowire filters that are aligned with the position of each pixel, allowing for optical filtering.

Figure 33A:
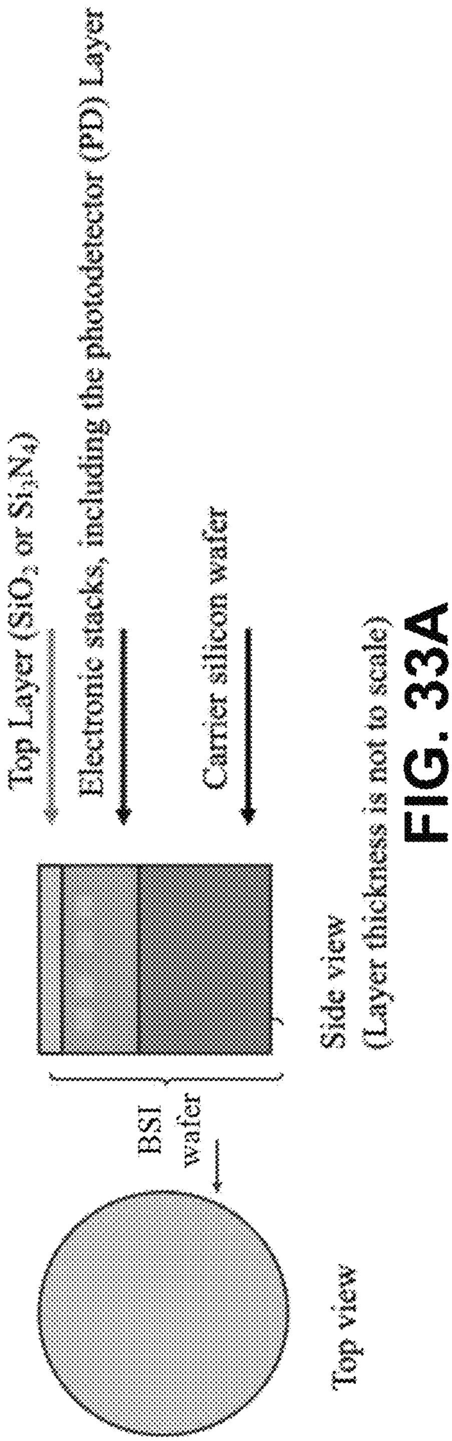
FIG. 33A shows top and side views of an example starting wafer (e.g., a back-side illuminated (BSI) wafer) for producing multispectral sensors described herein, in accordance with some embodiments.

FIG. 33A shows top and side views of an example starting wafer (e.g., a back-side illuminated (BSI) wafer) for producing multispectral sensors described herein, in accordance with some embodiments. The starting wafer can be sourced, for example, from known vendors.

Figure 33B:
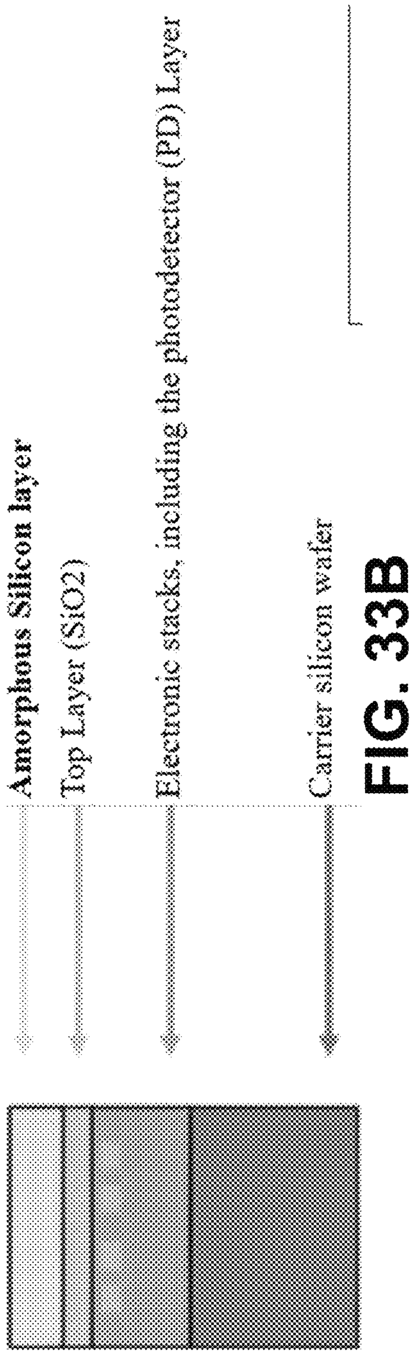
FIG. 33B shows a side view of the starting wafer of FIG. 33A, with a first semiconductor layer (e.g., an amorphous silicon layer) deposited thereon, in accordance with some embodiments.

FIG. 33B shows a side view of the starting wafer of FIG. 33A, with a first semiconductor layer (e.g., an amorphous silicon layer) deposited thereon, in accordance with some embodiments. The first semiconductor layer can be thin (the layer thickness is not to scale in the FIG. 33B). As shown, the example aSi layer can be deposited over the example $SiO_2$ layer. The deposited thin film can be, for example, about 100 to 2500 nm of amorphous silicon (for visible filters) or another semiconductor depending on desired wavelength range. Other examples of possible materials can include a-Si, a-SiGe, Si, Ge for UV-Vis-NIR, or InSb/InAs for MWIR.

Figure 34:
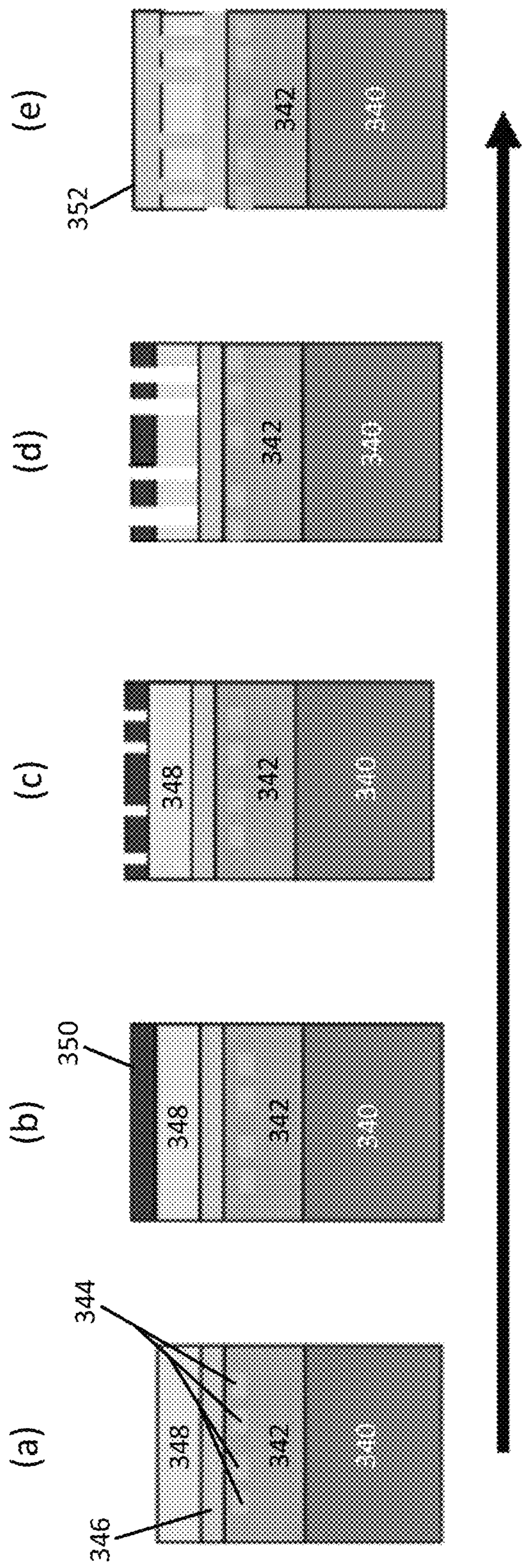
FIG. 34 is a process flow diagram illustrating a first example fabrication method for producing nanowires, in accordance with some embodiments.

FIG. 34 is a process flow diagram illustrating a first example fabrication method for producing nanowires, in accordance with some embodiments. The process flow diagram includes a carrier wafer 340, an electronics layer 342, a photodetector layer 344, a first insulating layer 346, a semiconductor layer 348, a photoresist layer 350, and a second insulating layer 352. The first example fabrication method can include providing the carrier wafer 340 including the electronics layer 342 and photodetector layer 344 (which can collectively define an image sensor layer) and the first insulating layer 346. For example, the carrier wafer 340 and the image sensor layer can be included within a BSI wafer. The first example fabrication method can include depositing the semiconductor layer 348 over the insulating layer 346 to produce a first intermediate structure. For example, the semiconductor layer 348 can be deposited using PECVD, and can have a thickness of about 2 microns. The first example fabrication method can include photolithographically defining a photoresist pattern on the semiconductor layer 348 to produce a second intermediate structure. For example, the photoresist layer 350 can be spin coated over the semiconductor layer 348, exposed using a pre-defined reticle and developed to produce the photoresist pattern, which can function as an etching mask. The first example fabrication method can include anisotropically dry etching the second intermediate structure to produce a nanowire lattice, which is described in further detail herein. The first example fabrication method can include removing the left-over photoresist. The first example fabrication method can optionally include depositing the second insulating layer 352 (e.g., a thin, protective and/or optionally conforming silicon dioxide layer) over the nanowire lattice, which can improve a structural integrity the nanowire lattice. In some implementations, the second insulating layer 352 can have a refractive index less than the refractive index of the nanowire lattice, to facilitate optical coupling as discussed above. In some implementations, the semiconductor layer 348 can be doped with an n-type dopant (e.g., phosphorous, arsenic, antimony, etc.) or a p-type dopant (e.g., boron, aluminum, gallium, indium, etc.).

Figure 35:
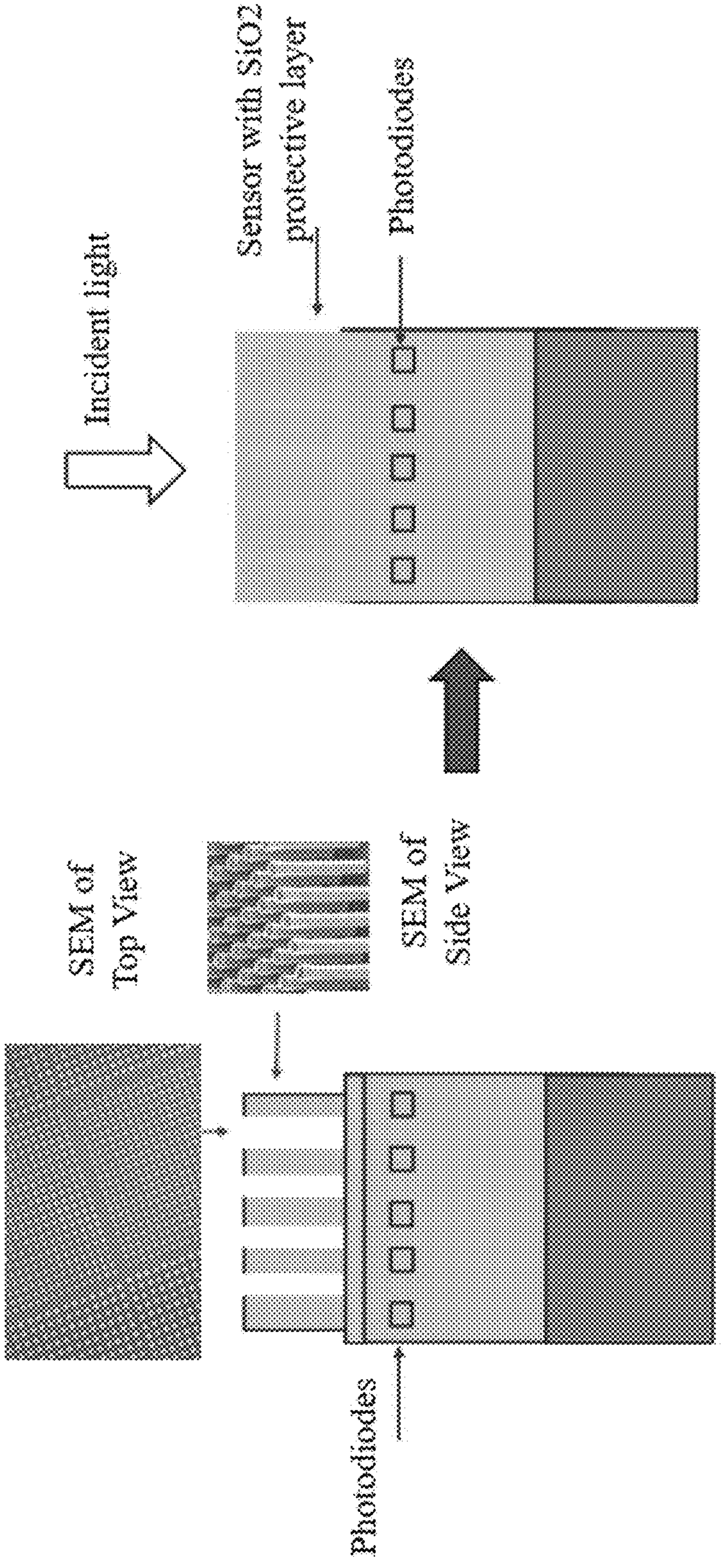
FIG. 35 illustrates example results of the fabrication method of FIG. 34.

FIG. 35 illustrates example results of the fabrication method of FIG. 34. In some implementations, the fabrication node can be 55 nm. Deposition can include, for example, PECVD for depositing the example semiconductor layer (e.g., aSi) and the example second insulating layer (e.g., silicon dioxide). Anisotropically dry etching can include, for example, reactive ion etching (RIE), deep reactive ion etching (DRIE), inductively coupled plasma reactive ion etching (ICP-RIE) for etching the example semiconductor layer. Photolithographically defining the photoresist pattern can include deep ultraviolet (DUV) exposure (e.g., about 193 nm wavelength) via dry DUV systems (e.g., the ASML® TWINSCAN XT:1460K).

In some implementations, anisotropically dry etching through a pattern of photoresist can cause damage to the photoresist layer, which can result in non-uniform nanowires. This can be addressed by creating an etch mask ("hard mask") which can resist the anisotropic dry etching and can survive the ion bombardment. Several materials can be used to create the hard mask, such as aluminum oxide ($Al_2O_3$), chromium (Cr), nickel (Ni), aluminum (Al) and other materials. The thickness of the hard mark can be on the order of, for example, 10 to 60 nm. The hard mask can be deposited by evaporation, sputtering, and/or atomic layer deposition (ALD). ALD can result in uniform and conforming deposition. Non-uniform nanowires can also be addressed by using ICP-RIE, which can be configured to create smooth nanowire surfaces and thereby improve the effectiveness of the optical filter.

Figure 36:
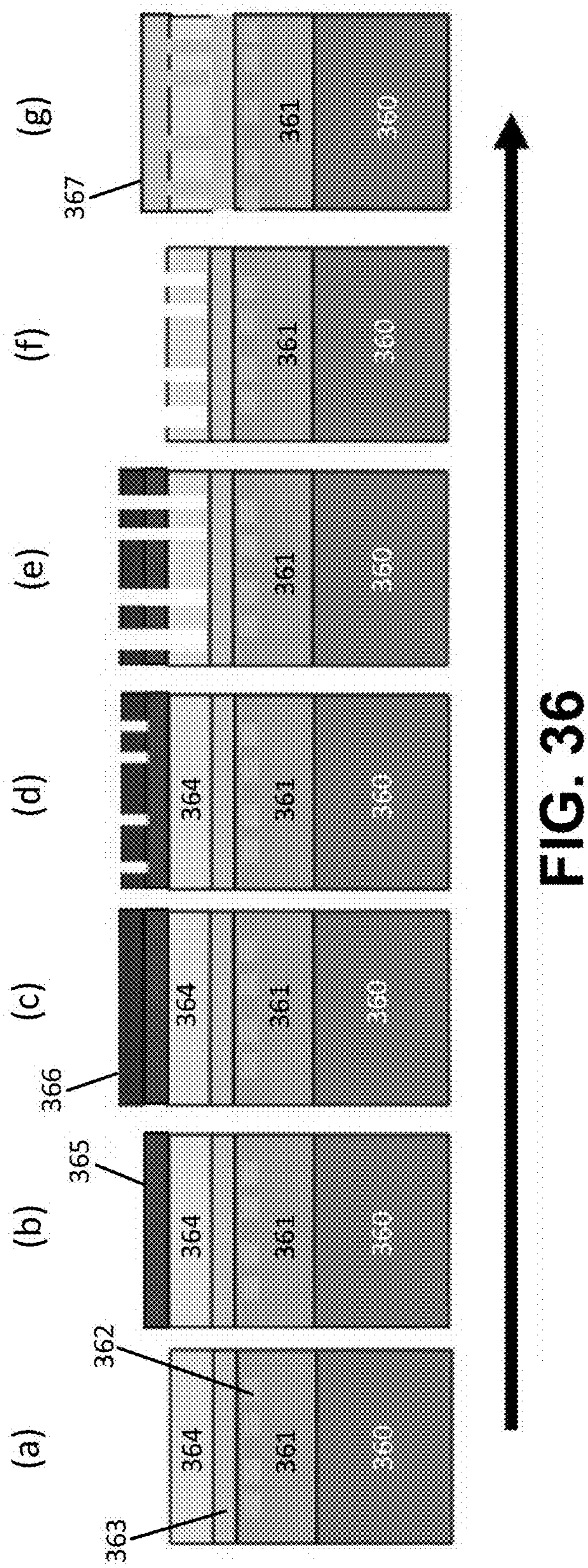
FIG. 36 is a process flow diagram illustrating a second example fabrication method for producing nanowires, in accordance with some embodiments.

FIG. 36 is a process flow diagram illustrating a second example fabrication method for producing nanowires, in accordance with some embodiments. The second example fabrication method is one of several that includes a hard mask, which can define the geometry of the nanowires and etch the area around it. The process flow diagram includes a carrier wafer 360, an electronics layer 361, a photodetector layer 362, a first insulating layer 363, a semiconductor layer 364, an etch mask layer 365, a photoresist layer 366, and a second insulating layer 367. The second example fabrication method can include providing the carrier wafer 360 including the electronics layer 361 and photodetector layer 362 (which can collectively define an image sensor layer) and the first insulating layer 363. For example, the carrier wafer 360 and the image sensor layer can be included within a BSI wafer. The second example fabrication method can include depositing (e.g., PECVD) the semiconductor layer 364 over the insulating layer 363 to produce a first intermediate structure (shown in "a"). The second example fabrication method can include photolithographically patterning the etch mask layer 365 over the semiconductor layer 363 to produce a second intermediate structure (shown in "b"). The second example fabrication method can include spin coating the photoresist layer 366 over the etch mask layer 365 to produce a third intermediate structure (shown in "c"). The second example fabrication method can include photolithographically defining (e.g., exposing, developing, etc.) a photoresist pattern over the etch mask layer 365 to produce a fourth intermediate structure (shown in "d"). The second example fabrication method can include anisotropically dry etching a portion of the semiconductor layer 364 in the presence of the etch mask layer 365 to produce a nanowire lattice. The second example fabrication method can include removing the left-over photoresist and/or left-over etch mask from the etch mask layer 365. The second example fabrication method can optionally include depositing the second insulating layer 367 (e.g., a thin, protective and/or optionally conforming silicon dioxide layer) over the nanowire lattice, which can improve a structural integrity the nanowire lattice. In some implementations, the second insulating layer 367 can have a refractive index less than the refractive index of the nanowire lattice, to facilitate optical coupling as discussed above. In some implementations, the semiconductor layer 364 can be doped with an n-type dopant (e.g., phosphorous, arsenic, antimony, etc.) or a p-type dopant (e.g., boron, aluminum, gallium, indium, etc.).

Figure 37:
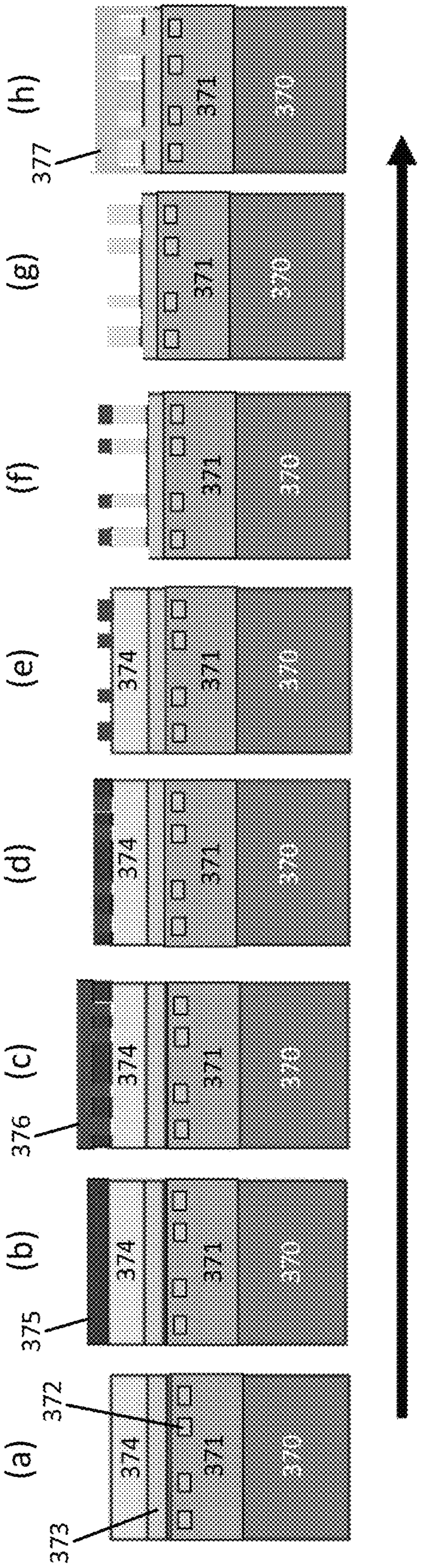
FIG. 37 is a process flow diagram illustrating a third example fabrication method for producing nanowires, in accordance with some embodiments.

FIG. 37 is a process flow diagram illustrating a third example fabrication method for producing nanowires, in accordance with some embodiments. The third example fabrication method is one of several that includes a hard mask (including the second example fabrication method described in FIG. 36). The process flow diagram includes a carrier wafer 370, an electronics layer 371, a photodetector layer 372, a first insulating layer 373, a semiconductor layer 374, a photoresist layer 375, an etch mask layer 376, and a second insulating layer 367. The third example fabrication method can include providing the carrier wafer 370 including the electronics layer 371 and photodetector layer 372 (which can collectively define an image sensor layer) and the first insulating layer 33. For example, the carrier wafer 370 and the image sensor layer can be included within a BSI wafer. The third example fabrication method can include depositing (e.g., PECVD) the semiconductor layer 374 over the insulating layer 373 to produce a first intermediate structure (shown in "a"). The third example fabrication method can include spin coating the photoresist layer 375 over the semiconductor layer 374 to produce a second intermediate structure (shown in "b"). The third example fabrication method can include photolithographically defining (e.g., exposing, developing, etc.) a photoresist pattern over the etch mask layer 376 to produce a third intermediate structure (not shown). The third example fabrication method can include photolithographically patterning the etch mask layer 376 over the third intermediate structure to produce a fourth intermediate structure (shown in "c"). The fourth intermediate structure illustrates the etch mask layer 376 as having two portions: a first portion that is disposed among portions of the photoresist pattern of the third intermediate structure, and a second portion that is over the first portion. The second portion of the etch mask layer 377 can be excess material. The third example fabrication method can include removing the second portion of the etch mask layer 376 to produce a fifth intermediate structure (shown in "d"), which includes the first portion of the etch mask layer 376 and the photoresist pattern. The (remaining) first portion of the etch mask layer 376 can define a geometry for a nanowire lattice. The third example fabrication method can include removing the photoresist pattern to produce a sixth intermediate structure (shown in "e"), which includes the first portion of the etch mask layer 376 over certain portions of the semiconductor layer 374. The third example fabrication method can include anisotropically dry etching the semiconductor layer 374 to produce a seventh intermediate structure (shown in "f"), which includes a nanowire lattice disposed between the first insulating layer 373 and the first portion of the etch mask layer 376 (if any remains). The third example fabrication method can optionally include removing the left-over first portion of the etch mask layer 376. The third example fabrication method can optionally include depositing the second insulating layer 377 (e.g., a thin, protective and/or optionally conforming silicon dioxide layer) over the nanowire lattice, which can improve a structural integrity the nanowire lattice. In some implementations, the second insulating layer 377 can have a refractive index less than the refractive index of the nanowire lattice, to facilitate optical coupling as discussed above. In some implementations, the semiconductor layer 374 can be doped with an n-type dopant (e.g., phosphorous, arsenic, antimony, etc.) or a p-type dopant (e.g., boron, aluminum, gallium, indium, etc.).

Figure 38:
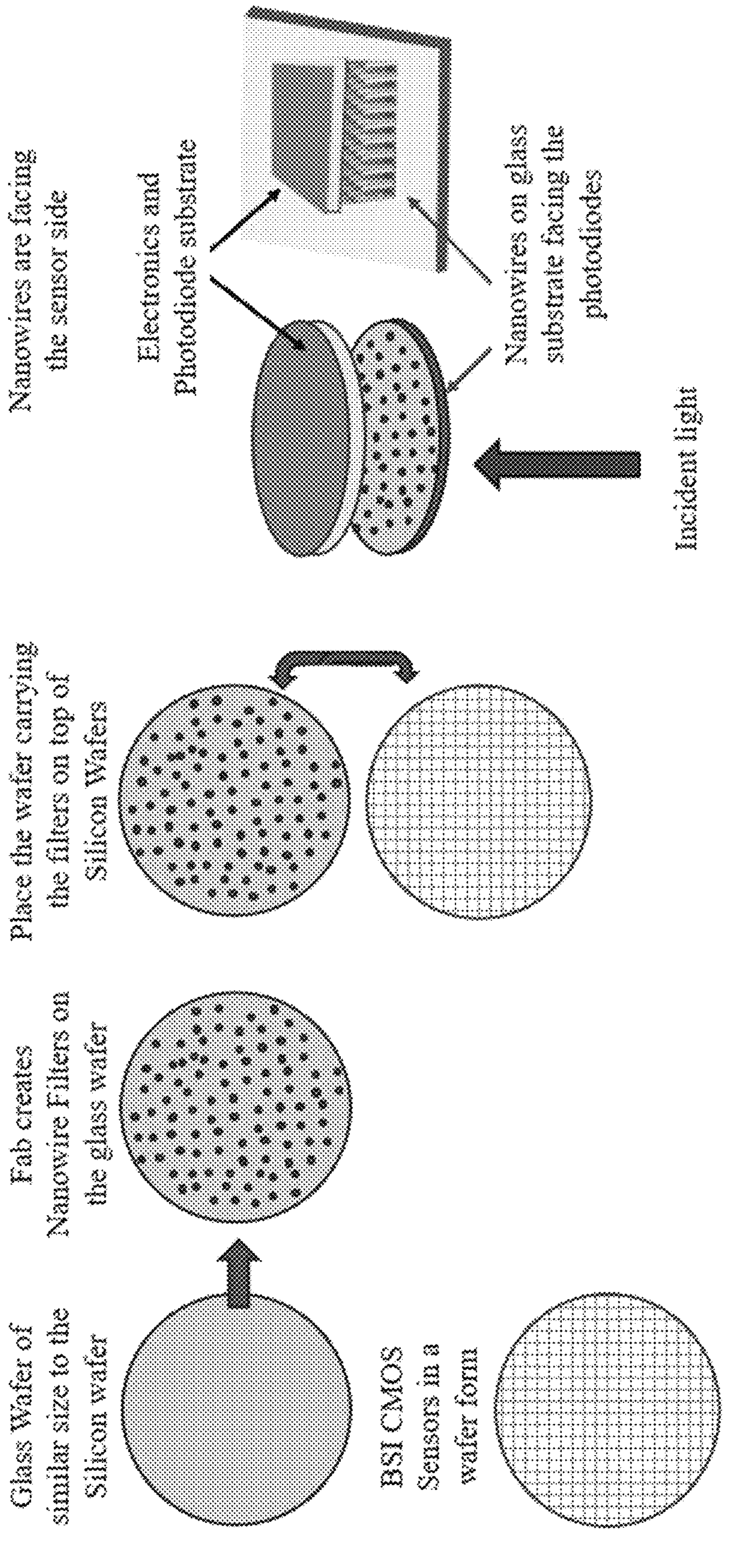
FIGS. 38-40 are diagrams showing example overall manufacturing steps for producing multispectral sensors described herein, in accordance with some embodiments.
Figure 39:
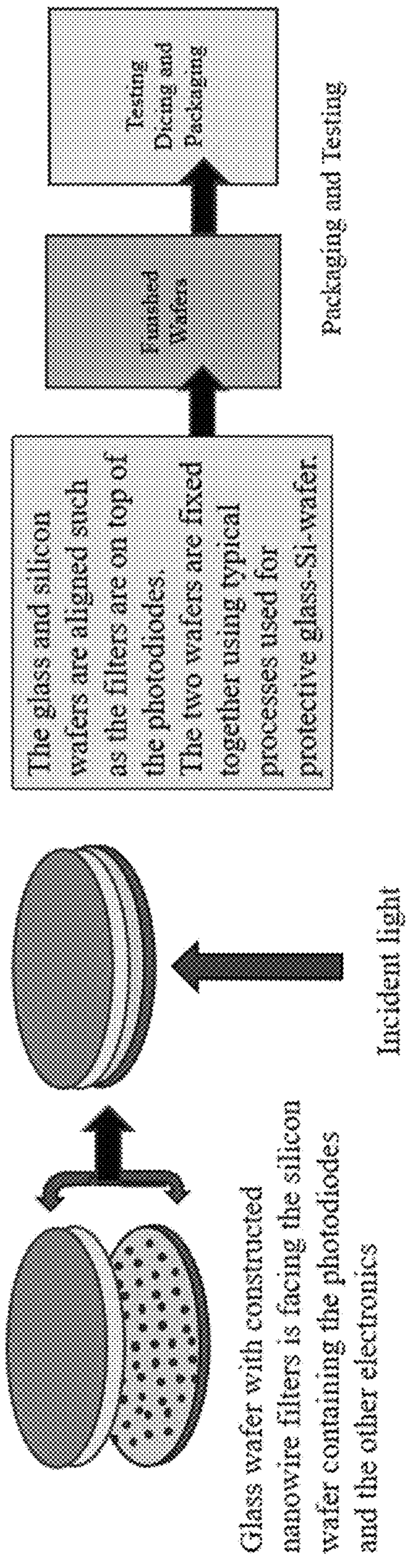
Figure 40:
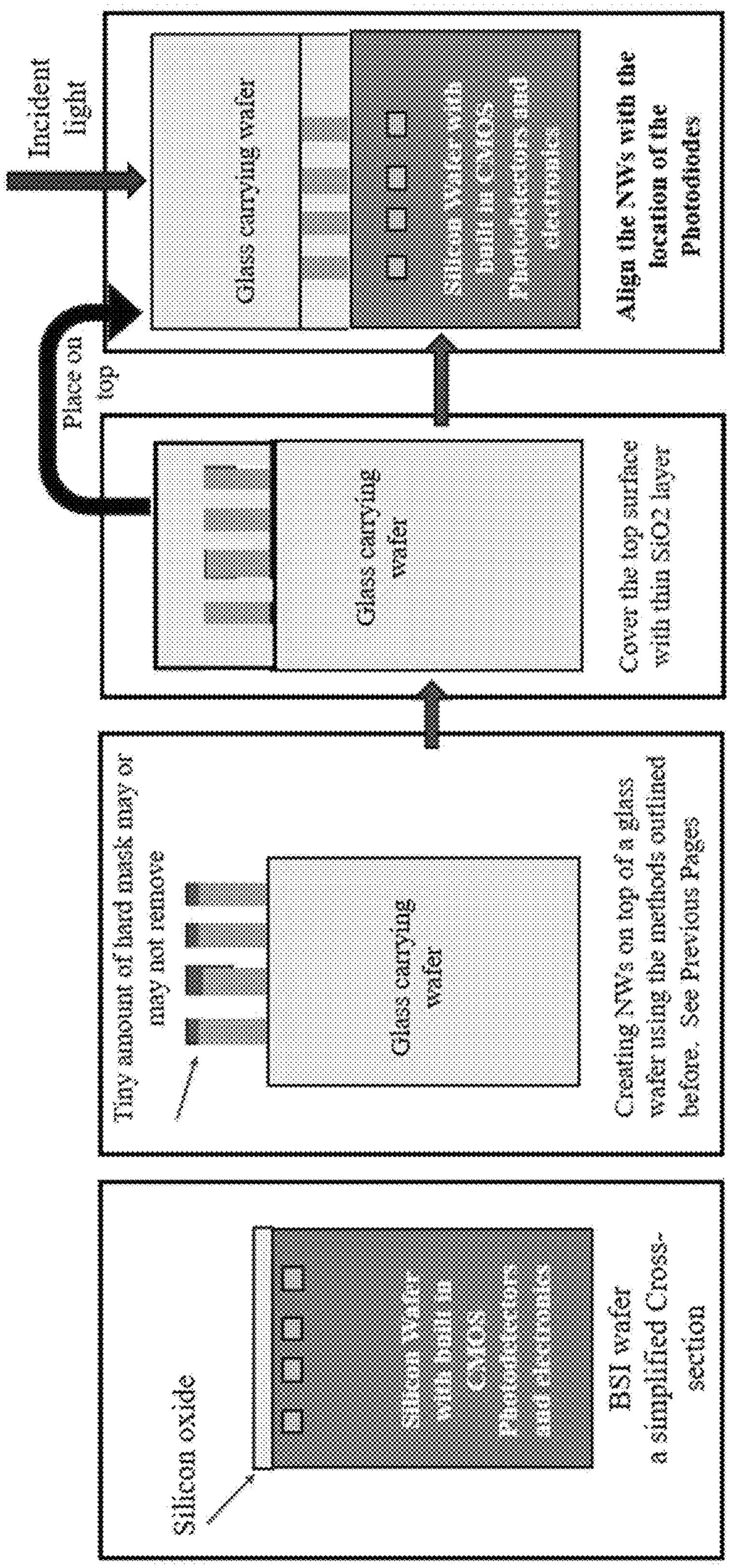

FIGS. 38-40 are diagrams showing example overall manufacturing steps for producing multispectral sensors described herein, in accordance with some embodiments. FIGS. 38-40 demonstrate the second example manufacturing method discussed above, wherein nanowire optical filters can be fabricated on a separate optically transparent substrate. The material of the optically transparent substrate can be chosen based on a wavelength region of interest (e.g., glass for UV-visible-NIR wavelengths, Si for Mid IR wavelengths, etc.). The optically transparent substrate can be aligned with and joined to the semiconductor wafer with image sensors. The optical filters can be fabricated on the separate optically transparent substrate using, for example, any of the example fabrication methods described in FIGS. 34-37. Each optical filter can cover one or more photodiode of the semiconductor wafer. The diameter of the wafer carrying the nanowire filters can be equal to or slightly larger than the imaging wafer that includes the photodetectors and other electronics. The second example manufacturing method can include fabricating the nanowire lattice on the optically transparent substrate (e.g., the glass wafer). The optically transparent substrate can have a similar size to the semiconductor wafer with the image sensor (e.g., a BSI wafer with CMOS sensors). The second example manufacturing method can include placing the optically transparent substrate with the nanowire lattice on top of the semiconductor wafer with the image sensor such that the nanowires are aligned with the location of the photodiodes. The nanowire lattice can be facing the sensor side, and in close distance/proximity to the photodiodes.

In sum, the present disclosure includes innovative processes for creating solid-state multispectral sensor. The processes can begin with a CMOS silicon wafer, on which all the imaging layers can be fabricated. All sensors can be backside illuminated image sensors (BSI). The nanowire arrays (behaving as optical filters) are then integrated and positioned above the photodiodes that are embedded within the CMOS silicon wafer. The optical filters can be precisely aligned with the CMOS pixels, with each filter covering at least one photodiode.

The PECVD deposition process can be used to create the optical filters. This deposition is a low temperature process and can be useful when deposition is on top of the layers forming the CMOS imaging electronic circuits. The deposited layer forms an amorphous silicon (a-Si) of thickness equal to the thickness of the multispectral filters. To create the optical filters, nanowires of different diameters and spacing are created using dry etching process. Etching a-Si is different from etching crystalline silicon. a-Si has more defects, and aggressive etching can damage the surface of the nanowires. The process was developed and implemented such that smooth surface and uniform nanowires can be created.

The following is a discussion on the parameters for etching. Precisely controlling the physical attributes of amorphous silicon nanowires (a-Si NWs), such as their length, diameter, and inter-wire spacing, along with their surface morphology, can contribute to their effectiveness as optical filters. Achieving specific dimensions, particularly high aspect ratios (length-to-diameter ratio) of between 15 and about 40, combined with ultra-smooth surface finishes, presents significant challenges in nanofabrication.

An inductively coupled plasma (ICP)—reactive ion etching (RIE) system can be used to generate a high density of reactive species from a gas mixture of sulfur hexafluoride ($SF_6$) and octaflurocyclobutane ($C_4+F_8$). While these gases can be commonly used in dry etching crystalline silicon, specifically in DRIE, the details of the a-Si etching process of the present disclosure can be markedly different. In some implementations, $SF_6$ is the reactive and etching gas, whereas $C_4+F_8$ creates a protective layer that stops or reduces the effect of $SF_6$. So, after etching with $SF_6$, $C_4+F_8$ protects the etched surface from further etching. The accelerating voltage of $SF_6$ creates anisotropic etching, driving these molecules vertically thus creating the long NWs.

DRIE and its various modifications can produce rough surfaces that can be incompatible with color filtering, a uniform diameter along the nanowires. The ICP-RIE process also differs from conventional reactive ion etching (RIE), which may not be suitable for long a-Si NWs.

DRIE and RIE processes tend to be aggressive and can yield unpredictable results when applied to a-Si, possibly due to the inherent disorder in its crystal structure. The ICP-RIE process employs a continuous ($C_4F_8$-$SF_6$) ICP to gently etch the amorphous silicon, creating tall, uniform nanowires with smooth surfaces. This plasma-based etching process combines chemical reactions with physical sputtering to achieve material removal. Most etching can be done by the $SF_6$ ions. To prevent lateral etching, a coating of $C_4F_8$ can be used to protect the etched areas and acts as a stop etch. Too much $C_4F_8$ will reduce the effect of the $SF_6$. Ratio of the two gases depends on the pressure in the chamber, the gas flow, the accelerating voltage and the area of the etched surface, which can be determined by the pitch.

In ICP-RIE system, the substrate can be placed on an electrode within the vacuum chamber, and an electric field accelerates ions from the plasma toward the substrate surface. To create deep etching (e.g., long NWs), high voltages can be used to accelerate ions. This ion bombardment enhances both the etching rate and its directionality, resulting in anisotropic etching where material is primarily removed vertically. The surface morphology of the etched a-Si NWs is strongly influenced by the balance between chemical etching by reactive radicals in the plasma and physical sputtering by energetic ions bombarding the substrate surface. The selection of reactive gases introduced into the plasma chamber can define at least in part the effectiveness of the etching. For appropriate a-Si etching, there can be a specific ratio of an amount of a first gas of the ICP to an amount of a second gas of the ICP.

Some examples for etching 50 nm wires of 2 microns length, organized in a square or hexagonal lattice include a spacing between about 175 to about 300 nm, an accelerating power between about 150 to about 30 W, a pressure between about 30 to about 10 mTorr. Gas flow can be low with high power and high with low power. Typical values for gas flow can be 100 to 150 SCCM. The ratio for an example mixture of $SF_6$:$C_4F_8$ can be, for example, in the range 1:6 to 1:2 for high pressure and the opposite for low pressure, e.g., 3:2.

The specific plasma chemistry used can affect the surface morphology. Additionally, higher ion bombardment energies can lead to increased surface roughness due to the physical impact and potential damage to the silicon lattice. Several strategies can minimize surface roughness and ensure a uniform cross-section along the length of the a-Si NWs. Careful selection of reactive gases and precise control over their flow rates can be used to optimize the chemical etching component.

Furthermore, the Inductively Coupled Plasma (ICP) power and the Radio Frequency (RF) power applied to the substrate can control the plasma density and the energy of the ions, respectively. Controlling the ICP and RF power and chamber pressure can provide for managing the energy and directionality of ion bombardment. For example, lower RF power settings can reduce ion energies, thereby minimizing physical damage to the surface and potentially leading to smoother nanowires.

Similarly, optimizing the substrate temperature can influence surface reactions and the removal of any reaction byproducts, which can also contribute to surface roughness.

Achieving smooth surfaces can be a delicate balance of these process parameters to minimize ion-induced damage and optimize the chemical etching process for controlled and uniform material removal. Unlike DRIE, which often incorporates dedicated passivation steps, the ICP-RIE relies on the inherent properties of the plasma and its interaction with the substrate to control anisotropy and surface quality.

In some embodiments, an apparatus includes a multi-spectral sensor and an image sensor. The multi-spectral sensor includes a spectrometer having at least a first optical filter and a second optical filter. The first optical filter includes a first lattice of nanowires having a first geometric property and configured to transmit light within a first spectral band. The second optical filter includes a second lattice of nanowires having a second geometric property and configured to transmit light within a second spectral band. The first spectral band and the second spectral band can at least partially define a spectral resolution of the spectrometer. The image sensor includes a first pixel configured to generate a first signal in response to receiving the light within the first spectral band, and a second pixel configured to generate a second signal in response to receiving the light within the second spectral band. In some implementations the first spectral band at least partially overlaps with the second spectral band. In other implementations, there is no overlap between the first spectral band and the second spectral band.

In some implementations, the first geometric property includes at least one of a lattice pitch, a lattice pattern, a nanowire shape, a nanowire diameter, or a nanowire length. Alternatively or in addition, in some implementations, the first geometric property includes one or more of: a lattice pitch between about 100 nm and about 300 nm, a cylindrical nanowire shape, a nanowire diameter between about 50 nm and about 130 nm, or a nanowire length to diameter ratio between about 15 and about 40.

In some implementations, the first spectral band is a subset of a third spectral band, the third spectral band having a bandwidth defined by a semiconductor material of the first lattice of nanowires. In some such implementations, the third spectral band can be or include at least one of a visible spectral band or a near infrared spectral band, and the semiconductor material of the first lattice of nanowires can include at least one of silicon (Si), amorphous silicon (a-Si), germanium (Ge), amorphous Germanium (a-Ge), or an alloy including at least one of Si or a-Si and at least one of Ge or a-Ge. In other such implementations, the third spectral band is at least one of a near infrared spectral band or a mid-wave infrared spectral band, and the semiconductor material of the first lattice of nanowires includes at least one of indium antimonide (InSb), indium arsenide (InAs), an alloy including InSb, or an alloy including InAs.

In some implementations, each nanowire from the first lattice of nanowires includes a first semiconductor material and each nanowire from the second lattice of nanowires includes a second semiconductor material different from the first semiconductor material.

In some implementations, the apparatus also includes a camera including the multi-spectral sensor and the image sensor, the camera configured to generate, based on the first signal and the second signal, a representation of a spectral signature of an object.

In some implementations, a nanowire length of the first lattice of nanowires is substantially the same as a nanowire length of the second lattice of nanowires, the nanowire length of the first lattice of nanowires and the nanowire length of the second lattice of nanowires being relative to a surface that includes the first lattice of nanowires and the second lattice of nanowires. A nanowire diameter of the first lattice of nanowires can be different from a nanowire diameter of the second lattice of nanowires.

In some implementations, the image sensor is configured to generate, based on the first signal and the second signal, an image that is representative of a spectral signature of a material.

In some implementations, the apparatus also includes a compute device, and a camera at least partially disposed within and electrically coupled to the compute device. The camera can include the multi-spectral sensor and the image sensor.

Figure 41:
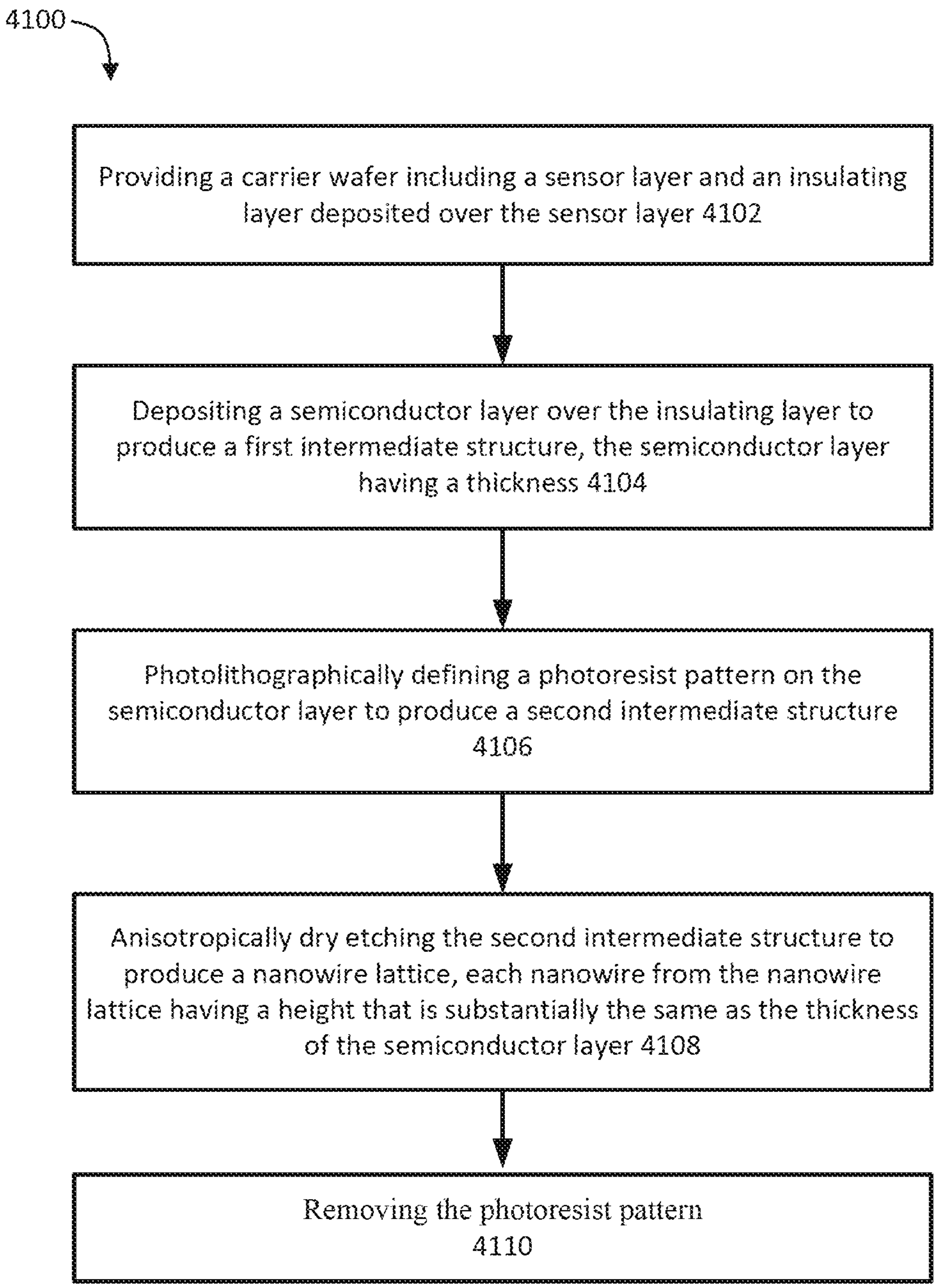
FIG. 41 is a flow diagram illustrating a first example method for producing multispectral sensors described herein, in accordance with some embodiments.

FIG. 41 is a flow diagram illustrating a first example method for producing/manufacturing multispectral sensors described herein, in accordance with some embodiments. As shown in FIG. 41, the method 4100 includes providing, at 4102, a carrier wafer including a sensor layer and an insulating layer deposited over the sensor layer. The method 4100 also includes, at 4104, depositing a semiconductor layer over the insulating layer to produce a first intermediate structure, the semiconductor layer having a thickness. The method 4100 also includes, at 4106, photolithographically defining a photoresist pattern on the semiconductor layer to produce a second intermediate structure, and at 4108, anisotropically dry etching the second intermediate structure to produce a nanowire lattice. Each nanowire from the nanowire lattice can have a nanowire length that is substantially the same as the thickness of the semiconductor layer. The method 4100 also includes, at 4110, removing the photoresist pattern.

In some implementations, the insulating layer is a first insulating layer, and the method also includes depositing a second insulating layer over the nanowire lattice to improve a structural integrity of each nanowire of the nanowire lattice. The second insulating layer can have a first refractive index that is less than a second refractive index of the nanowire lattice.

In some implementations, the insulating layer is a first insulating layer, and the method also includes depositing a second insulating layer over the nanowire lattice to improve a structural integrity of each nanowire of the nanowire lattice, the second insulating layer including silicon dioxide.

In some implementations, the semiconductor layer includes at least one of silicon (Si), amorphous silicon (aSi), germanium (Ge), or amorphous germanium (aGe), an alloy including Si and Ge, an alloy including Si and aGe, an alloy including aSi and Ge, or an alloy including aSi and aGe.

In some implementations, the semiconductor layer includes an alloy of one of: (1) Si and Ge, (2) Si and aGe, (3) aSi and Ge, or (4) aSi and aGe. The alloy can be doped with at least one of an n-type dopant or a p-type dopant.

In some implementations, the semiconductor layer includes at least one of indium antimony (InSb), indium arsenic (InAs), an alloy including InSb, or an alloy including InAs.

In some implementations, the semiconductor layer includes an alloy of one of InSb or InAs. The alloy can be doped with at least one of an n-type dopant or a p-type dopant.

In some implementations, the anisotropically dry etching includes inductively coupled plasma reactive ion etching (ICP-RIE) based on an inductively coupled plasma (ICP), and a ratio of an amount of a first gas of the ICP to an amount of a second gas of the ICP is configured to at least one of smooth a surface of each nanowire of the nanowire lattice or define the second thickness. The first gas can be, for example, sulfur hexafluoride, and the second gas can be, for example, octaflurocyclobutane.

In some implementations, the carrier wafer includes silicon, the sensor layer is a backside illuminated image sensor layer (BSI), and the sensor layer includes a plurality of complementary metal-oxide-semiconductor (CMOS) photodiodes.

In some implementations, the anisotropically dry etching includes deep reactive ion etching (DRIE).

Figure 42:
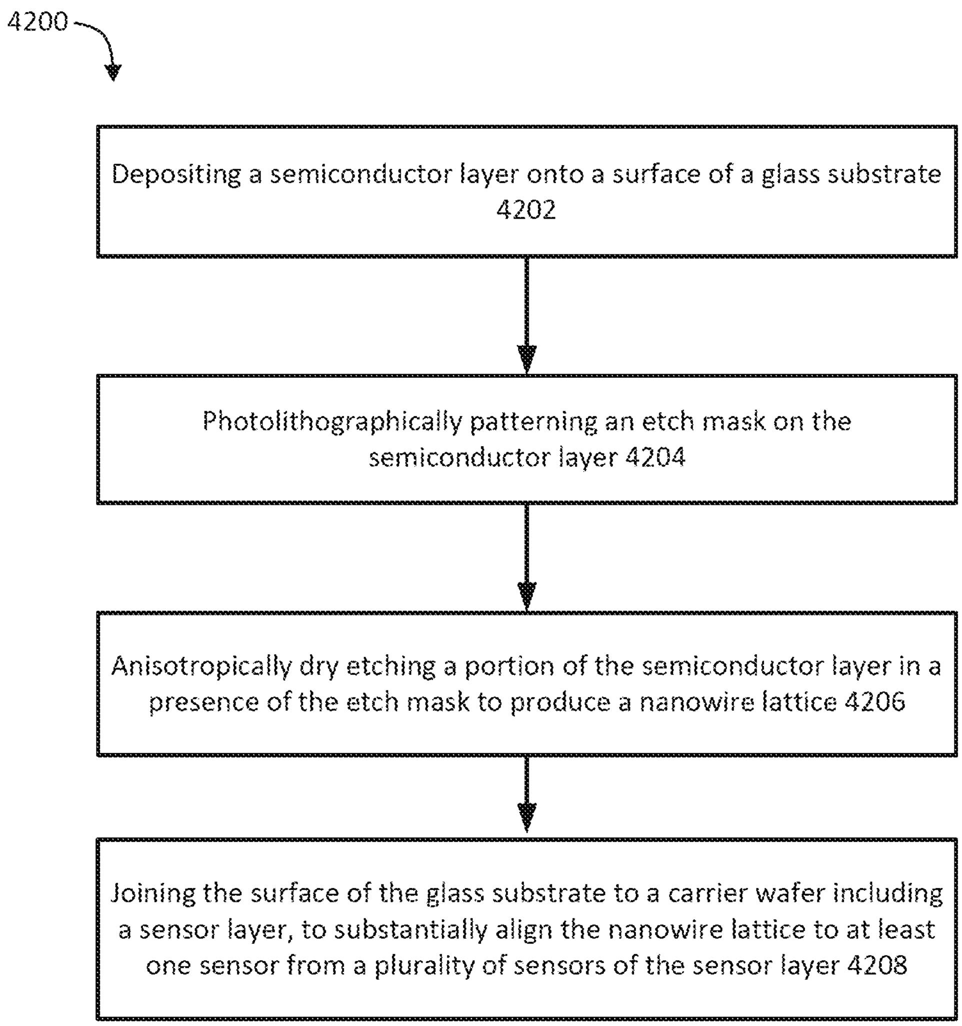
FIG. 42 is a flow diagram illustrating a second example method for producing multispectral sensors described herein, in accordance with some embodiments.

FIG. 42 is a flow diagram illustrating a second example method for producing multispectral sensors described herein, in accordance with some embodiments.

In some embodiments, a method for manufacturing a multispectral sensor includes depositing a semiconductor layer onto a surface of an optically transparent substrate, and photolithographically patterning an etch mask on the semiconductor layer. The method also includes anisotropically dry etching a portion of the semiconductor layer in a presence of the etch mask to produce a nanowire lattice. The method also includes joining the surface of the optically transparent substrate to a carrier wafer including a sensor layer, to substantially align the nanowire lattice to at least one sensor from a plurality of sensors of the sensor layer.

In some implementations, the etch mask includes at least one of aluminum oxide, chromium, nickel, or aluminum. Alternatively or in addition, the etch mask has a thickness in a range of between about 10 nm and about 60 nm. Alternatively or in addition, the etch mask is deposited using atomic layer deposition.

In some implementations, the optically transparent substrate is silicon dioxide, the nanowire lattice configured to detect light within a first spectral band including at least one of an ultraviolet spectral band, a visible spectral band, or a near infrared spectral band.

In some implementations, the optically transparent substrate is silicon, the nanowire lattice configured to detect light within a mid-wave infrared spectral band.

All combinations of the foregoing concepts and additional concepts discussed herewithin (provided such concepts are not mutually inconsistent) are contemplated as being part of the subject matter disclosed herein. The terminology explicitly employed herein that also may appear in any disclosure incorporated by reference should be accorded a meaning most consistent with the particular concepts disclosed herein.

The drawings are primarily for illustrative purposes, and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

The entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. The advantages and features of the application are of a representative sample of embodiments only, and are not exhaustive and/or exclusive. Rather, they are presented to assist in understanding and teach the embodiments, and are not representative of all embodiments. As such, certain aspects of the disclosure have not been discussed herein. That alternate embodiments may not have been presented for a specific portion of the innovations or that further undescribed alternate embodiments may be available for a portion is not to be considered to exclude such alternate embodiments from the scope of the disclosure. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure.

Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure.

The term "automatically" is used herein to modify actions that occur without direct input or prompting by an external source such as a user. Automatically occurring actions can occur periodically, sporadically, in response to a detected event (e.g., a user logging in), or according to a predetermined schedule.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, subroutines, functions, procedures, etc. "Instructions" and "code" may comprise a single computer-readable statement or many computer-readable statements.

Some embodiments described herein relate to a computer storage product with a non-transitory computer-readable medium (also can be referred to as a non-transitory processor-readable medium) having instructions or computer code thereon for performing various computer-implemented operations. The computer-readable medium (or processor-readable medium) is non-transitory in the sense that it does not include transitory propagating signals per se (e.g., a propagating electromagnetic wave carrying information on a transmission medium such as space or a cable). The media and computer code (also can be referred to as code) may be those designed and constructed for the specific purpose or purposes. Examples of non-transitory computer-readable media include, but are not limited to, magnetic storage media such as hard disks, floppy disks, and magnetic tape; optical storage media such as Compact Disc/Digital Video Discs (CD/DVDs), Compact Disc-Read Only Memories (CD-ROMs), and holographic devices; magneto-optical storage media such as optical disks; carrier wave signal processing modules; and hardware devices that are specially configured to store and execute program code, such as Application-Specific Integrated Circuits (ASICs), Programmable Logic Devices (PLDs), Read-Only Memory (ROM) and Random-Access Memory (RAM) devices. Other embodiments described herein relate to a computer program product, which can include, for example, the instructions and/or computer code discussed herein.

Some embodiments and/or methods described herein can be performed by software (executed on hardware), hardware, or a combination thereof. Hardware modules may include, for example, a general-purpose processor, a field programmable gate array (FPGA), and/or an application specific integrated circuit (ASIC). Software modules (executed on hardware) can be expressed in a variety of software languages (e.g., computer code), including C, C++, Java™, Ruby, Visual Basic™, and/or other object-oriented, procedural, or other programming language and development tools. Examples of computer code include, but are not limited to, micro-code or micro-instructions, machine instructions, such as produced by a compiler, code used to produce a web service, and files containing higher-level instructions that are executed by a computer using an interpreter. For example, embodiments may be implemented using imperative programming languages (e.g., C, Fortran, etc.), functional programming languages (Haskell, Erlang, etc.), logical programming languages (e.g., Prolog), object-oriented programming languages (e.g., Java, C++, etc.) or other suitable programming languages and/or development tools. Additional examples of computer code include, but are not limited to, control signals, encrypted code, and compressed code.

Various concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

In addition, the disclosure may include other innovations not presently described. Applicant reserves all rights in such innovations, including the right to embodiment such innovations, file additional applications, continuations, continuations-in-part, divisionals, and/or the like thereof. As such, it should be understood that advantages, embodiments, examples, functional, features, logical, operational, organizational, structural, topological, and/or other aspects of the disclosure are not to be considered limitations on the disclosure as defined by the embodiments or limitations on equivalents to the embodiments. Depending on the particular desires and/or characteristics of an individual and/or enterprise user, database configuration and/or relational model, data type, data transmission and/or network framework, syntax structure, and/or the like, various embodiments of the technology disclosed herein may be implemented in a manner that enables a great deal of flexibility and customization as described herein.

All definitions, as defined and used herein, should be understood to control over dictionary definitions, definitions in documents incorporated by reference, and/or ordinary meanings of the defined terms.

As used herein, in particular embodiments, the terms "about" or "approximately" when preceding a numerical value indicates the value plus or minus a range of 10%. Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The indefinite articles "a" and "an," as used herein in the specification and in the embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus, comprising:

a multi-spectral sensor including a spectrometer having:

a first optical filter including a first lattice of nanowires, the first lattice of nanowires configured to detect light within a first spectral band based on a first electromagnetic coupling between at least one nanowire from the first lattice of nanowires and remaining nanowires from the first lattice of nanowires, the first electromagnetic coupling producing a guided-mode resonance that defines the first spectral band, and a second optical filter including a second lattice of nanowires, the second lattice of nanowires configured to detect light within a second spectral band based on a second electromagnetic coupling between at least one nanowire from the second lattice of nanowires and remaining nanowires from the second lattice of nanowires, the first spectral band and the second spectral band at least partially defining a spectral resolution of the spectrometer; and an image sensor including a first pixel configured to generate a first signal in response to receiving the light within the first spectral band, and a second pixel configured to generate a second signal in response to receiving the light within the second spectral band.

2. The apparatus of claim 1, wherein at least one of:

a lattice pitch of the first lattice of nanowires is between about 100 nm and about 300 nm, each nanowire from the first lattice of nanowires has a cylindrical nanowire shape, each nanowire from the first lattice of nanowires has a nanowire diameter between about 50 nm and about 130 nm, or each nanowire from the first lattice of nanowires has a nanowire length to diameter ratio between about 15 and about 40.

3. The apparatus of claim 1, wherein the first spectral band is a subset of a third spectral band, the third spectral band having a bandwidth defined by a semiconductor material of the first lattice of nanowires.

4. The apparatus of claim 3, wherein the third spectral band is at least one of a visible spectral band or a near infrared spectral band, the semiconductor material of the first lattice of nanowires including at least one of silicon (Si), amorphous silicon (a-Si), germanium (Ge), amorphous Germanium (a-Ge), or an alloy including at least one of Si or a-Si and at least one of Ge or a-Ge.

5. The apparatus of claim 3, wherein the third spectral band is at least one of a near infrared spectral band or a mid-wave infrared spectral band, the semiconductor material of the first lattice of nanowires including at least one of indium antimonide (InSb), indium arsenide (InAs), an alloy including InSb, or an alloy including InAs.

6. The apparatus of claim 1, wherein each nanowire from the first lattice of nanowires includes a first semiconductor material and each nanowire from the second lattice of nanowires includes a second semiconductor material different from the first semiconductor material.

7. The apparatus of claim 1, further comprising:

a camera including the multi-spectral sensor and the image sensor, the camera configured to generate, based on the first signal and the second signal, a representation of a spectral signature of an object.

8. The apparatus of claim 1, wherein a nanowire length of the first lattice of nanowires is substantially the same as a nanowire length of the second lattice of nanowires, the nanowire length of the first lattice of nanowires and the nanowire length of the second lattice of nanowires being relative to a surface that includes the first lattice of nanowires and the second lattice of nanowires, and a nanowire diameter of the first lattice of nanowires is different from a nanowire diameter of the second lattice of nanowires.

9. The apparatus of claim 1, wherein the image sensor is configured to generate, based on the first signal and the second signal, an image that is representative of a spectral signature of a material.

10. The apparatus of claim 1, further comprising:

a compute device, and a camera at least partially disposed within and electrically coupled to the compute device, the camera including the multi-spectral sensor and the image sensor.

11. The apparatus of claim 1, wherein:

the spectrometer includes a plurality of optical filters, each optical filter from the plurality of optical filters being a nanowire lattice configured to have a spectral response different from remaining optical filters from the plurality of optical filters in response to an interaction with light, the image sensor includes a plurality of pixels, each pixel from the plurality of pixels configured to be mechanically coupled to a different optical filter from remaining optical filters from the plurality of optical filters, the first optical filter and the second optical filter is each from the plurality of optical filters, and the first pixel and the second pixel is each from the plurality of pixels.

12. The apparatus of claim 1, wherein:

the spectrometer is a first spectrometer, the multi-spectral sensor includes a second spectrometer, the second spectrometer has a plurality of optical filters, each optical filter from the plurality of optical filters being a nanowire lattice configured to have a spectral response different from remaining optical filters from the plurality of optical filters in response to an interaction with light, the image sensor has a plurality of pixels, each pixel from the plurality of pixels configured to be mechanically coupled to a different optical filter from remaining optical filters from the plurality of optical filters, and the second spectrometer is mechanically coupled to the first spectrometer.

13. The apparatus of claim 12, wherein:

the first spectrometer and the second spectrometer define a spatial resolution of the multi-spectral sensor, the image sensor is configured to generate, based on at least the first signal and the second signal, a representation of a spectral signature of an object, and the representation has the spatial resolution of the multi-spectral sensor.

14. The apparatus of claim 12, wherein:

the spectral resolution of the first spectrometer is different from a spectral resolution of the second spectrometer.

15. The apparatus of claim 12, wherein:

each of the first optical filter and the second optical filter is from a first plurality of optical filters, the plurality of optical filters of the second spectrometer is a second plurality of optical filters, the first plurality of optical filters includes a first semiconductor material configured to have a first spectral range, and the second plurality of optical filters includes a second semiconductor material configured to have a second spectral range different from the first spectral range.

16. The apparatus of claim 12, wherein:

each of the first optical filter and the second optical filter is from a first plurality of optical filters, the plurality of optical filters of the second spectrometer is a second plurality of optical filters, the first plurality of optical filters includes at least one of silicon (Si), amorphous silicon (a-Si), germanium (Ge), amorphous Germanium (a-Ge), or an alloy including (1) at least one of Si or a-Si and (2) at least one of Ge or a-Ge, and the second plurality of optical filters includes at least one of indium antimonide (InSb), indium arsenide (InAs), an alloy including InSb, or an alloy including InAs.

17. The apparatus of claim 12, wherein:

each of the first optical filter and the second optical filter is from a first plurality of optical filters, the plurality of optical filters of the second spectrometer is a second plurality of optical filters, and the first plurality of optical filters and the second plurality of optical filters each having a same amount of nanowire lattices.

18. The apparatus of claim 12, further comprising:

a compute device, and a camera at least partially disposed within and electrically coupled to the compute device, the camera including the multi-spectral sensor and the image sensor.

19. The apparatus of claim 12, further comprising:

a camera including the multi-spectral sensor and the image sensor, the camera configured to generate, based on the first signal and the second signal, a representation of a spectral signature of an object.

20. The apparatus of claim 1, wherein:

the first lattice of nanowires has a lattice pitch no more than 500 nm, a strength of the first electromagnetic coupling is defined at least in part by the lattice pitch of the first lattice of nanowires, the second lattice of nanowires has a lattice pitch no more than 500 nm, and a strength of the second electromagnetic coupling is defined at least in part by the lattice pitch of the second lattice of nanowires.

21. The apparatus of claim 1, wherein the first electromagnetic coupling produces a collective photonic resonance that defines the first spectral band.

* * * * *